US012599032B2

(12) United States Patent
Sharma et al.

(10) Patent No.: US 12,599,032 B2
(45) Date of Patent: Apr. 7, 2026

(54) BILAYER MEMORY STACKING WITH LINES SHARED BETWEEN BOTTOM AND TOP MEMORY LAYERS

(71) Applicant: INTEL CORPORATION, Santa Clara, CA (US)

(72) Inventors: Abhishek A. Sharma, Hillsboro, OR (US); Noriyuki Sato, Hillsboro, OR (US); Van H. Le, Beaverton, OR (US); Sarah Atanasov, Beaverton, OR (US); Hui Jae Yoo, Hillsboro, OR (US); Bernhard Sell, Portland, OR (US); Pei-hua Wang, Beaverton, OR (US); Travis W. Lajoie, Forest Grove, OR (US); Chieh-Jen Ku, Portland, OR (US); Juan G. Alzate-Vinasco, Tigard, OR (US); Fatih Hamzaoglu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1037 days.

(21) Appl. No.: 17/409,877

(22) Filed: Aug. 24, 2021

(65) Prior Publication Data

US 2023/0067765 A1     Mar. 2, 2023

(51) Int. Cl.
H01L 25/065 (2023.01)
H01L 23/00 (2006.01)

(52) U.S. Cl.
CPC ............. H01L 24/08 (2013.01); H01L 24/80 (2013.01); H01L 25/0657 (2013.01); *H01L 2224/08145* (2013.01); *H01L 2224/80895* (2013.01); *H01L 2224/80896* (2013.01); *H01L 2924/1436* (2013.01)

(58) Field of Classification Search
CPC ................ H01L 24/08; H01L 25/0657; H01L 2224/08145; H01L 2224/80895; H01L 2224/80896; H01L 2924/1436; H01L 24/80; H01L 25/18; H10B 12/02; H10B 12/482; H10B 12/488; H10B 12/30
See application file for complete search history.

(56) References Cited

U.S. PATENT DOCUMENTS

| | | |
|---|---|---|
| 9,672,917 B1 | 6/2017 | Costa et al. |
| 11,018,264 B1 | 5/2021 | Gomes et al. |
| 11,056,492 B1 | 7/2021 | Gomes et al. |
| 11,087,832 B1 | 8/2021 | Gomes et al. |

(Continued)

*Primary Examiner* — Thanh Y. Tran
(74) *Attorney, Agent, or Firm* — Akona IP PC

(57) ABSTRACT

IC devices implementing bilayer stacking with lines shared between bottom and top memory layers, and associated systems and methods, are disclosed. An example IC device includes a support structure, a front end of line (FEOL) layer and a back end of line (BEOL) layer. The BEOL layer includes a first memory cell in a first layer over the support structure, an electrically conductive line in a second layer, above the first layer, and a second memory cell in a third layer, above the second layer. The line could be one of a wordline, a bitline, or a plateline that is shared between the first and second memory cells. In particular, bilayer stacking line sharing is such that only one line is provided as a line to be shared between one or more of the memory cells of the first layer and one or more memory cells of the third layer.

20 Claims, 31 Drawing Sheets

(56)                    References Cited

U.S. PATENT DOCUMENTS

| | | | |
|---|---|---|---|
| 2010/0157647 A1 | 6/2010 | Rinerson et al. | |
| 2012/0068335 A1 | 3/2012 | Song | |
| 2014/0124728 A1 | 5/2014 | Kim et al. | |
| 2017/0271341 A1 | 9/2017 | Tanaka et al. | |
| 2018/0082733 A1 | 3/2018 | Tanaka et al. | |
| 2018/0226414 A1 | 8/2018 | Zhang | |
| 2019/0019553 A1* | 1/2019 | Derner | H10D 1/682 |
| 2020/0035683 A1* | 1/2020 | Sharma | H10D 30/6729 |
| 2021/0125990 A1 | 4/2021 | Gomes et al. | |
| 2021/0134802 A1 | 5/2021 | Gomes et al. | |
| 2021/0151438 A1 | 5/2021 | Gomes et al. | |
| 2021/0159229 A1 | 5/2021 | Gomes et al. | |

* cited by examiner

100

190

180

POWER AND SIGNAL INTERCONNECT LAYER
150

SECOND MEMORY LAYER
140

FIRST MEMORY LAYER
130

FEOL LAYER
120

SUPPORT STRUCTURE
110 y z

Embodiments of shared BL, layer transfer integration: vias of bottom and top arrays taper different directions

FIG. 15

BILAYER MEMORY STACKING WITH LINES SHARED BETWEEN BOTTOM AND TOP MEMORY LAYERS

BACKGROUND

Embedded memory is important to the performance of modern system-on-a-chip (SoC) technology. Low power and high density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 15 provides a schematic illustration of a cross-sectional side view of a portion of an IC device implementing bilayer memory stacking with shared BLs, manufactured using bonding, according to some embodiments of the present disclosure.

DETAILED DESCRIPTION

Overview

Figure 1:
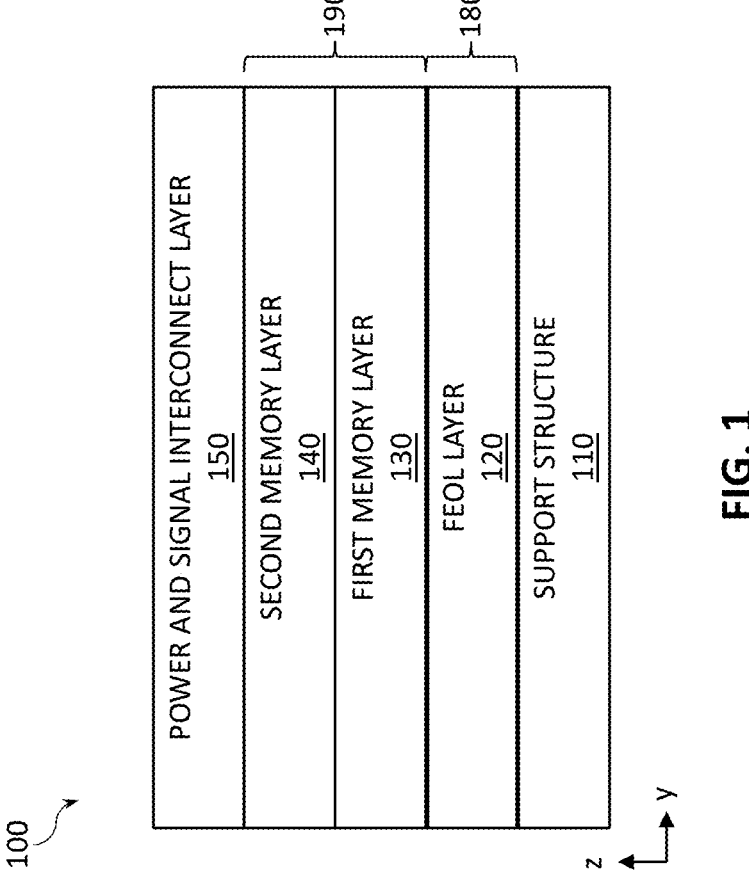
FIG. 1 provides a block diagram of an integrated circuit (IC) device with stacked backend memory that may be implemented using bilayer memory stacking with lines shared between bottom and top memory layers, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

IC devices implementing bilayer stacking with lines shared between bottom and top memory layers, and associated systems and methods, are disclosed. An example IC device includes a support structure (e.g., a substrate, a wafer, a die, or a chip), a front end of line (FEOL) layer, including frontend transistors, and a back end of line (BEOL) layer above the FEOL layer. In general, a FEOL layer may include one or more layers, each including frontend components (e.g., transistors) and/or interconnects, and a BEOL layer may include one or more layers, each including backend components (e.g., backend memory as described herein) and/or interconnects. The BEOL layer includes a first memory cell (a first embedded dynamic random-access memory (eDRAM) cell), provided in a first layer over the support structure, an electrically conductive line, provided in a second layer over the support structure, where the first layer is between the second layer and the support structure, and a second memory cell (a second eDRAM cell), provided in a third layer over the support structure, where the second layer is between the first layer and the third layer. The line includes a first face and a second face, the second face being opposite the first face and being further away from the support structure than the first face, where the first memory cell is electrically coupled to the first face of the line, and the second memory cell is electrically coupled to the second face of the line. The first and second memory cells may be memory cells of, respectively, first and second memory arrays, where the first memory array includes memory cells in the first layer and the second memory array includes memory cells in the third layer, meaning that the second memory array is stacked above the first memory array so that the first memory array is between the FEOL layer and the second memory array. The line could be one of a WL, a BL, or a PL that is shared between the first and second memory cells. Because both the first memory cell and the second memory cell are coupled to the line, the line may be described as "shared" between the bottom memory layer (i.e., the layer in which the first memory array is implemented) and the top memory layer (i.e., the layer in which the second memory array is implemented). Because a pair of memory arrays are stacked above one another with the line shared between at least some memory cells of the bottom memory array and at least some memory cells of the top memory array, memory stacking as described herein may be described as "bilayer memory stacking." Because the first and second memory layers are implemented in the BEOL layer, they may be referred to as "backend" memory.

Three-dimensional (3D) memory arrays that include stacks of planar memory arrays implemented in the BEOL layer have been proposed in the past. However, in previous approaches, each of the stacked memory arrays is self-contained in that it includes its own set of WLs, BLs, and PLs for all of the memory cells of the memory array. Therefore, even though in such implementations a line (e.g., a WL) of a bottom memory array (with some memory cells of the bottom memory array coupled thereto) may be electrically coupled to an analogous line of a top memory array (with some memory cells of the top memory array coupled thereto), there are still two such lines in the IC device—one line for the bottom memory array and one line for the top memory array. In sharp contrast to such implementations, line sharing proposed herein is such that only one line is provided as a line (e.g., a WL) to be shared between one or more memory cells of the first layer (where the bottom memory array is provided) and one or more memory cells of the third layer (where the top memory array is provided). In some embodiments, such memory cells of the bottom and top memory arrays are directly coupled to the line, e.g., if the line is a WL and serves to provide gates of these memory cells. In other embodiments, there may be one or more vias coupling the memory cells of the bottom and top memory arrays to the line, e.g., if the line is a BL, and is coupled to a source region or a drain region of the transistors of the memory cells. However, the line may be the only one of a given type (e.g., a WL or a BL) of line coupled to these memory cells that is provided between the bottom and top memory arrays.

Stacked backend memory architecture with bilayer memory stacking with lines shared between bottom and top memory layers as described herein may allow significantly increasing density of memory cells in a 3D memory array having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of the 3D memory array with a given memory cell density.

In some embodiments, additional memory arrays may be stacked over the first and second memory arrays as described herein, where bilayer memory stacking as described herein may be implemented between each pair of adjacent memory layers stacked above one another. Thus, when looking at a given pair of memory layers, the one closer to the support structure may be described as a "bottom memory layer" and the one further away from the support structure may be described as a "top memory layer," the latter may be the "bottom memory layer" as described herein when it is considered as a layer in a bilayer stacking pair with a memory layer above it (i.e., still further away from the support structure). In various embodiments, different types of bilayer memory stacking may be implemented for different pairs of bottom and top memory arrays. For example, an IC device may include one pair of a bottom and a top memory arrays that share a WL, and the top memory array of this pair may further be in a pair with another memory array, where the top memory array of the first pair is the bottom memory array of the second pair, and where the bottom and the top memory arrays of the second pair share a BL between some of their memory cells. In another example, an IC device may include a first pair of a bottom and a top memory arrays that share a first WL, and further include a second pair of a bottom and a top memory arrays that share a second WL, but the bottom and the top memory arrays of such an IC device are different memory arrays. Other variations are possible and within the scope of the present disclosure based on the descriptions provided herein.

Although descriptions of the present disclosure may refer to logic devices (e.g., implemented using frontend transistors of a FEOL layer) or memory cells provided in a given layer of an IC device, each layer of the IC devices described herein may also include other types of devices besides logic or memory devices described herein. For example, in some embodiments, FEOL layers with logic transistors may also include memory cells and/or BEOL layers with memory cells may also include logic transistors.

Furthermore, some embodiments of the present disclosure may refer to dynamic random-access memory (DRAM) and, in particular, embedded DRAM (eDRAM), because this type of memory has been introduced in the past to address the limitation in density and standby power of other types or memory. However, embodiments of the present disclosure are equally applicable to backed memory implemented using other technologies. Thus, in general, backend memory described herein may be implemented as DRAM cells, cross-point memory, NAND memory, static random-access memory (SRAM), spin-transfer torque random-access memory (STTRAM) cells, resistive switching memory (e.g., magnetoresistive random-access memory (MRAM) or resistive random-access memory (RRAM)), or any other memory types, where the types of lines shared in the bilayer memory stacking approach as described herein would be dependent on the type of memory technology implemented in a given IC device.

Still further, some descriptions may refer to backend memory being TFT-based memory. However, embodiments of the present disclosure are equally applicable to backend memory implemented using layer transfer instead of, or in addition to, TFTs.

In addition, while some descriptions provided herein refer to memory cells with bottom-gated access transistors, embodiments of the present disclosure are not limited to only this design and include access transistors for different memory cells being of various other architectures, or a mixture of different architectures. For example, in various embodiments, access transistors of various layers of stacked backend memory described herein may include bottom-gated transistors, top-gated transistors, nanowire transistors, etc., all of which being within the scope of the present disclosure. Further, some descriptions may refer to a particular source or drain (S/D) region of a transistor being either a source region or a drain region. However, unless specified otherwise, which region of a transistor is considered to be a source region and which region is considered to be a drain region is not important because, as is common in the field of field-effect transistors (FETs), designations of source and drain are often interchangeable. Therefore, descriptions of some illustrative embodiments of the source and drain regions provided herein are applicable to embodiments where the designation of source and drain regions may be reversed. Unless explained otherwise, in some settings, the terms S/D region, S/D contact, and S/D terminal of a transistor may be used interchangeably, although, in general, the term "S/D contact" is used to refer to an electrically conductive structure for making a contact to a S/D region of a transistor, while the term "S/D terminal" may generally refer to either S/D region or S/D contact of a transistor.

In the following detailed description, various aspects of the illustrative implementations will be described using terms commonly employed by those skilled in the art to convey the substance of their work to others skilled in the art. For example, a term "interconnect" may be used to describe any interconnect structure formed of an electrically conductive material for providing electrical connectivity to one or more components associated with an IC or/and between various such components. In general, the term "interconnect" may refer to both conductive lines (or, simply, "lines," also sometimes referred to as "traces" or "trenches") and conductive vias (or, simply, "vias"). In general, in context of interconnects, the term "conductive line" may be used to describe an electrically conductive element isolated by an insulator material (e.g., a low-k dielectric material) that is provided within the plane of an IC die. Such conductive lines are typically stacked into several levels, or several layers, of a metallization stack. On the other hand, the term "conductive via" may be used to describe an electrically conductive element that interconnects two or more conductive lines of different levels. To that end, a conductive via may be provided substantially perpendicularly to the plane of an IC die and may interconnect two conductive lines in adjacent levels or two conductive lines in not adjacent levels. A term "metallization stack" may be used to refer to a stack of one or more interconnects for providing connectivity to different circuit components of an IC chip. Sometimes, conductive lines and vias may be referred to as "metal lines" and "metal vias", respectively, to highlight the fact that these elements include electrically conductive materials such as metals.

In another example, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials. If used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function. The terms "substantially," "close," "approximately," "near," and "about," generally refer to being within +/−20% of a target value (e.g., within +/−10% or within +/−5% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 18A-18B, such a collection may be referred to herein without the letters, e.g., as "FIG. 18." In order to not clutter the drawings, sometimes only one instance of a given element is labeled in a drawing with a reference numeral, although other similar elements may be shown.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number and type of memory layers, a certain number and type of memory cells, or a certain arrangement of interconnects), this is simply for ease of illustration, and more, or less, than that number may be included in the IC devices and related assemblies and packages according to various embodiments of the present disclosure. Still further, various views shown in some of the drawings are intended to show relative arrangements of various elements therein. In other embodiments, various IC devices and related assemblies and packages, or portions thereof, may include other elements or components that are not illustrated (e.g., transistor portions, various further components that may be in electrical contact with any of the illustrated components of the IC devices and related assemblies and packages, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more IC devices implementing bilayer stacking with lines shared between bottom and top memory layers as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices implementing bilayer stacking with lines shared between bottom and top memory layers as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example IC Devices with Stacked Backend Memory

For purposes of illustrating IC devices implementing bilayer stacking with lines shared between bottom and top memory layers as described herein, it might be useful to first understand phenomena that may come into play in context of ICs with memory arrays. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include computing logic (e.g., transistors for performing processing operations). Other memory devices may be included in a chip along with computing logic and may be referred to as "embedded" memory devices. Using embedded memory to support computing logic may improve performance by bringing the memory and the computing logic closer together and eliminating interfaces that increase latency. DRAM and in particular, embedded DRAM (eDRAM), has been introduced in the past to address the limitation in density and standby power of other types or memory and, therefore, is used as an example to describe bilayer stacking with lines shared between bottom and top memory layers, proposed herein.

As an example, a DRAM cell may include a storage element in a form of a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one S/D region of the access transistor (e.g., to the source region of the access transistor), while the other S/D region of the access transistor (e.g., to the drain region) may be coupled to a BL, and a gate terminal of the transistor may be coupled to a WL. Since such a memory cell can be fabricated with as little as a single access transistor, it can provide higher density and lower standby power versus some other types of memory in the same process technology.

Traditionally, memory arrays have been embedded in the same layer with compute logic, in particular, in an upper-most layer of a semiconductor substrate (i.e., in an FEOL layer of an IC device) with transistors for both compute logic and memory arrays implemented as logic-process based transistors (such transistors may be referred to as "frontend transistors" or "FEOL transistors"). Examples of frontend transistors include planar transistors, FinFETs, nanoribbon transistors, nanowire transistors, etc. However, embedding memory arrays in the FEOL layer with compute logic creates several challenges.

One challenge is that, given a usable surface area of a substrate, there are only so many frontend transistors that can be formed in that area, placing a significant limitation on the density of memory cells that may be embedded (e.g., if the memory cells are DRAM cells that also need transistors, to be implemented alongside with the compute logic tran-sistors).

Another challenge is specific to DRAM arrays or other memory technologies that use access transistors in that it relates to the leakage of an access transistor, i.e., current flowing between the source and the drain of a transistor when the transistor is in an "off" state. Since reducing leakage of logic transistors in the scaled technology is difficult, implementing 1T-1C memory in advanced technol-ogy nodes (e.g., 10 nanometer (nm), 7 nm, 5 nm, and beyond) can be challenging. In particular, given a certain access transistor leakage, capacitance of the capacitor of a 1T-1C memory cell should be large enough so that sufficient charge can be stored on the capacitor to meet the corre-sponding refresh times. However, continuous desire to decrease size of electronic components dictates that the macro area of memory arrays continues to decrease, placing limitations on how large the top area (i.e., the footprint) of a given capacitor is allowed to be, which means that capacitors need to be taller in order to have both sufficiently small footprint area and sufficiently large capacitance. As the capacitor dimensions continue to scale, this in turn creates a challenge for etching the openings for forming the capaci-tors as tall capacitors with small footprint areas require higher aspect ratio openings, something which is not easy to achieve.

Yet another challenge is associated with the use of fron-tend transistors in 1T-1C memory cells in that it relates to the location of the capacitors such memory cells. Namely, it may be desirable to provide capacitors in metal layers close to their corresponding access transistors. Since frontend tran-sistors provided directly on the semiconductor substrate, the corresponding capacitors of 1T-1C memory cells then have to be embedded in lower metal layers in order to be close enough to the logic access transistors. As the pitches of lower metal layers aggressively scale in advanced technol-ogy nodes, embedding the capacitors in the lower metal layers poses significant challenges to the scaling of 1T-1C based memory.

Implementing memory in the backend of an IC device, i.e., in a BEOL layer that may include one or more inter-connect layers (also referred to as "metal layers") may address some of the challenges described above.

Backend memory may be implemented using TFTs as access transistors of the memory cells embedded in the BEOL layer. A TFT is a special kind of a field-effect transistor made by depositing a thin film of an active semiconductor material, as well as a dielectric layer and metallic contacts, over a supporting layer that may be a non-conducting layer and a non-semiconductor layer. At least a portion of the active semiconductor material forms a channel region of the TFT. This is different from conven-tional, non-TFT, FEOL logic transistors where the semicon-ductor channel region material of a transistor is typically a part of a semiconductor substrate, e.g., a part of a silicon wafer. Using TFTs as access transistors of memory cells provides several advantages and enables unique architec-tures that were not possible with conventional, FEOL logic transistors. For example, one advantage is that a TFT may have substantially lower leakage than a logic transistor, allowing to relax the demands on the large capacitance placed on a capacitor of a 1T-1C memory cell. In other words, using a lower leakage TFT in a 1T-1C memory cell allows the memory cell to use a capacitor with lower capacitance and smaller aspect ratio while still meeting the same data retention requirements of other approaches, alle-viating the scaling challenges of capacitors.

Additionally, or alternatively, to TFT-based memory, backend memory may be implemented using layer transfer to form access transistors of the memory cells embedded in the BEOL layer. Layer transfer may include epitaxially growing a layer of a highly crystalline semiconductor mate-rial on another substrate and then transferring the layer, or a portion thereof, to embed it in the BEOL layer provided over a second substrate. Channel regions of backend transistors then include at least portions of such transferred semicon-ductor material layer. Performing layer transfer may advan-tageously allow forming non-planar transistors, such as FinFETs, nanowire transistors, or nanoribbon transistors, in the BEOL layer. In some embodiments, transistors, or por-tions thereof (e.g., S/D regions) may be formed on the first substrate (i.e., on the substrate on which a layer of a highly crystalline semiconductor material is grown) before the layer transfer takes place, and then a layer with such transistors, or portions thereof, is transferred.

Layer transfer approach for providing backend memory may be particularly suitable for forming access transistors with channel regions formed of substantially single-crystal-line semiconductor materials. On the other hand, TFT-based backend memory may be seen as an example of a monolithic integration approach because the semiconductor materials for the channel regions are deposited in a BEOL layer of an IC device, as opposed to being epitaxially grown elsewhere and then transferred, which may be particularly suitable for forming access transistors with channels formed of polycrystalline, polymorphous, or amorphous semiconduc-tor materials, or various other thin-film channel materials. Whether a semiconductor material of a channel region for a given backend device (e.g., a backend transistor) has been provided by monolithic integration approach or by layer transfer can be identified by inspecting grain size of active semiconductor material of the device (e.g., of the semicon-ductor material of the channel region of a backend transis-tor). An average grain size of the semiconductor material being between about 0.5 and 1 millimeters (in which case the material may be considered to be polycrystalline) or smaller than about 0.5 millimeter (in which case the material may be considered to be polymorphous) may be indicative of the semiconductor material having been deposited in the BEOL layer of the device (i.e., monolithic integration approach), e.g., to form a TFT. On the other hand, an average grain size of the semiconductor material being equal to or greater than about 1 millimeter (in which case the material may be considered to be a single-crystal material) may be indicative of the semiconductor material having been included in the BEOL layer of the device by layer transfer. The discussions of monolithic integration vs. layer transfer approaches for forming backend memory are equally applicable to backend transistors that are not part of a memory array (e.g., if backend transistors are implemented in an IC device to serve as logic transistors, switches, or for any other purposes or in any other circuits).

Moving access transistors to the BEOL layer of an advanced complementary metal oxide semiconductor (CMOS) process, either by monolithic integration (e.g., using TFTs) or by layer transfer, means that their corresponding capacitors can be implemented in the upper metal layers with correspondingly thicker interlayer dielectric (ILD) and larger metal pitch to achieve higher capacitance. This eases the integration challenge introduced by embedding the capacitors. Furthermore, when at least some access transistors are implemented as backend transistors, at least portions of different memory cells may be provided in different layers of a BEOL layer above a substrate, thus enabling a stacked architecture of memory arrays. In this context, the term "above" refers to a layer in the BEOL layer being further away from the FEOL layer of an IC device (e.g., as is shown in the IC device 100 of FIG. 1).

FIG. 1 provides a block diagram of an IC device 100 with stacked backend memory that may be implemented using bilayer memory stacking with lines shared between bottom and top memory layers, according to some embodiments of the present disclosure. As shown in FIG. 1, in general, the IC device 100 may include a support structure 110, an FEOL layer 120, a first memory layer 130, a second memory layer 140, and a power and signal interconnect layer 150. In various embodiments, each of the layers shown in FIG. 1 may include multiple layers, and, in further embodiments, the IC device 100 may include additional memory layers stacked above the second memory layer 140. Together, the memory layers (e.g., at least the first memory layer 130 and the second memory layer 140, but possibly also additional memory layers not specifically shown in FIG. 1) form a stacked memory array of a BEOL layer 190, thus the memory implemented in the first and second layers 130, 140 is a stacked backend memory.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the substrate may be a printed circuit board (PCB) substrate. Although a few examples of materials from which the substrate may be formed are described here, any material that may serve as a foundation upon which the FEOL devices (e.g., frontend transistors) of the FEOL layer 120 and at least the memory cells of the first memory layer 130 may be built falls within the spirit and scope of the present disclosure.

In some embodiments, the support structure 110 may include a semiconductor substrate as described above. In other embodiments, the support structure 110 may be a support structure of a non-semiconductor material. For example, such a support structure may be provided after the FEOL devices of the FEOL layer 120 (and, possibly, after the stacked backend memory has been implemented in the BEOL 190) have been formed over a semiconductor substrate, after which the semiconductor substrate may be removed (e.g., by flipping the IC device and polishing or grinding the semiconductor substrate to reduce its thickness, e.g., reducing the thickness of the semiconductor substrate until electrical contacts can be made to the FEOL devices of the FEOL layer 120) and, instead a non-semiconductor support structure may be attached (e.g., using a bonding process such as oxide bonding) to provide mechanical stability. In some embodiments, when the support structure 110 is a non-semiconductor support structure, it may be, or may include, any non-semiconductor material that has a dielectric constant lower than that of silicon (Si), e.g., lower than about 11, e.g., or lower than about 10.5. In some such embodiments, the support structure 110 may include, a glass substrate, a glass die, a glass wafer or a glass chip, and/or may include any suitable glass material, since glass has dielectric constants in a range between about 5 and 10.5. Examples of glass materials include silicon oxide materials, possibly doped with elements and compounds such as boron, carbon, aluminum, hafnium oxide, e.g., in doping concentrations of between about 0.01% and 10%. In other embodiments of the support structure 110 being a non-semiconductor support structure, it may be, or include, other solid materials having a dielectric constant lower than that of Si, such as mica. Using a support structure with a dielectric constant lower than that of Si at the back of an IC device (e.g., as shown in FIG. 1) may advantageously decrease various parasitic effects associated with the FEOL/frontend devices of the IC device 100, since such parasitic effects are typically proportional to the dielectric constant of the surrounding medium.

The first and second memory layers 130, 140 may, together, be seen as forming stacked backend memory of the BEOL layer 190. As such, the memory array of the BEOL layer 190 may include TFTs or transistors formed by layer transfer (e.g., access transistors of memory cells as described herein), storage elements (e.g., capacitors), as well as WLs (e.g., row selectors), BLs (e.g., column selectors), and possibly other control lines, making up backend memory cells. In some embodiments, the memory arrays of the BEOL layer 190 may include more than two memory layers stacked in different layers above one another.

On the other hand, the FEOL layer 120 may be a compute logic layer in that it may include various logic layers, circuits, and devices (e.g., logic transistors, e.g., frontend transistors) to drive and control a logic IC. For example, the logic devices of the compute logic layer 120 may form a memory peripheral circuit 180 to control (e.g., access (read/write), store, refresh) the backend memory of the BEOL layer 190.

In some embodiments, the frontend devices (e.g., frontend transistors) may occupy the FEOL layer 120 and one or more lowest BEOL sub-layers of the BEOL Layer 190 (i.e., one or more BEOL sub-layers which are closest to the support structure 110), while the first memory layer 130 and the second memory layer 140 may be seen as provided in respective higher BEOL sub-layers. Various sub-layers of the BEOL layer 190 may be (or may include) metal layers (also interchangeably referred to as "interconnect layers") of a metallization stack, as known in the art. Various metal layers of the BEOL layer 190 may be used to interconnect the various inputs and outputs of the frontend devices in the FEOL layer 120 and/or of the memory cells in the memory layers 130, 140. Generally speaking, each of the metal layers of the BEOL layer 190 may include interconnect structures such as conductive vias and conductive lines, as well as other components, such as memory cells. While referred to as "metal" layers, various layers of the BEOL layer 190 may include only certain patterns of conductive metals, e.g., copper (Cu), aluminum (Al), tungsten (W), or cobalt (Co), or metal alloys, or more generally, patterns of one or more electrically conductive materials, formed in an insulating medium such as an ILD. The insulating medium may include any suitable ILD materials such as silicon oxide, carbon-doped silicon oxide, silicon carbide, silicon nitride, aluminum oxide, and/or silicon oxynitride.

In other embodiments of the IC device 100, compute logic devices may be provided in a layer above the memory layers 130, 140, in between memory layers 130, 140, or combined with the memory layers 130, 140.

The power and signal interconnect layer 150, also shown in FIG. 1, may include one or more interconnects configured to provide power and/or signals to/from various components of the IC device 100 (e.g., to the devices in the FEOL layer 120 and/or to the memory cells of the stacked backend memory in the BEOL layer 190). Although the power and signal interconnect layer 150 is shown in FIG. 1 as being over the BEOL layer 190 (i.e., at the front of the IC device 100, so that the BEOL layer 190 is between the FEOL layer 120 and the power and signal interconnect layer 150), in other embodiments of the IC device 100, the power and signal interconnect layer 150 may be implemented at the back side of the IC device 100, so that the FEOL layer 120 is between the power and signal interconnect layer 150 and the BEOL layer 190. In still further embodiments of the IC device 100, some portions of the power and signal interconnect layer 150 may be implemented at the back side of the IC device 100 while other portions of the power and signal interconnect layer 150 may be implemented at the front side of the IC device 100.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, power and signal interconnects for the various components of the IC device 100 may be present in any of the layers shown in FIG. 1, although not specifically illustrated in IG. 1.

Example Memory Cells and Arrays for an IC Device with Bilayer Stacking

In some embodiments, any of the memory layers implemented in the BEOL layer 190 of the IC device 100 (e.g., the first memory layer 130 or the second memory layer 140) may include a DRAM array with 1T-1C memory cells. DRAM implementations are described with reference to FIGS. 2-5.

Figure 2:
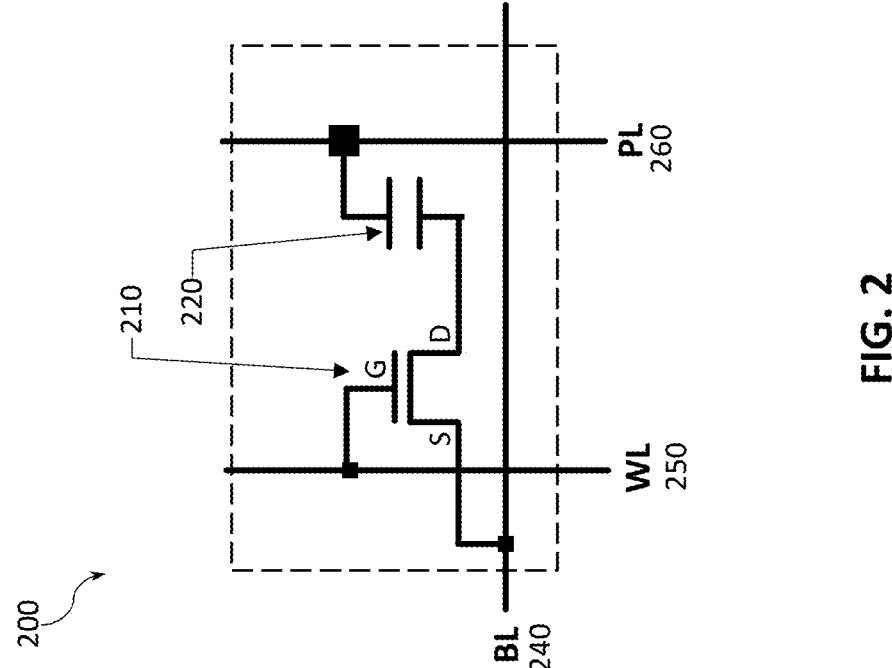
FIG. 2 provides an electric circuit diagram of a one access transistor (1T) and one capacitor (1C) (1T-1C) memory cell that may be used in a memory layer of an IC device implementing bilayer memory stacking with lines shared between bottom and top memory layers, according to some embodiments of the present disclosure.

FIG. 2 provides an electric circuit diagram of an 1T-1C memory cell 200 that may be used in a memory layer of an IC device implementing bilayer memory stacking with lines shared between bottom and top memory layers, according to some embodiments of the present disclosure. As shown, the 1T-1C cell 200 may include an access transistor 210 and a capacitor 220. The access transistor 210 has a gate terminal, a source terminal, and a drain terminal, indicated in the example of FIG. 2 as terminals G, S, and D, respectively. In the following, the terms "terminal" and "electrode/contact" may be used interchangeably. Furthermore, for S/D terminals, the terms "terminal" and "region" may be used interchangeably.

As shown in FIG. 2, in the 1T-1C cell 200, the gate terminal of the access transistor 210 may be coupled to a WL 250, one of the S/D terminals of the access transistor 210 (e.g., a source terminal, as shown in FIG. 2 and the subsequent drawings, although in other embodiments it could be a drain terminal) may be coupled to a BL 240, and the other one of the S/D terminals of the access transistor 210 (e.g., a drain terminal, as shown in FIG. 2 and the subsequent drawings, although in other embodiments it could be a source terminal) may be coupled to a first electrode of the capacitor 220. As also shown in FIG. 2, the other electrode of the capacitor 220 may be coupled to a capacitor PL (PL) 260 (also sometimes referred to as a "select-line" (SL)). As is known in the art, WL, BL, and PL may be used together to read and program the capacitor 220. Each of the BL 240, the WL 250, and the PL 260, as well as intermediate elements coupling these lines to various terminals described herein, may be formed of any suitable electrically conductive material, which may include an alloy or a stack of multiple electrically conductive materials. In various embodiments, such electrically conductive materials may include one or more metals or metal alloys, with metals such as ruthenium, palladium, platinum, cobalt, nickel, hafnium, zirconium, titanium, tantalum, and aluminum, and/or one or more oxides or carbides of such metals or metal alloys.

In some embodiments, the access transistor 210 may be a TFT. In other embodiments, the access transistor 210 may be not a TFT, e.g., a transistor formed on a crystalline semiconductor material provided in the backend of an IC device using layer transfer. For example, in some such embodiments, the access transistor 210 may be a FinFET, a nanowire, or a nanoribbon transistor.

Figures 3A, 3B:
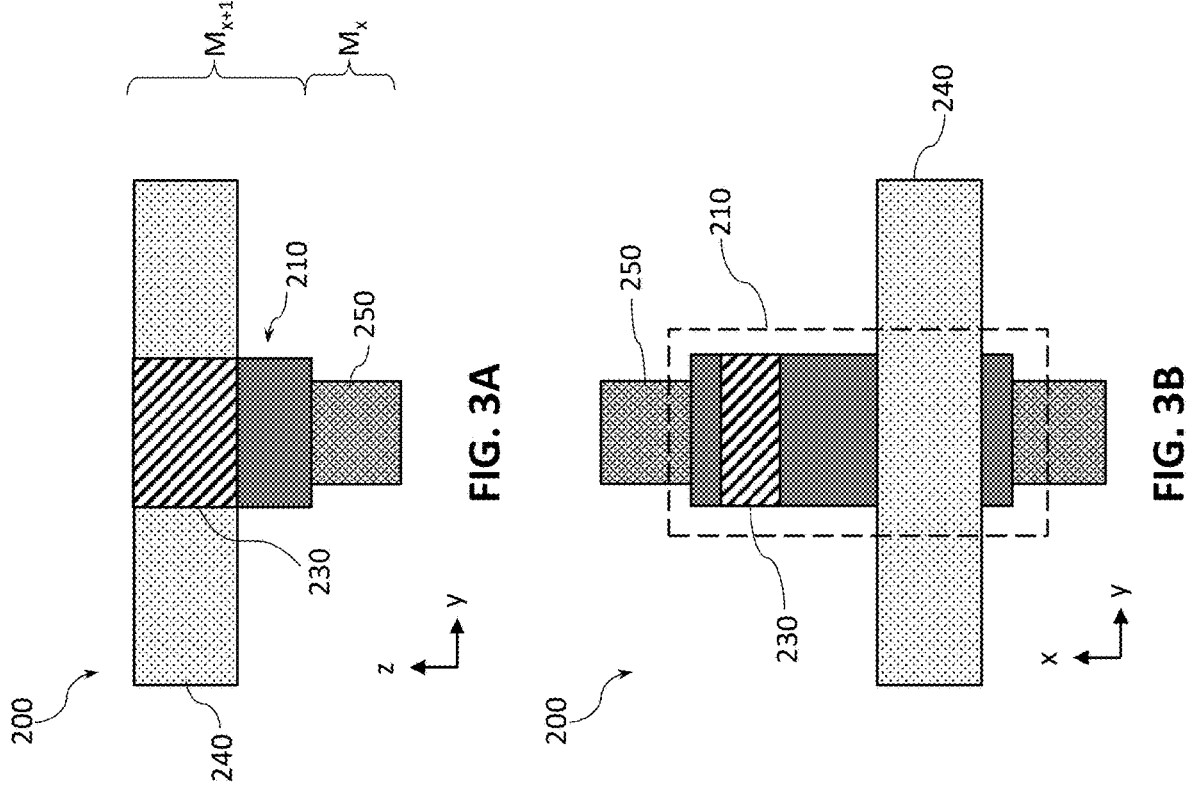
FIGS. 3A-3B are cross-sectional and plan views, respectively, of an example thin-film transistor (TFT) based memory cell with an access TFT that may be used in an IC device implementing bilayer memory stacking with lines shared between bottom and top memory layers, according to some embodiments of the present disclosure.
Figures 4A, 4B:
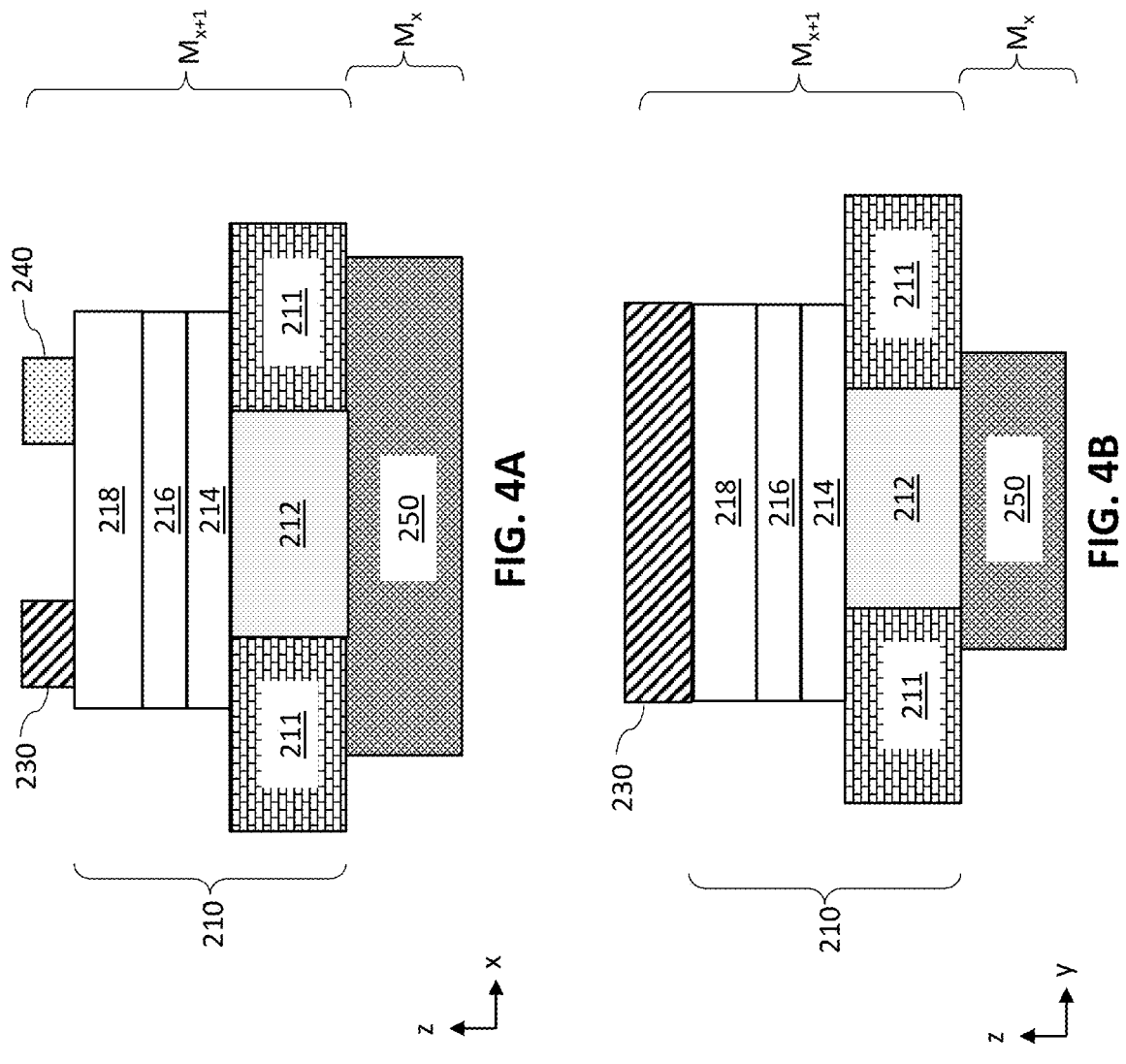
FIGS. 4A-4B are cross-sectional views of an example structure of the access TFT in the memory cell of FIGS. 3A-3B, according to some embodiments of the present disclosure.

FIGS. 3A-3B are cross-sectional (y-z plane) and plan (y-x plane) views, respectively, of an example access transistor 210 implemented as a TFT if the memory cell 200 is a TFT-based memory cell 200, according to some embodiments of the present disclosure. For example, the access TFT 210 illustrated in FIGS. 3A-3B may be the access transistor 210 of FIG. 2, and the memory cell 200 illustrated in FIGS. 3A-3B may be the memory cell 200 of FIG. 2. FIGS. 4A-4B are cross-sectional views (x-z and y-z planes) of an example structure of the access TFT 210 in the TFT-based memory cell 200 of FIGS. 3A-3B, according to some embodiments of the present disclosure. The memory cell 200 shown in FIGS. 2-4 is an example of memory cells that may be implemented to realize a given memory layer of an IC device with bilayer memory stacking with lines shared between bottom and top memory layers as described herein, e.g., of the IC device 100 as described herein. In some embodiments of the IC device 100 as described herein, multiple memory cells 200 (as well as multiple memory cells of other types) may be arranged in a stacked architecture, i.e., when different memory cells such as, or similar to, the one shown in FIGS. 2-4 are stacked in different interconnect layers of the BEOL layer 190.

As shown in FIG. 3, the TFT-based memory cell 200 may include a WL 250 (which may be an example of the WL 250 of FIG. 2) to supply a gate signal. As also shown in FIG. 3, the TFT-based memory cell 200 may further include an access TFT 210 that includes a channel layer and is configured to control transfer of a memory state of the memory cell between a first region and a second region of the channel layer in response to the gate signal (channel layer and first and second regions described in greater detail below, e.g., with reference to FIG. 4). In some embodiments, the access TFT 210 may be provided above the WL 250 coupled to the memory cell 200. As also shown in FIG. 3, the memory cell 200 may further include a BL 240 to transfer the memory state and coupled to the first region of the channel layer of the access TFT 210, and a storage node 230 coupled to the second region of the channel layer of the access TFT 210. Although not specifically shown in FIG. 3, the memory cell 200 further includes a capacitor such as the capacitor 220 of FIG. 2, e.g., a metal-insulator-metal (MIM) capacitor coupled to the storage node 230 and configured to store the memory state of the memory cell 200.

Turning to the details of FIG. 3, the access TFT 210 in the memory cell 200 may be coupled to or controlled by WL 250, which, in some embodiments, may serve as the gate of the access TFT 210. A BL 240 (which may be an example of the BL 240 of FIG. 2) may be coupled to one of the S/D regions of the access TFT 210 and a storage node 230 may be coupled to the other one of the S/D regions of the access TFT 210. In some embodiments, the BL 240 may serve as a first S/D contact (i.e., an electrically conductive structure for making a contact to a first S/D region of a transistor) and the storage node 230 may serve as the second S/D contact (i.e., an electrically conductive structure for making a contact to a second S/D region of a transistor) of the access TFT 210. The BL 240 may be connected to a sense amplifier and a BL driver which may, e.g., be provided in a memory peripheral circuit associated with a memory array that includes the memory cell 200. As shown in FIG. 3A, in some embodiments, for a given memory cell 200, the WL 250 may be formed in a metal layer Mx (where x is an integer indicating a specific layer) of the BEOL layer 190, while the access TFT 210, the storage node 230, and the BL 240 may be formed in a metal layer Mx+1 of the BEOL layer 190, i.e., the metal layer above the metal layer Mx, e.g., directly above the metal layer Mx (as illustrated in FIGS. 3 and 4). A capacitor of the memory cell 200 may then be formed in a metal layer Mx+2 of the BEOL layer 190, e.g., directly above the metal layer Mx+1.

FIGS. 4A-4B illustrate further details of the access TFT 210. As shown in FIGS. 4A-4B, in some embodiments, the access TFT 210 may be provided substantially above the WL 250. In some embodiments, the access TFT 210 may be a bottom-gated TFT in that its gate stack comprising a gate dielectric 216 and a gate electrode 214 may be provided below its channel layer/region (also referred to as "active layer") 218, e.g., between the channel layer 218 and the WL 250, and the channel layer 218 may be between the gate stack and the BL 240 forming one of the S/D terminals, e.g., the drain terminal, of the access TFT 210 and the storage node 230 forming another one of the S/D terminals, e.g., the source terminal, of the access TFT 210 (again, in other embodiments, this example designation of S/D terminals may be reversed).

The channel layer 218 (which may also be referred to as a "channel material") may be composed of semiconductor material systems including, for example, N-type or P-type materials systems. In some embodiments, the channel layer 218 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel layer 218 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layer 218 may be formed of a thin-film material. Some such materials may be deposited at relatively low temperatures, which allows depositing them within the thermal budgets imposed on back end fabrication to avoid damaging the frontend components such as the logic devices of the FEOL layer 120 of the IC device 100. In some embodiments, the channel layer 218 may have a thickness between about 5 and 75 nanometers, including all values and ranges therein.

The S/D electrodes of the access TFT 210, shown in various figures as provided by the corresponding BL 240 and the storage node 230, respectively, may include any suitable electrically conductive material, alloy, or a stack of multiple electrically conductive materials. In some embodiments, the S/D electrodes of the access TFT 210 may include one or more metals or metal alloys, with metals e.g., copper, ruthenium, palladium, platinum, cobalt, nickel, hafnium, zirconium, titanium, tantalum, and aluminum, tantalum nitride, tungsten, doped silicon, doped germanium, or alloys and mixtures of these. In some embodiments, the S/D electrodes of the access TFT 210 may include one or more electrically conductive alloys, oxides, or carbides of one or more metals. In some embodiments, the S/D electrodes of the access TFT 210 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes of the access TFT 210 may have a thickness (i.e., dimension measured along the z-axis of the example coordinate system shown in the present drawings) between about 2 nanometers and 1000 nanometers, preferably between about 2 nanometers and 100 nanometers.

A gate dielectric 216 may laterally surround the channel layer 218, and the gate electrode 214 may laterally surround the gate dielectric 216 such that the gate dielectric 216 is disposed between the gate electrode 214 and the channel layer 218. In various embodiments, the gate dielectric 216 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 216 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 216 during manufacture of the access TFT 210 to improve the quality of the gate dielectric 216. In some embodiments, the gate dielectric 216 may have a thickness between about 0.5 nanometers and 3 nanometers, including all values and ranges therein, e.g., between about 1 and 3 nanometers, or between about 1 and 2 nanometers.

In some embodiments, the gate dielectric 216 may be a multilayer gate dielectric, e.g., it may include any of the high-k dielectric materials in one layer and a layer of IGZO. In some embodiments, the gate stack (i.e., a combination of the gate dielectric 216 and the gate electrode 214) may be arranged so that the IGZO is disposed between the high-k dielectric and the channel layer 218. In such embodiments, the IGZO may be in contact with the channel layer 218, and may provide the interface between the channel layer 218 and the remainder of the multilayer gate dielectric 216. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode 214 may include at least one P-type work function metal or N-type work function metal, depending on whether the access TFT 210 is a P-type metal oxide semiconductor (PMOS) transistor or an N-type metal oxide semiconductor (NMOS) transistor. For a PMOS transistor, metals that may be used for the gate electrode 214 may include, but are not limited to, ruthenium, palladium, platinum, cobalt, nickel, and conductive metal oxides (e.g., ruthenium oxide). For an NMOS transistor, metals that may be used for the gate electrode 214 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 214 may include a stack of two or more metal layers, where one or more metal layers are work function metal layers and at least one metal layer is a fill metal layer. Further metal layers may be included for other purposes, such as to act as a diffusion barrier layer, described below.

FIGS. 4A-4B further illustrate that the bottom-gated access TFT 210 may further, optionally, include layers such as a diffusion barrier layer 212, which may be surrounded by a layer of etch-resistant material (e.g., an etch-stop layer 211). In some embodiments, the diffusion barrier 212 may be a metal- or copper-diffusion barrier (e.g., a conductive material to reduce or prevent the diffusion of metal or copper from WL 250 into the gate electrode 214 while still maintaining an electrical connection between the WL 250 and the gate electrode 214) on the WL 250 such as TaN, tantalum (Ta), titanium zirconium nitride (e.g., TiXZr1-XN, such as X=0.53), titanium nitride (e.g., TiN), titanium tungsten (TiW), combination (such as a stack structure of TaN on Ta), or the like. For instance, the diffusion barrier 212 can include a single- or multilayer structure including a compound of tantalum (Ta) and nitrogen (n), such as TaN or a layer of TaN on a layer of Ta. In some embodiments, a layer of an etch-resistant material (e.g., the etch-stop 211) such as silicon nitride or silicon carbide may be formed over the WL 250 with vias for a metal (or copper) diffusion barrier film 212 such as TaN or a TaN/Ta stack. The gate electrode 214 can be a conductive material on the diffusion barrier 212, such as metal, conductive metal oxide or nitride, or the like. For example, in one embodiment, the gate electrode 214 may be titanium nitride (TiN). In another embodiment, the gate electrode 214 may be tungsten (W).

The channel layer 218 can be in contact with the BL 240 (e.g., at a first S/D region of the channel layer 218, e.g., a drain region) and with the storage node 230 (e.g., at a second S/D region of the channel layer 218, e.g., a source region, with a semiconducting channel region of the access TFT 210 being between the first S/D region and the second S/D region). In some embodiments, such a channel region may include only majority carriers in the thin film. Accordingly, the channel layer 218 may require a relatively high bias (as e.g., supplied by the WL 250, diffusion barrier film 212, and gate electrode 214) to activate.

Figure 5:
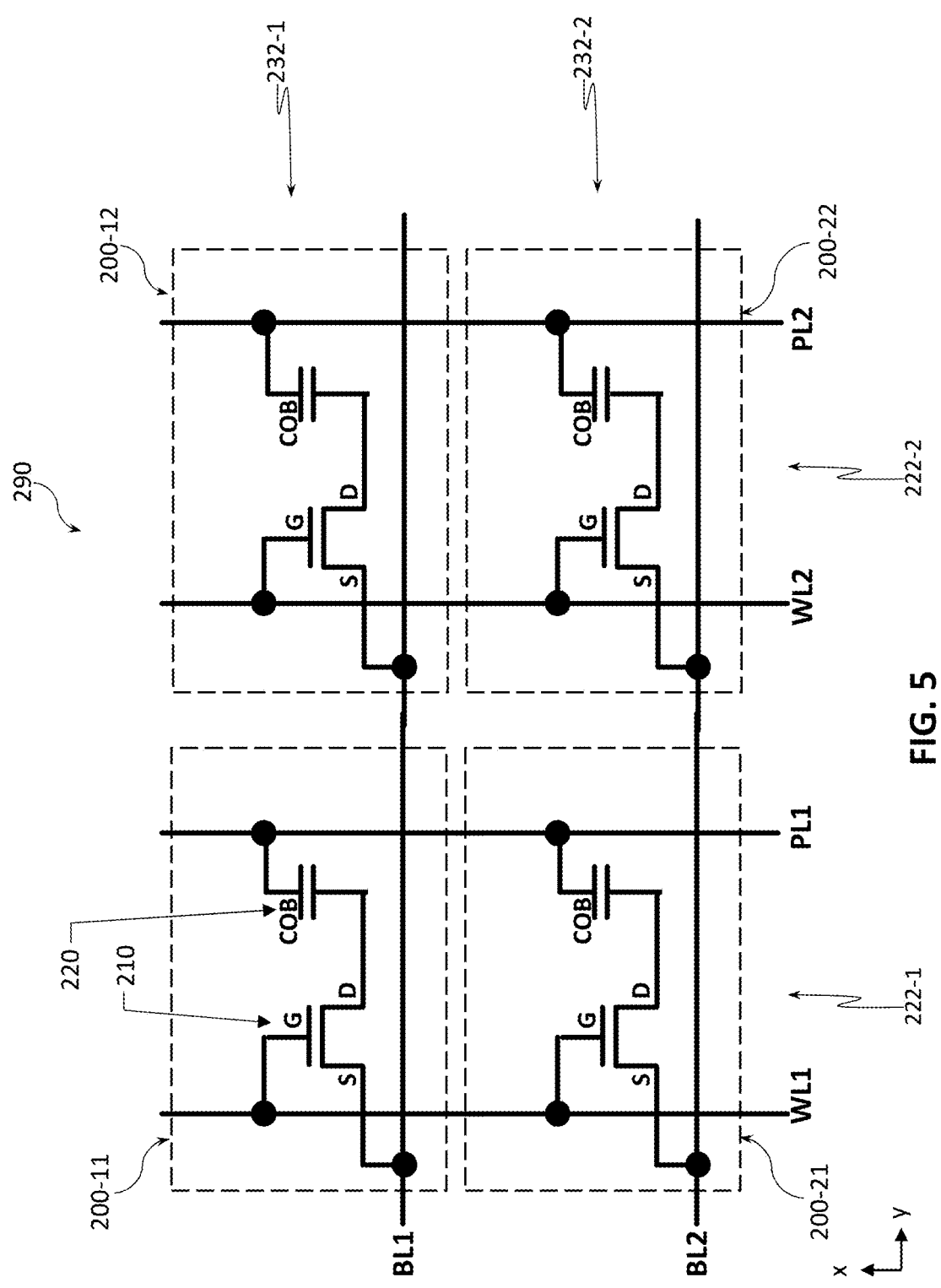
FIG. 5 provides an electric circuit diagram of an array of 1T-1C memory cells that may serve as a bottom/top memory array of an IC device implementing bilayer memory stacking with lines shared between bottom and top memory layers, according to some embodiments of the present disclosure.

FIG. 5 provides an electric circuit diagram of an array 290 of 1T-1C memory cells 200 that may serve as a bottom/top memory array of an IC device implementing bilayer memory stacking with lines shared between bottom and top memory layers, according to some embodiments of the present disclosure. Each 1T-1C memory cell 200 as described herein is illustrated in FIG. 5 to be within a dashed box labeled 200-11, 200-12, 200-21, and 200-22. While only four such memory cells are shown in FIG. 5, in other embodiments, the array 290 may, and typically would, include many more memory cells. Furthermore, in other embodiments, the 1T-1C memory cells as described herein may be arranged in arrays in other manners as known in the art, all of which being within the scope of the present disclosure. Any single one of the memory layers of the BEOL layer 190 of the IC device 100 of FIG. 1, e.g., the first memory layer 130, the second memory layers 140, and/or in any other memory layers that may be present in the BEOL layer 190 of the IC device 100, may include a memory array such as the memory array 290.

FIG. 5 illustrates that, in some embodiments, a single BL can be shared among multiple memory cells 200 in a column, and that WL and PL can be shared among multiple memory cells 200 in a row. As is conventionally used in context of memory, the terms "row" and "column" do not necessarily reflect the, respectively, horizontal and vertical orientation on a page of a drawing illustrating a memory array but, instead, reflect on how individual memory cells are addressed. Namely, memory cells 200 sharing a single BL are said to be in the same column, while memory cells sharing a single WL are said to be on the same row. Thus, in FIG. 5, the horizontal lines refer to columns while vertical lines refer to rows. Different instances of each line (BL, WL, and PL) are indicated in FIG. 5 with different reference numerals, e.g., BL1 and BL2 are the two different instances of the BL as described herein. The same reference numeral on the different lines WL and PL indicates that those lines are used to address/control the memory cells in a single row. For example, WL1 and PL1 are used to address/control the memory cells 200 in a first row, i.e., row 222-1 (e.g., the memory cells 200-11 and 200-21, shown in the example of FIG. 5), while WL2 and PL2 are used to address/control the memory cells 200 in a second row, i.e., row 222-2 (e.g., the memory cells 200-12 and 200-22, shown in the example of FIG. 5), and so on. The same reference numeral on the different lines BL indicates that those lines are used to address/control the memory cells in a single column. For example, BL1 is used to address/control the memory cells 200 in a first column, i.e., column 232-1 (e.g., the memory cells 200-11 and 200-12, shown in the example of FIG. 5), while BL is used to address/control the memory cells 200 in a second column, i.e., column 232-2 (e.g., the memory cells 200-21 and 200-22, shown in the example of FIG. 5), and so on. Each memory cell 200 may then be addressed by using the BL corresponding to the column 232 of the cell and by using the WL and PL corresponding to the row 222 of the cell. For example, the memory cell 200-11 is controlled by BL1, WL1, and PL1, the memory cell 200-12 is controlled by BL1, WL2, and PL2, and so on.

Figure 6A:
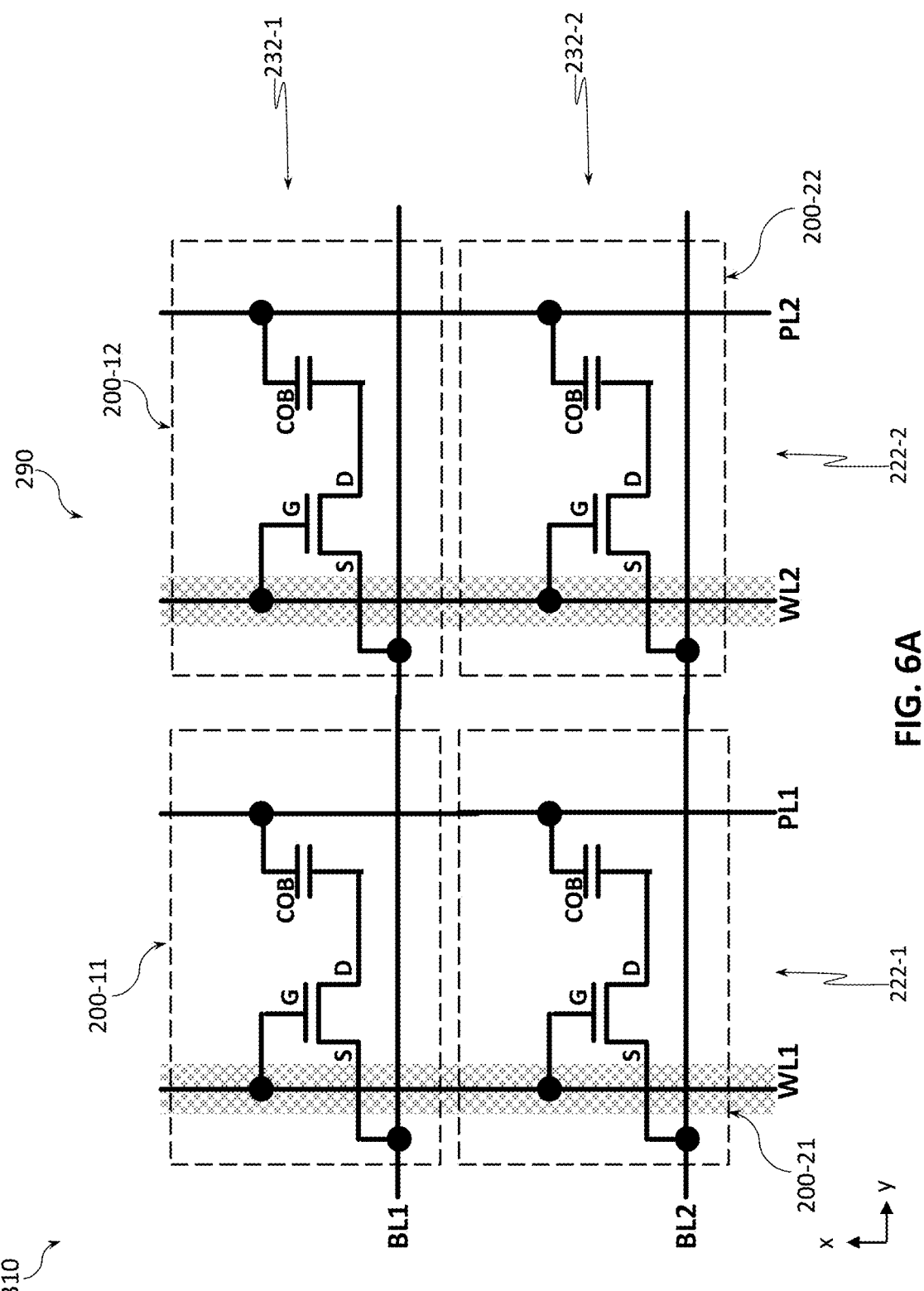
FIGS. 6A-6C provide electric circuit diagrams for different views of a bilayer stacked memory array implementing bilayer memory stacking with wordlines (WLs) shared between bottom and top memory layers, according to some embodiments of the present disclosure.
Figure 6B:
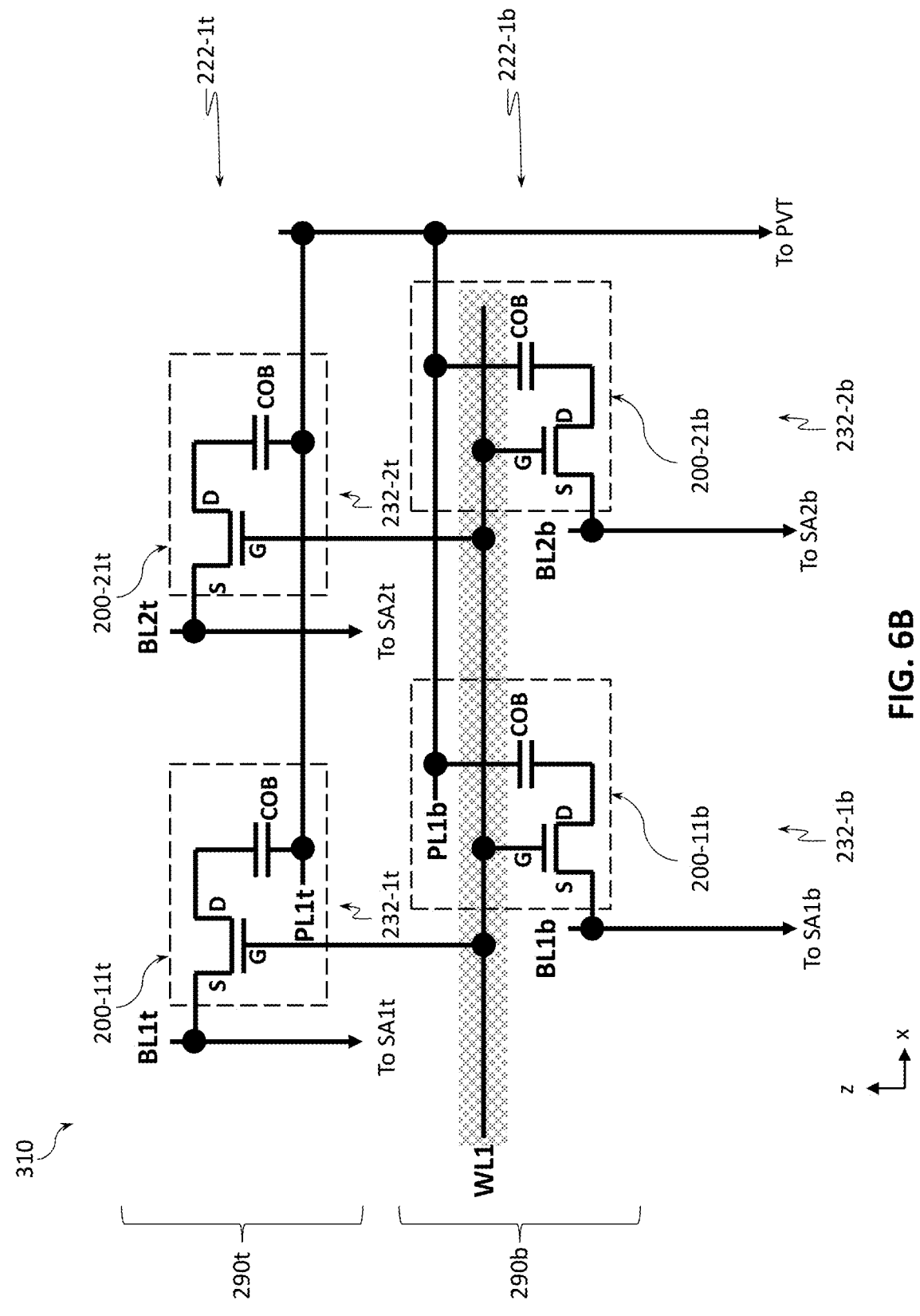
Figure 6C:
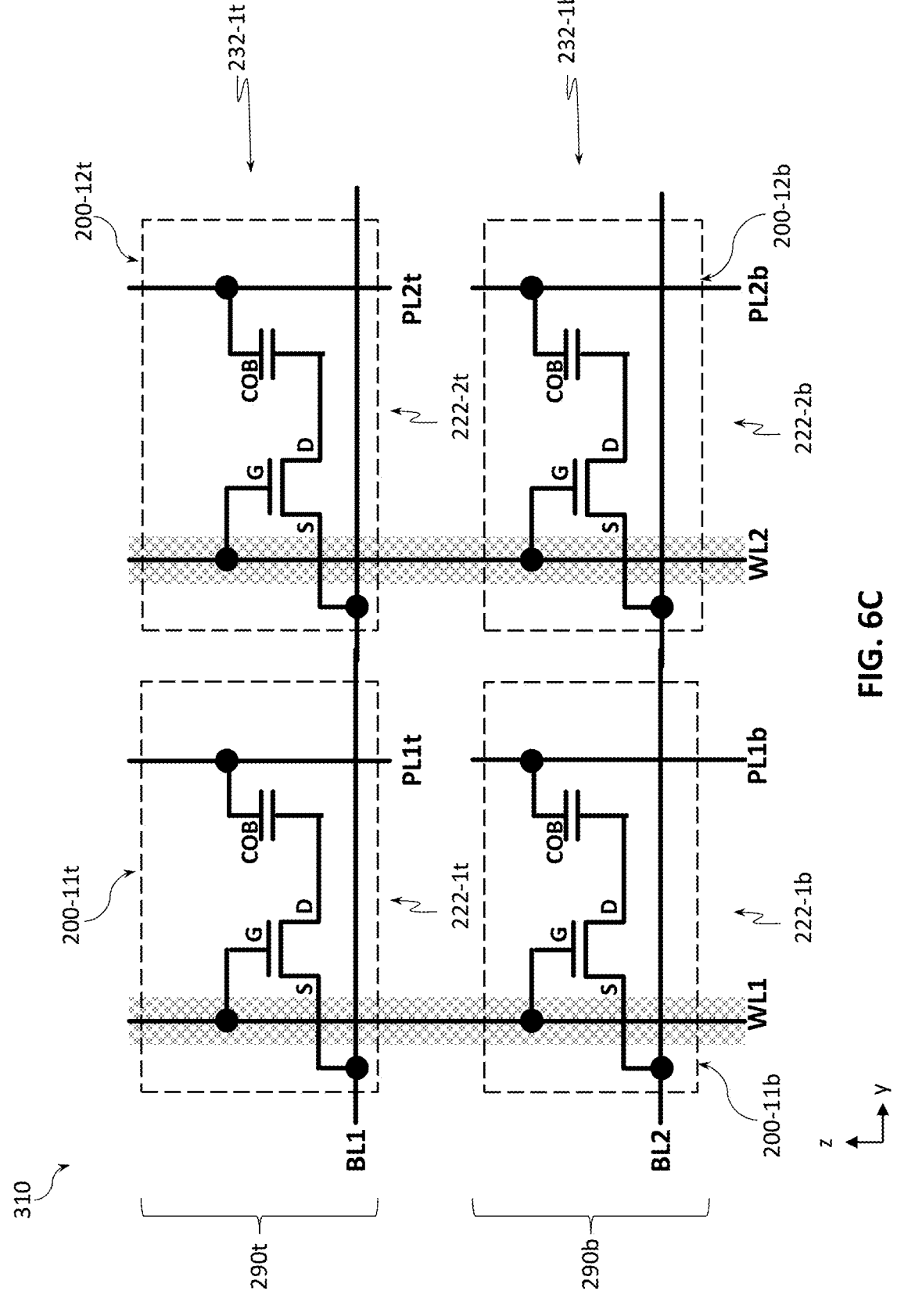

As described above, according to various embodiments of the present disclosure, different memory cells 200 may be arranged in different memory layers above the substrate, e.g., in different layers above the FEOL layer 120 of the IC device 100, thus realizing a stacked backend memory, i.e., a stacked TFT-based eDRAM memory of the BEOL layer 190. In particular, each memory layer (i.e., each memory array arranged at a different z-height, where "z-height" refers to a distance from the support structure 110, measured along the z-axis of the example coordinate system shown in the present drawings) may include memory cells 200 arranged in the form of the memory array 290, and analogous portions of the memory arrays of different layers (e.g., rows or the columns with the same numbers) may be stacked substantially over one another so that some lines (e.g., one or more of WL, BL, or PL) may be shared between memory cells of different layers, thus enabling more efficient use of space and resources. Electric circuit diagrams of two examples of such sharing are illustrated in FIGS. 6-9. In particular, FIGS. 6-7 illustrate embodiments of bilayer memory stacking with WLs shared between bottom and top memory layers, while FIGS. 8-9 illustrate embodiments of bilayer memory stacking with BLs shared between bottom and top memory layers. Each of FIGS. 6-9 provides three views of the same embodiment of bilayer stack of a bottom and a top memory layers, different ones of the three views shown in FIGS. XA, XB, and XC, where X is an integer between 6 and 9 to differentiate between FIGS. 6-9 (e.g., for X=6, this refers to FIG. 6A, FIG. 6B, and FIG. 6C). The view of each of FIG. XA is an x-y view similar to that shown in FIG. 5 (i.e., illustrating only one of the memory arrays stacked using bilayer stacking, e.g., illustrating only the bottom or only the top memory array of the ones shown in FIGS. XB and XC), but further highlighting with a checkered pattern the lines that are shared between bottom and top memory layers. The views of each of FIGS. XB and XC are, respectively, x-z and y-z views illustrating the same embodiment as in FIG. XA but now showing a stack of a bottom memory array 290b and a top memory array 290t, and also using a checkered pattern to highlight the lines that are shared between the stacked memory layers. In particular, the x-z cross-sectional schematic illustration of FIG. XB provides an example of a cross-section taken along rows 1 of the bottom and top memory arrays 290 of FIG. XA (i.e., rows 222-1b and 222-1t, where other rows would look substantially the same. On the other hand, the y-z cross-sectional schematic illustration of FIG. XC provides an example of a cross-section taken along columns 1 of the bottom and top memory arrays 290 of FIG. XA (i.e., columns 232-1b and 232-1t), where other columns would look substantially the same. As shown, FIGS. XB and XC use the same notation for different elements of a given memory array as was shown in FIG. 5 (and un FIGS. XA), but now adding at the end a "b" to designate elements of the bottom memory array/layer and adding at the end a "t" to designate elements of the top memory array/layer shown in these drawings. The bottom memory layer (i.e., the memory layer with the memory array 290b) shown in FIGS. XB and XC may be the first memory layer 130 of the IC device 100, while the top memory layer (i.e., the memory layer with the memory array 290t) shown in FIGS. XB and XC may be the second memory layer 140 of the IC device 100 (although, in some embodiments, there may be other memory layers present between the first memory layer 130 and the FEOL layer 120), or, alternatively, the bottom memory layer shown in FIGS. XB and XC may be the second memory layer 140 of the IC device 100, while the top memory layer shown in FIGS. XB and XC may be another memory layer stacked above the second memory layer 140 (not specifically shown in FIG. 1 but discussed above). Of course, the number of rows and columns of each of the bottom and top arrays shown in FIGS. 6-9 is purely illustrative, and, in other embodiments, any number of rows and columns, each containing any number of one or more memory cells 200 may be used, and, furthermore, additional x-y plane arrays may be stacked over the top array shown in these drawings. In FIGS. 6-9, access transistors of the individual memory cells 200 are not labeled with reference numerals 210, but are illustrated with their gate, drain, and source terminals labeled with letters G, D, and S, respectively. Similarly, storage capacitors of the individual memory cells 200 are not labeled with reference numerals 220 but are labeled as "COB."

Bilayer Memory Stacking with Lines Shared Between Bottom and Top Memory Layers

As described above and as shown in all of FIGS. 6-9, gate terminals/electrodes of a plurality of memory cells 200 in a given row 222 of a particular x-y plane memory array (e.g., the bottom memory array 290b or the top memory array 290 of the illustrations shown in FIGS. XB and XC) are coupled to a common WL for that row of that particular x-y plane memory array (i.e., the memory cells 200 of the same row share a single WL for that row), while one of the S/D terminals/electrodes of a plurality of memory cells 200 in a given column 232 of a particular x-y plane memory array (e.g., the bottom memory array 290b or the top memory array 290 of the illustrations shown in FIGS. XB and XC) are coupled to a common BL for that column of that particular x-y plane memory array (i.e., the memory cells 200 of the same column share a single BL for that column). As also shown in all of FIGS. 6-9, second electrodes of the different capacitors of the memory cells 200 of different x-y plane memory arrays, e.g., of both the bottom memory array 290b and the top memory array 290t, may be coupled to a single shared plate voltage generator (labeled in FIGS. 6-9 as "PVT") configured to generate/apply suitable voltage to the second electrodes of the storage capacitors 220 of different memory cells 200.

The differences between arrangements of FIGS. 6-9 arise from how different WLs and BLs of different x-y plane memory arrays may be shared between pairs of stacked memory layers.

FIGS. 6A-6C provide electric circuit diagrams for different views of a bilayer stacked memory array 310 implementing bilayer memory stacking with some WLs shared between the bottom memory array 290b and the top memory array 290t, according to some embodiments of the present disclosure. The bilayer stacked memory array 310 is one example of how a pair of stacked memory layers may be implemented in the BEOL layer 190 of the IC device 100.

In particular, the bilayer stacked memory array 310 of FIG. 6 illustrates an embodiment where memory cells in rows 222 of different layers above the support structure 110 may be coupled to a respective shared WL, which shared WL may be coupled (e.g., to be driven) by a respective single shared WL driver. In particular, in "shared WL" embodiments of FIG. 6, a common WL coupled to gate terminals of the access transistors 210 of a plurality of memory cells 200 in a given row 222-i (where i is an integer representing one of the rows 222 in an x-y plane of a given memory array 290) of one x-y plane memory array (e.g., of the memory array 290*b*) may simultaneously serve as a common WL coupled to gate terminals of the access transistors 210 of a plurality of memory cells 200 in a corresponding row 222-*i* of another x-y plane memory array (e.g., of the memory array 290*t*) of a bilayer stacked memory array. Thus, the latter x-y plane memory array (e.g., of the memory array 290*t* for the illustration of FIG. 6) does not need to have its own common WLs for different rows 222 because the gates of the access transistors 210 of the memory cells 200 of that memory array are coupled to the respective common WLs of the former x-y plane memory array (e.g., of the memory array 290*b* for the illustration of FIG. 6). This is shown in FIG. 6 with WL1 being coupled to the gate terminals of the access transistors 210 of a plurality of memory cells 200 in the first row 222-1*b* of the bottom memory array 290*b* as well as being coupled to the gate terminals of the access transistors 210 of a plurality of memory cells 200 in the first row 222-1*t* of the top memory array 290*t* (see, e.g., FIG. 6B and FIG. 6C). Instead of having two WL1 (i.e., one coupled to the gate terminals of the access transistors 210 a plurality of memory cells 200 in the first row 222-1*b* of the bottom memory array 290*b* and another one coupled to the gate terminals of the access transistors 210 a plurality of memory cells 200 in the first row 222-1*t* of the top memory array 290*t*), the bilayer stacked memory array 310 only has one WL1 shared by the memory cells 200 in the first row 222-1*b* of the bottom memory array 290*b* and the memory cells 200 in the first row 222-1*t* of the top memory array 290*t*, where the single WL1 may be coupled to a first WL driver of the bilayer stacked memory array 310. Similarly, for the second rows 222-2 shown in FIG. 6, the shared WL embodiment is shown in FIG. 6 with WL2 being coupled to the gate terminals of the access transistors 210 a plurality of memory cells 200 in the second row 222-2*b* of the bottom memory array 290*b* as well as being coupled to the gate terminals of the access transistors 210 a plurality of memory cells 200 in the second row 222-2*t* of the top memory array 290*t* (see, e.g., FIG. 6C). Again, instead of having two WL2 (i.e., one coupled to the gate terminals of the access transistors 210 a plurality of memory cells 200 in the second row 222-2*b* of the bottom memory array 290*b* and another one gate terminals of the access transistors 210 a plurality of memory cells 200 in the second row 222-2*t* of the top memory array 290*t*), the bilayer stacked memory array 310 only has one WL2 shared by the memory cells 200 in the second row 222-2*b* of the bottom memory array 290*b* and the memory cells 200 in the second row 222-2*t* of the top memory array 290*t*, where the single WL2 may be coupled to a second WL driver of the bilayer stacked memory array 310.

FIG. 6 further illustrates, that, in some "shared WL" embodiments, a common BL coupled to S/D terminals of a plurality of memory cells 200 in a given column j (where j is an integer representing a particular column in an x-y plane memory array) of the top memory array 290*t* may be coupled to a sense amplifier SAjt and a common BL coupled to S/D terminals of a plurality of memory cells 200 in a given column j of the bottom memory array 290*b* may be coupled to a sense amplifier SAjb. For example, FIG. 6B illustrates that BL1*t*, coupled to S/D terminals of the memory cells 200 in the first column 232-1*t* of the top memory array 290*t* may be coupled to a sense amplifier SA1*t*, while BL1*b*, coupled to S/D terminals of the memory cells 200 in the first column 232-1*b* of the bottom memory array 290*b* may be coupled to a sense amplifier SA1*b*. However, in other embodiments, BL1*t* and BL1*b* may be coupled as two inputs to a multiplexer coupled to a single sense amplifier, so that a single sense amplifier may be shared by being multiplexed between the common BLs of a given column j of different x-y plane memory arrays 290. Analogous holds for other columns 232 of the bilayer stacked memory array 310.

As is further illustrated in the view of FIG. 6B, in some embodiments of the "shared WL" arrangement as described with reference to the bilayer stacked memory array 310, memory cells of the top memory array 290*t* may, optionally, be interleaved with memory cells of the bottom memory array 290*b* to allow memory cells of a given row 222-*i* of the top and bottom memory arrays to be coupled to a single shared WLi (and, possibly, to allow reduced area for BL landing from the same edge of an array). Thus, when projected on a given x-y plane (i.e., a plane parallel to the support structure 110), projections of memory cells 200 in the bottom memory array 290*b* may be offset (not co-centered) with projections of memory cells 200 in the top memory array 290*t*, e.g., in the direction of the x-axis of the example coordinate system shown in the present drawings.

Figure 7A:
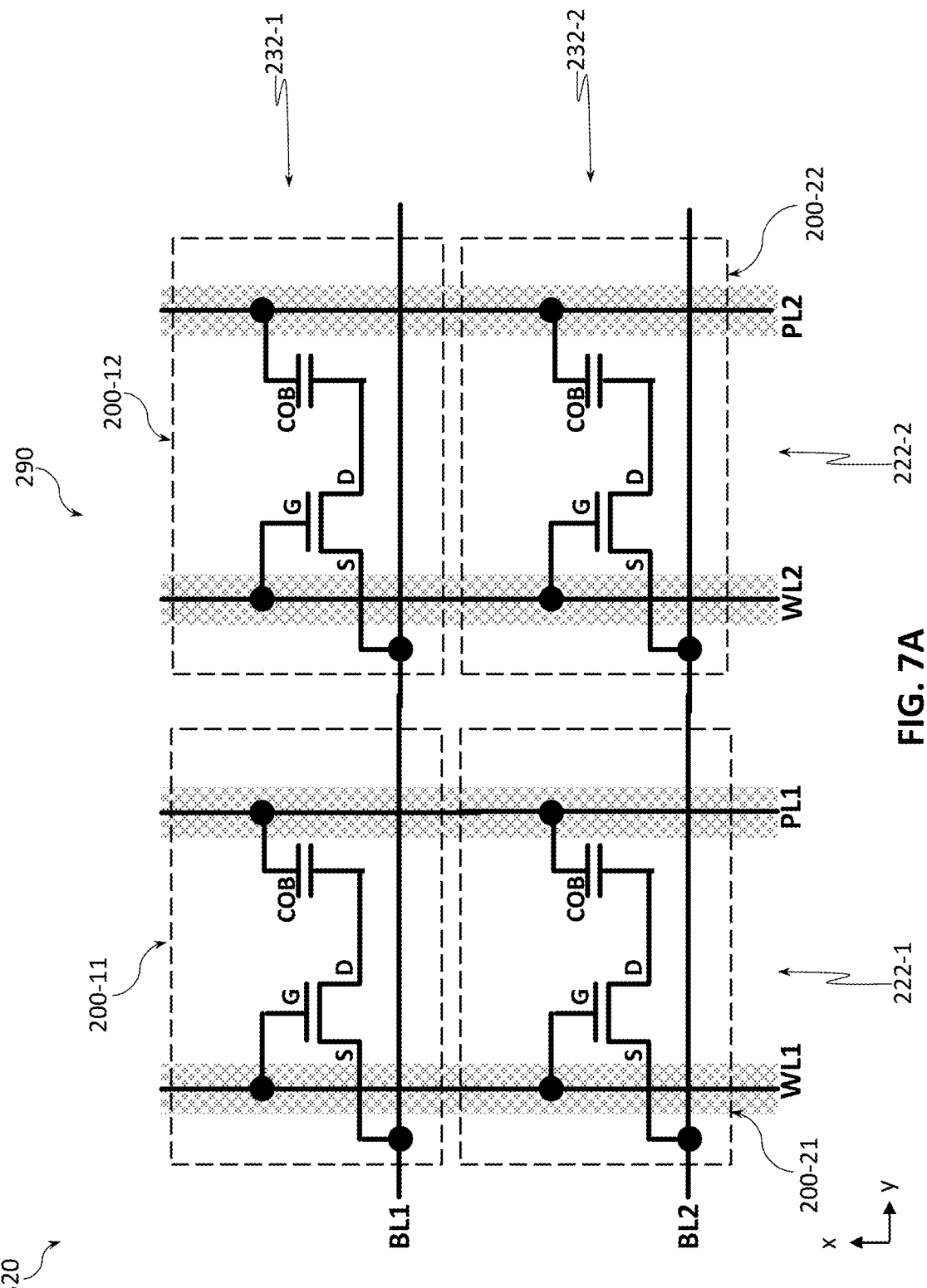
FIGS. 7A-7C provide electric circuit diagrams for different views of a bilayer stacked memory array implementing bilayer memory stacking with WLs and platelines (PLs) shared between bottom and top memory layers, according to some embodiments of the present disclosure.
Figure 7B:
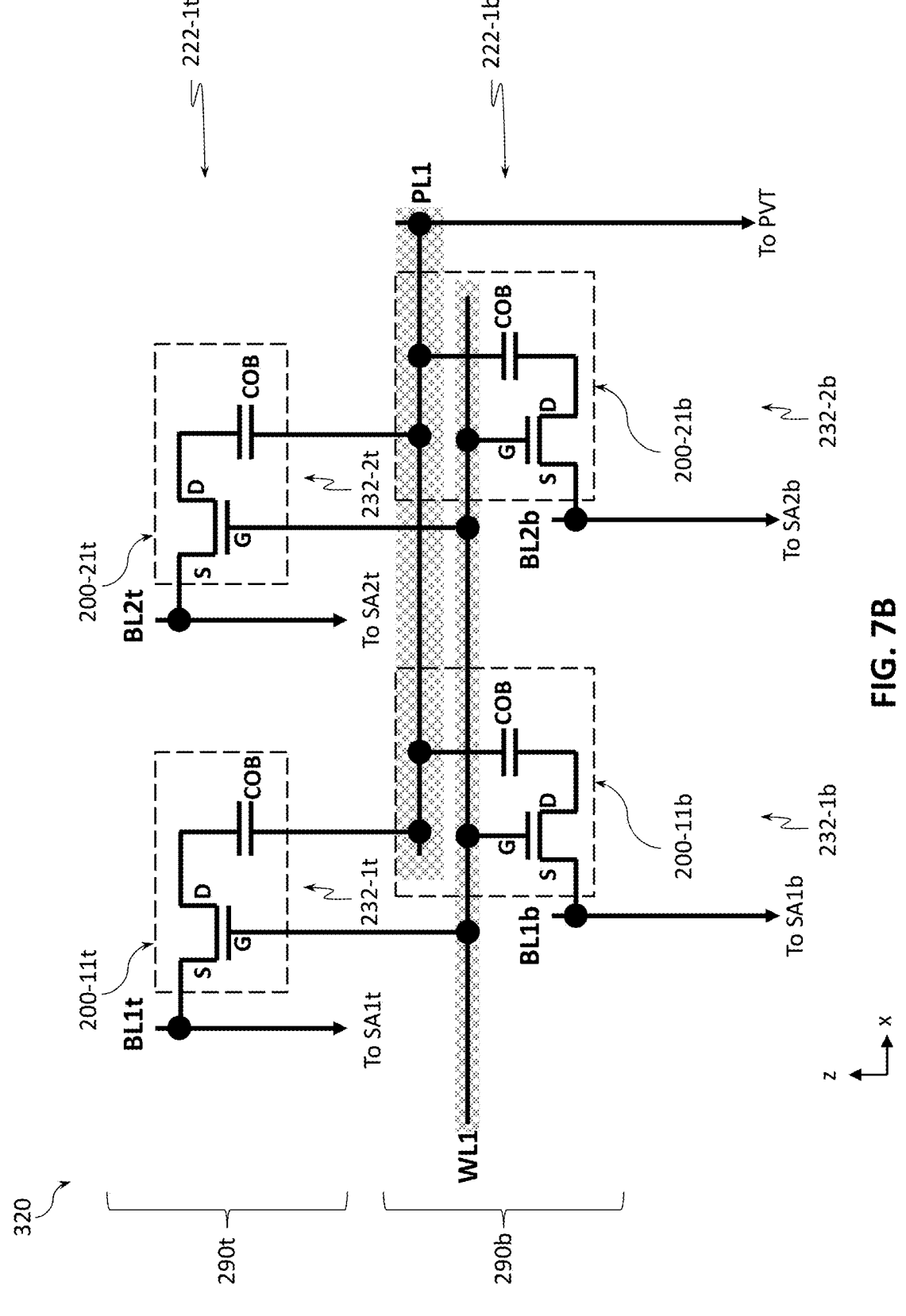
Figure 7C:
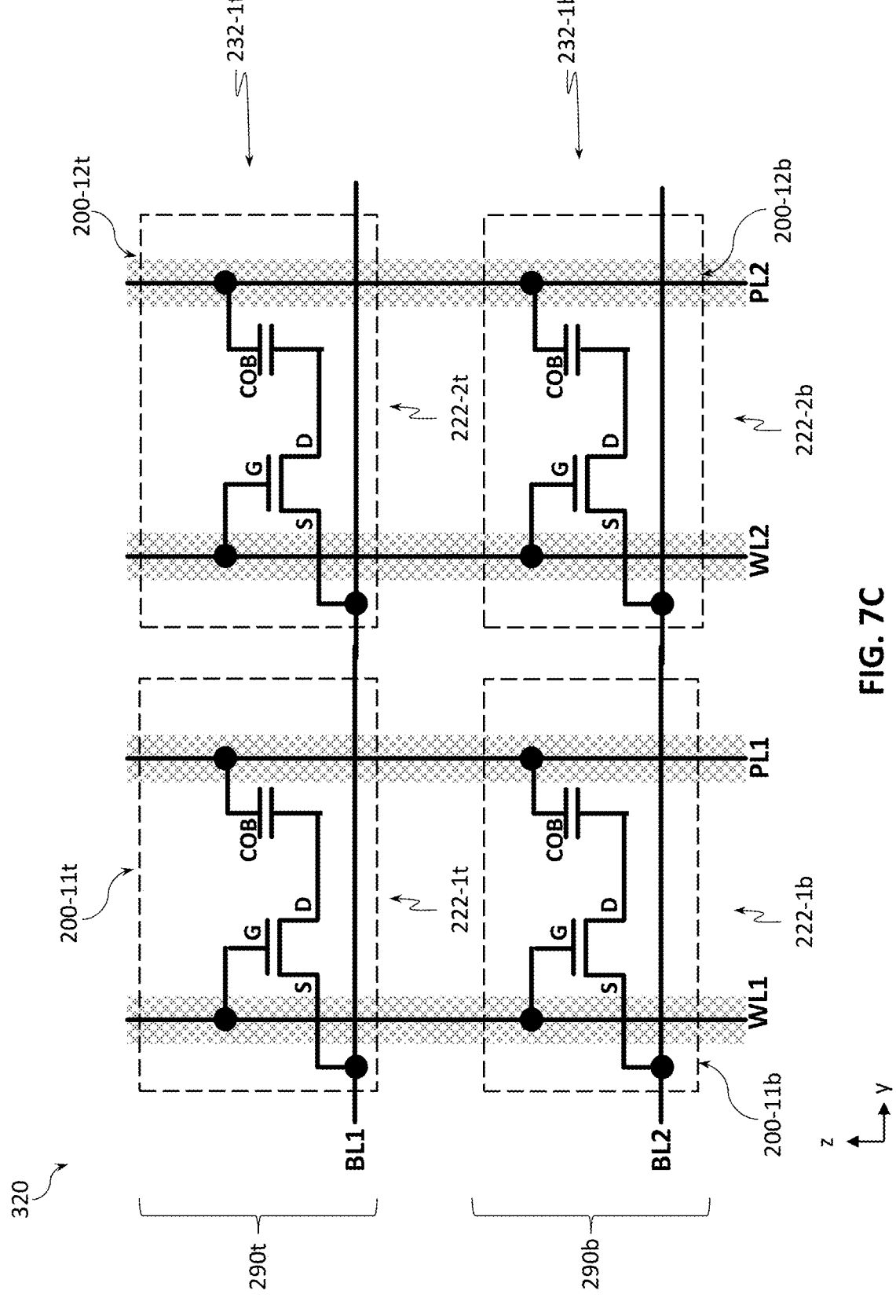

The embodiment shown in FIG. 6 illustrates that separate PLs provided for the same rows i of the bottom memory array 290*b* and the top memory array 290*t*. This is illustrated, e.g., the view of each of FIG. 6B and FIG. 6C, showing, for the top memory array 290*t*, PL1*t* coupled to the second electrodes of the capacitors of the memory cells 200 of the first row 222-1*t*, and further showing, for the bottom memory array 290*b*, a separate PL1*b* coupled to the second electrodes of the capacitors of the memory cells 200 of the first row 222-1*b*. This is further illustrated in the view of FIG. 6C for the second rows 222-2, showing, for the top memory array 290*t*, PL2*t* coupled to the second electrodes of the capacitors of the memory cells 200 of the second row 222-2*t*, and further showing, for the bottom memory array 290*b*, a separate PL2*b* coupled to the second electrodes of the capacitors of the memory cells 200 of the second row 222-2*b*. However, in other embodiments of the present disclosure, a PL for a given row 222-*i* of one of the bottom and top memory arrays 290 may be shared with the same row of another one of the bottom and top memory arrays 290, similar to how the WLs for the rows of the bottom and top memory arrays 290 are shared. This is illustrated in FIGS. 7A-7C, providing electric circuit diagrams for different views of a bilayer stacked memory array 320 implementing bilayer memory stacking with some WLs and some PLs shared between the bottom memory array 290*b* and the top memory array 290*t*, according to some embodiments of the present disclosure. The bilayer stacked memory array 320 is another example of how a pair of stacked memory layers may be implemented in the BEOL layer 190 of the IC device 100.

The bilayer stacked memory array 320 is substantially the same as the bilayer stacked memory array 310, except for the differences in sharing of some of the PLs between the bottom memory array 290*b* and the top memory array 290*t*, so all of the descriptions provided with respect to FIG. 6 are applicable to FIG. 7 and, in the interests of brevity, are not repeated.

In particular, the bilayer stacked memory array 320 of FIG. 7 illustrates an embodiment where memory cells in rows 222 of different layers above the support structure 110 may be coupled to a respective shared PL, which shared PL may be coupled to a respective single PVT generator. In particular, in "shared PL" embodiments of FIG. 7, a common PL coupled to second electrodes of the capacitors COB of a plurality of memory cells 200 in a given row 222-*l* of one x-y plane memory array (e.g., of the memory array 290b) may simultaneously serve as a common PL coupled to second electrodes of the capacitors COB of a plurality of memory cells 200 in a corresponding row 222-i of another x-y plane memory array (e.g., of the memory array 290t) of a bilayer stacked memory array. Thus, the latter x-y plane memory array (e.g., of the memory array 290t for the illustration of FIG. 7) does not need to have its own common PLs for different rows 222 because the second electrodes of the capacitors COB of the memory cells 200 of that memory array are coupled to the respective common PLs of the former x-y plane memory array (e.g., of the memory array 290b for the illustration of FIG. 7). This is shown in FIG. 7 with PL1 being coupled to second electrodes of the capacitors COB of a plurality of memory cells 200 in the first row 222-1b of the bottom memory array 290b as well as being coupled to second electrodes of the capacitors COB of a plurality of memory cells 200 in the first row 222-1t of the top memory array 290t (see, e.g., FIG. 7B and FIG. 7C). Instead of having two PL1 (i.e., one coupled to second electrodes of the capacitors COB of a plurality of memory cells 200 in the first row 222-1b of the bottom memory array 290b and another one coupled to second electrodes of the capacitors COB of a plurality of memory cells 200 in the first row 222-1t of the top memory array 290t), the bilayer stacked memory array 310 only has one PL1 shared by the memory cells 200 in the first row 222-1b of the bottom memory array 290b and the memory cells 200 in the first row 222-1t of the top memory array 290t, where the single PL1 may be coupled to a first PVT generator of the bilayer stacked memory array 310. Similarly, for the second rows 222-2 shown in FIG. 7, the shared PL embodiment is shown in FIG. 7 with PL2 being coupled to second electrodes of the capacitors COB of a plurality of memory cells 200 in the second row 222-2b of the bottom memory array 290b as well as being coupled to second electrodes of the capacitors COB of a plurality of memory cells 200 in the second row 222-2t of the top memory array 290t (see, e.g., FIG. 7C). Again, instead of having two PL2 (i.e., one coupled to second electrodes of the capacitors COB of a plurality of memory cells 200 in the second row 222-2b of the bottom memory array 290b and another one coupled to second electrodes of the capacitors COB of a plurality of memory cells 200 in the second row 222-2b of the top memory array 290t), the bilayer stacked memory array 320 only has one PL2 shared by the memory cells 200 in the second row 222-2b of the bottom memory array 290b and the memory cells 200 in the second row 222-2b of the top memory array 290t, where the single PL2 may be coupled to a second PVT generator of the bilayer stacked memory array 320.

Figure 8A:
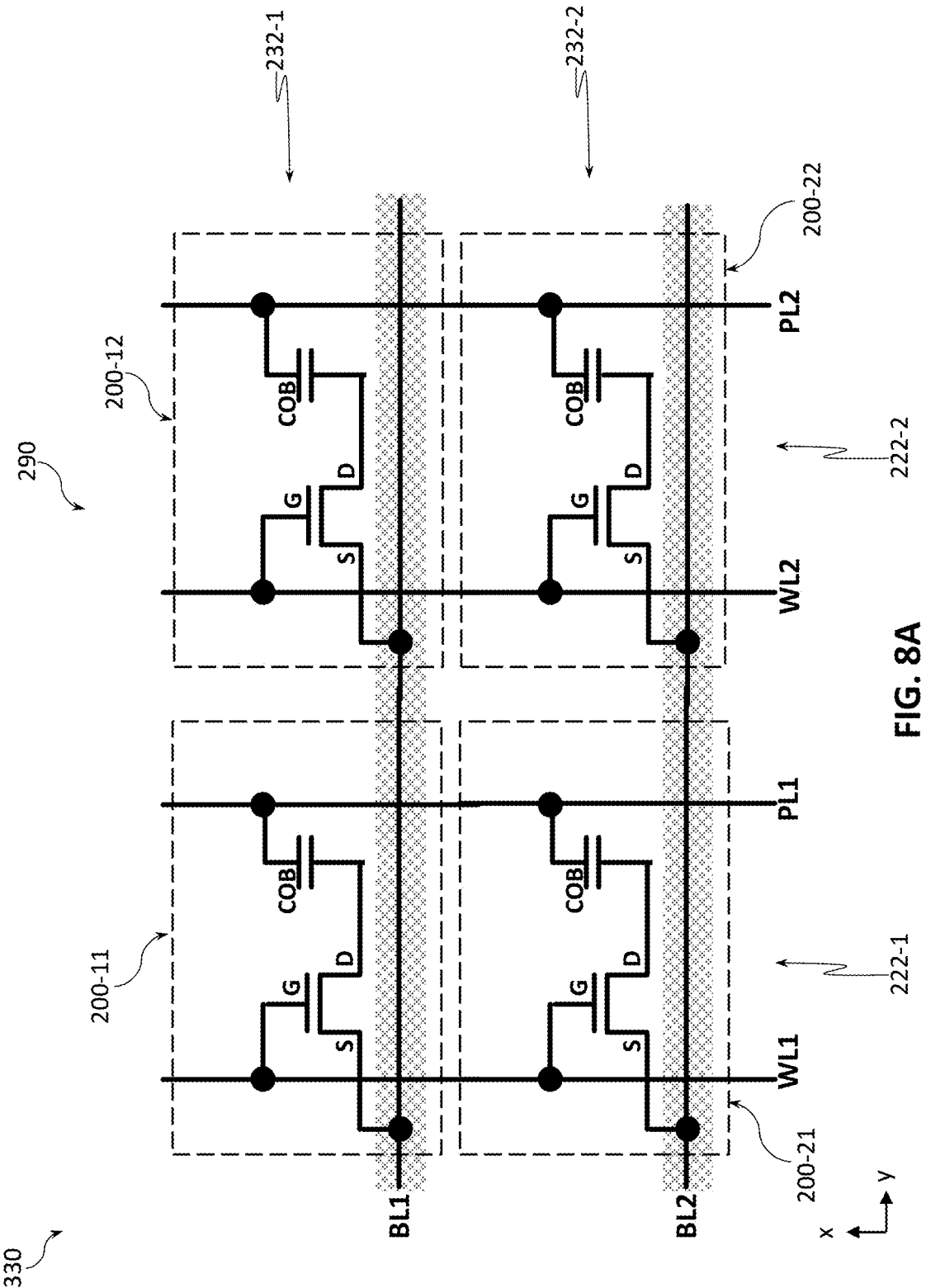
FIGS. 8A-8C provide electric circuit diagrams for different views of a bilayer stacked memory array implementing bilayer memory stacking with bitlines (BLs) shared between bottom and top memory layers, according to some embodiments of the present disclosure.
Figure 8B:
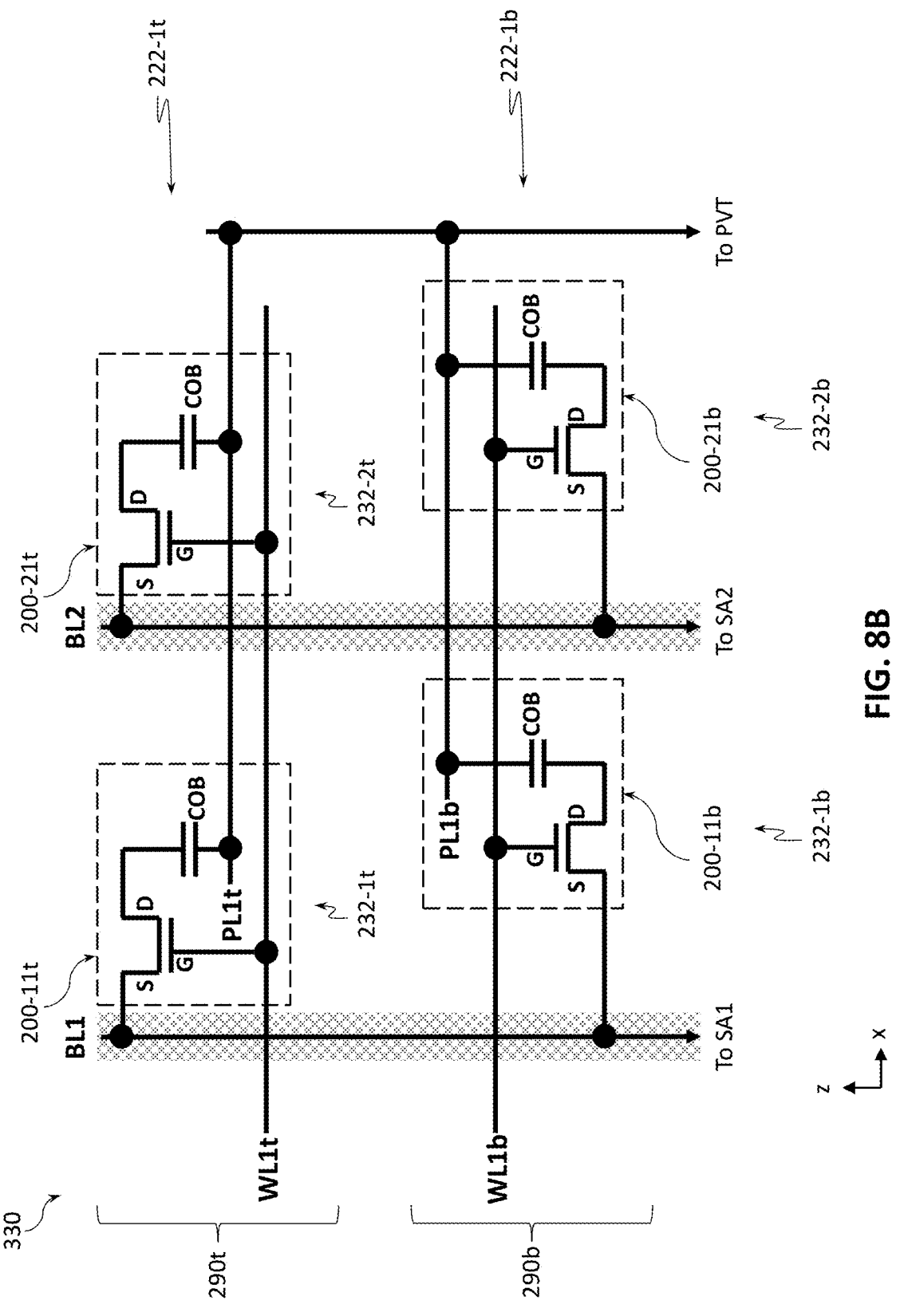
Figure 8C:
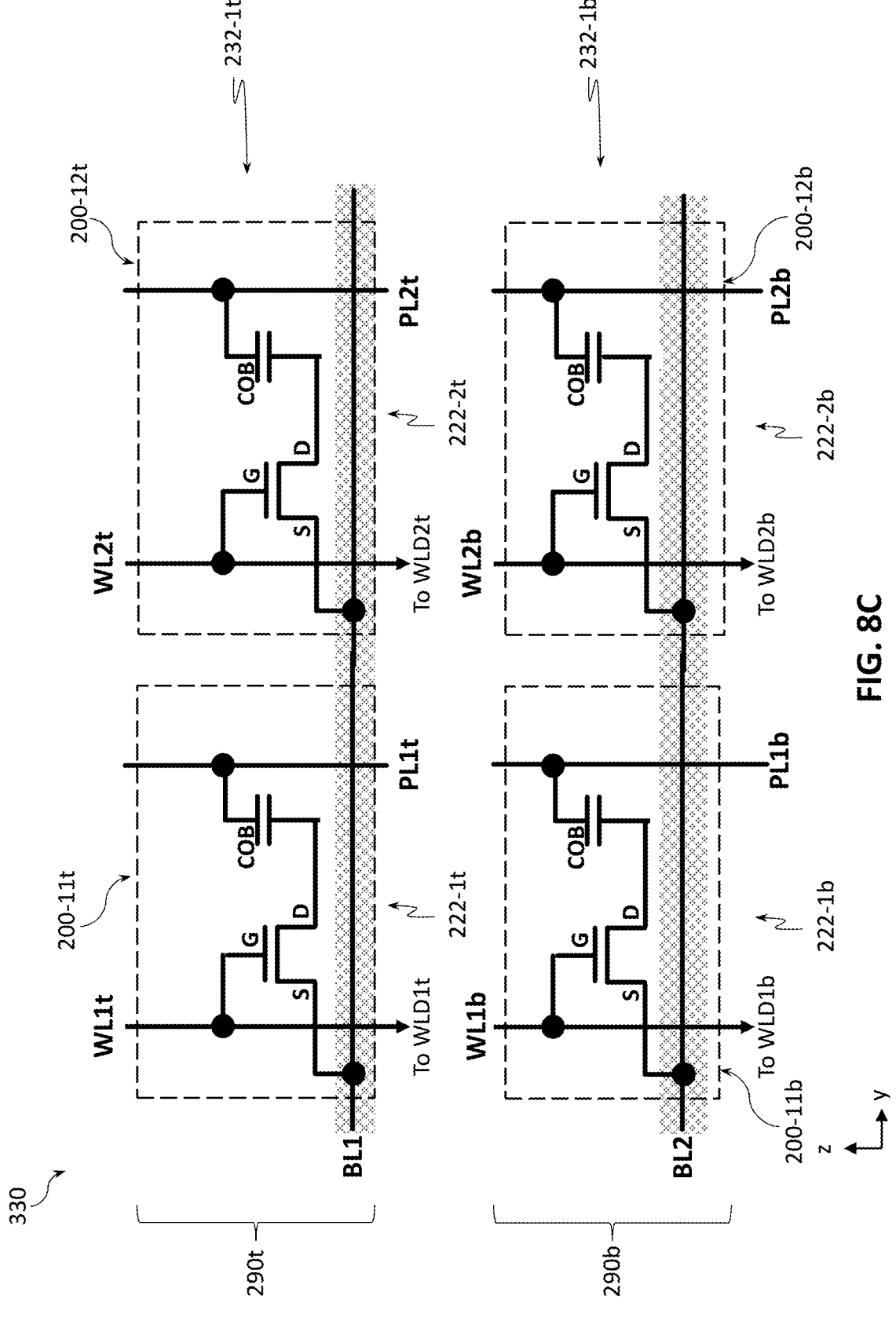

Turning to the details of bilayer memory stacking with BLs shared between bottom and top memory layers, FIGS. 8A-8C provide electric circuit diagrams for different views of a bilayer stacked memory array 330 implementing bilayer memory stacking with some BLs shared between the bottom memory array 290b and the top memory array 290t, according to some embodiments of the present disclosure. The bilayer stacked memory array 330 is yet one example of how a pair of stacked memory layers may be implemented in the BEOL layer 190 of the IC device 100.

In particular, the bilayer stacked memory array 330 of FIG. 8 illustrates an embodiment where memory cells in columns 232 of different layers above the support structure 110 may be coupled to a respective shared BL, which shared BL may be coupled to a respective single shared SA. In particular, in "shared BL" embodiments of FIG. 8, a common BL coupled to first S/D terminals (e.g., source terminals) of the access transistors 210 of a plurality of memory cells 200 in a given column 232-j of one x-y plane memory array (e.g., of the memory array 290b) may simultaneously serve as a common BL coupled to first S/D terminals (e.g., source terminals) of the access transistors 210 of a plurality of memory cells 200 in a corresponding column 232-i of another x-y plane memory array (e.g., of the memory array 290t) of a bilayer stacked memory array. Thus, the latter x-y plane memory array (e.g., of the memory array 290t for the illustration of FIG. 8) does not need to have its own common BLs for different columns 232 because the first S/D terminals of the access transistors of the memory cells 200 of that memory array are coupled to the respective common BLs of the former x-y plane memory array (e.g., of the memory array 290b for the illustration of FIG. 8). This is shown in FIG. 8 with BL1 being coupled to the first S/D terminals of the access transistors 210 of a plurality of memory cells 200 in the first column 232-1b of the bottom memory array 290b as well as being coupled to the first S/D terminals of the access transistors 210 of a plurality of memory cells 200 in the first column 232-1t of the top memory array 290t (see, e.g., FIG. 8B and FIG. 8C). Instead of having two BL1 (i.e., one coupled to the first S/D terminals of the access transistors 210 of a plurality of memory cells 200 in the first column 232-1b of the bottom memory array 290b and another one coupled to the first S/D terminals of the access transistors 210 of a plurality of memory cells 200 in the first column 232-1t of the top memory array 290t), the bilayer stacked memory array 330 only has one BL1 shared by the memory cells 200 in the first column 232-1b of the bottom memory array 290b and the memory cells 200 in the first column 232-1t of the top memory array 290t, where the single BL1 may be coupled to a first SA (SA1) of the bilayer stacked memory array 330. Similarly, for the second columns 232-2 shown in FIG. 8, the shared BL embodiment is shown in FIG. 8 with BL2 being coupled to the first S/D terminals of the access transistors 210 of a plurality of memory cells 200 in the second column 232-2b of the bottom memory array 290b as well as being coupled to the first S/D terminals of the access transistors 210 of a plurality of memory cells 200 in the second column 232-2t of the top memory array 290t (see, e.g., FIG. 8B). Again, instead of having two BL2 (i.e., one coupled to the first S/D terminals of the access transistors 210 of a plurality of memory cells 200 in the second column 232-2b of the bottom memory array 290b and another one first S/D terminals of the access transistors 210 of a plurality of memory cells 200 in the second column 232-2t of the top memory array 290t), the bilayer stacked memory array 330 only has one BL2 shared by the memory cells 200 in the second column 232-2b of the bottom memory array 290b and the memory cells 200 in the second column 232-2t of the top memory array 290t, where the single BL2 may be coupled to a second SA (SA2) of the bilayer stacked memory array 330.

What is also shown in FIG. 8 is that, in some of the "shared bitline" embodiments, memory cells of different x-y plane memory arrays may be read/programmed individually by using separate WL drivers (WLDs). For example, FIG. 8C illustrates a common wordline WL1b coupled to gate terminals of the access transistors 210 a plurality of memory cells 200 in the first row 222-1b of the bottom memory array 290b being coupled to a WLD labeled as "WLD1b," a common wordline WL1t coupled to gate terminals of the access transistors 210 a plurality of memory cells 200 in the first row 222-1t of the top memory array 290t being coupled to a WLD labeled as "WL1t," a common wordline WL2b coupled to gate terminals of the access transistors 210 a plurality of memory cells 200 in the second row 222-2b of the bottom memory array 290*b* being coupled to a WLD labeled as "WLD2*b*," and a common wordline WL2*t* coupled to gate terminals of the access transistors 210 a plurality of memory cells 200 in the second row 222-2*t* of the top memory array 290*t* being coupled to a WLD labeled as "WLD2*t*."

As is further illustrated in the view of FIG. 8B, in some embodiments of the "shared BL" arrangement as described with reference to the bilayer stacked memory array 330, memory cells of the top memory array 290*t* may, optionally, be interleaved with memory cells of the bottom memory array 290*b* to allow memory cells of a given row 222-*i* of the top and bottom memory arrays to be coupled to a single shared SAj. Thus, when projected on a given x-y plane (i.e., a plane parallel to the support structure 110), projections of memory cells 200 in the bottom memory array 290*b* may be offset (not co-centered) with projections of memory cells 200 in the top memory array 290*t*, e.g., in the direction of the x-axis of the example coordinate system shown in the present drawings.

Figure 9A:
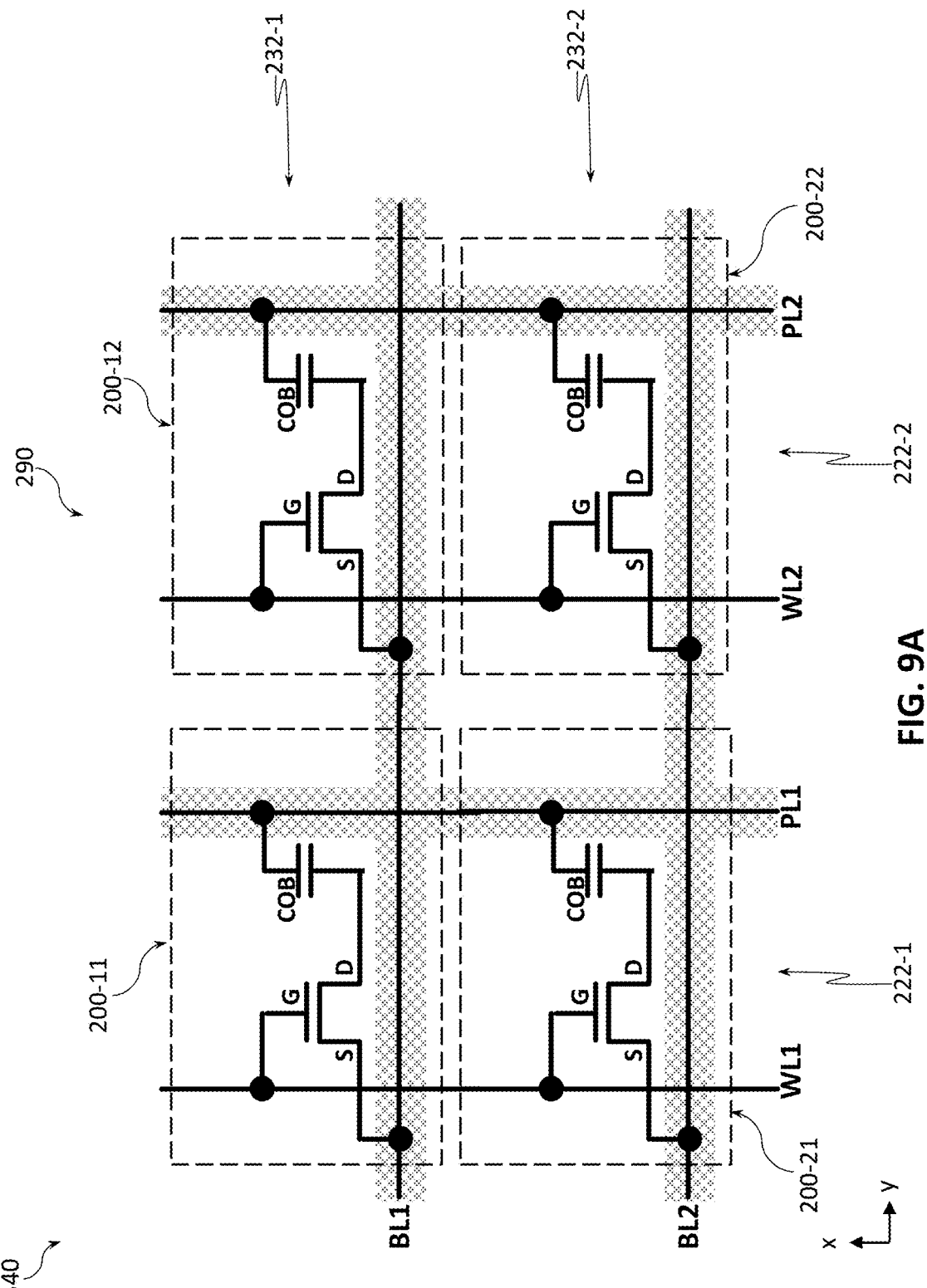
FIGS. 9A-9C provide electric circuit diagrams for different views of a bilayer stacked memory array implementing bilayer memory stacking with BLs and PLs shared between bottom and top memory layers, according to some embodiments of the present disclosure.
Figure 9B:
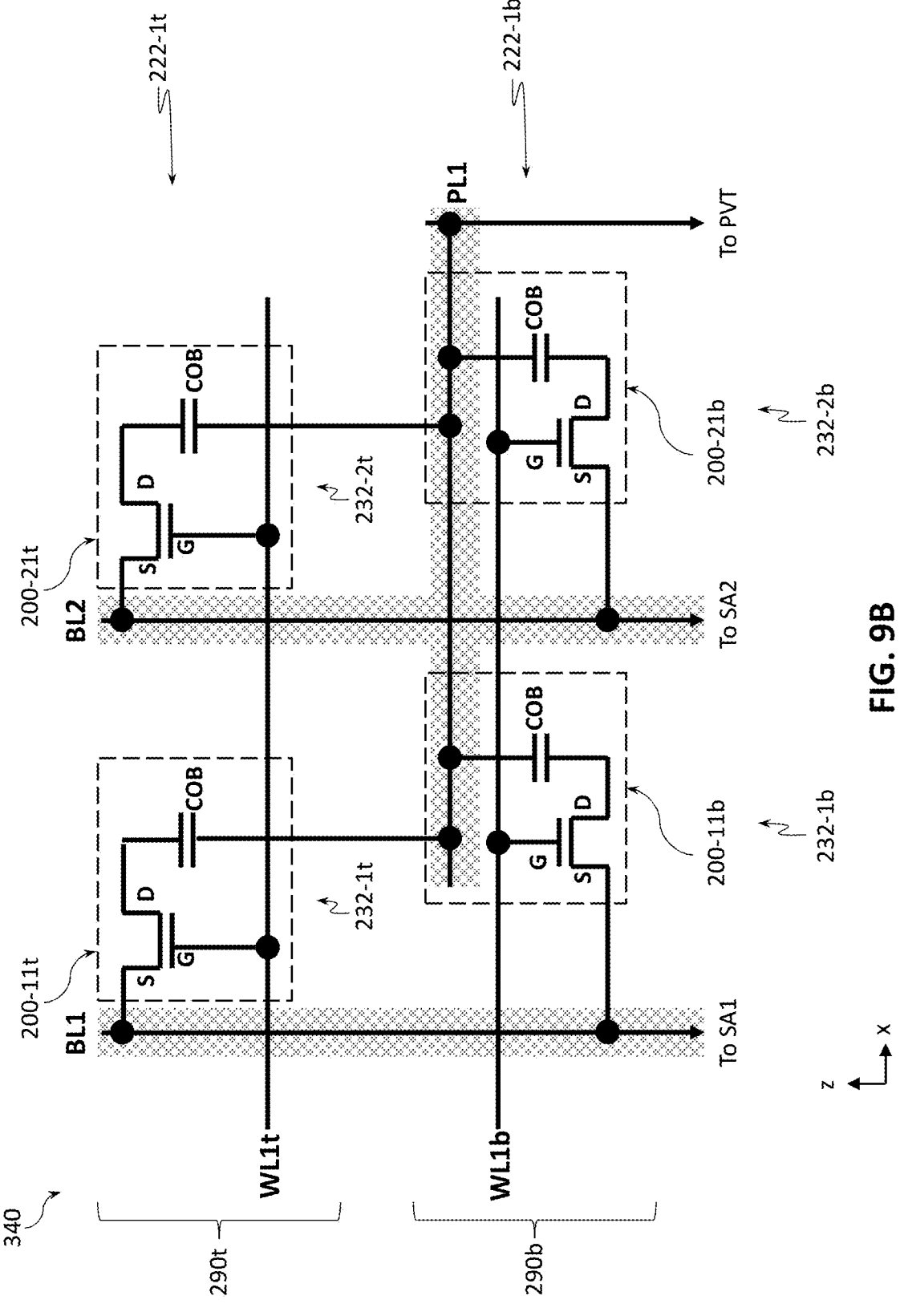
Figure 9C:
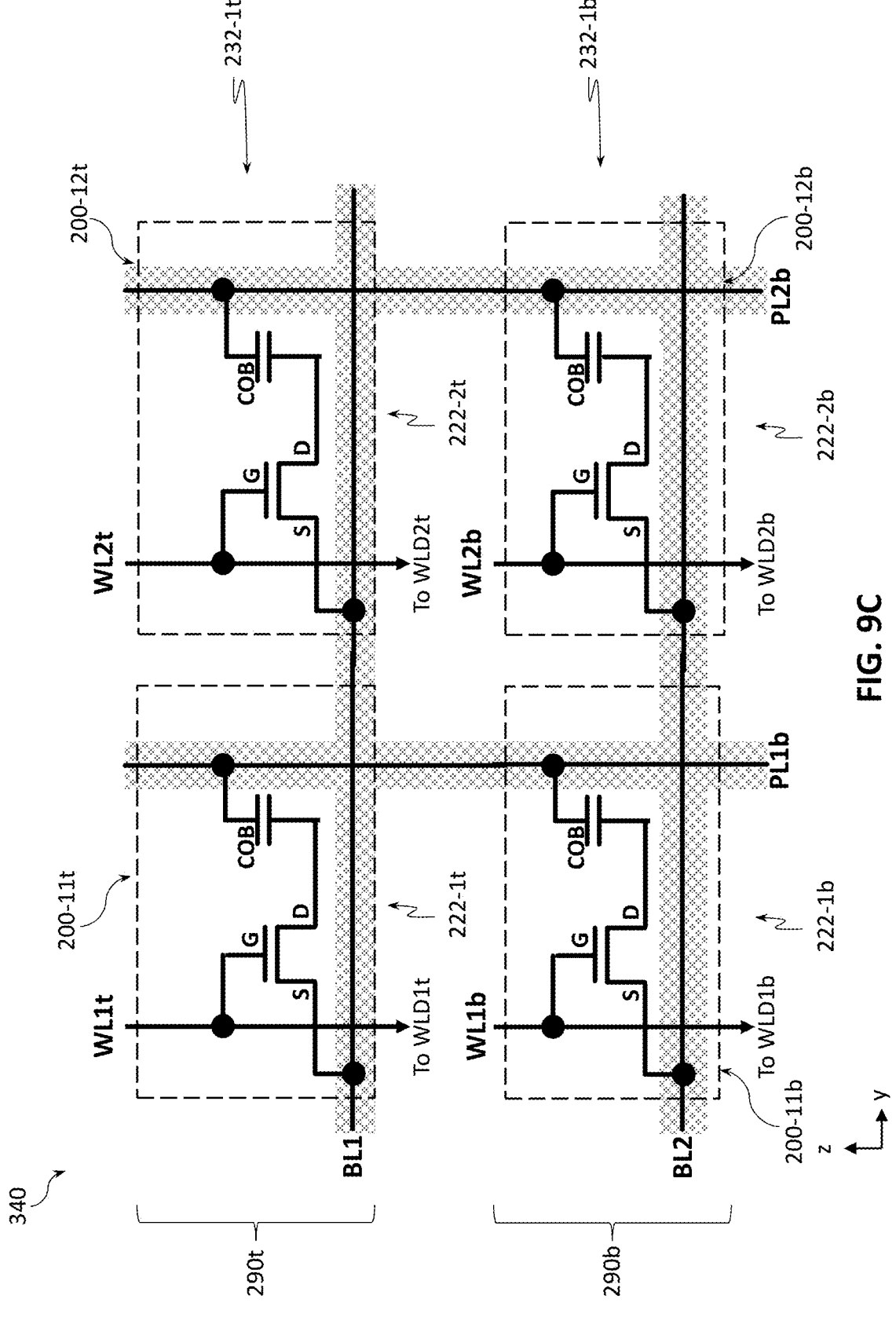

The embodiment shown in FIG. 8 illustrates that separate PLs provided for the same rows i of the bottom memory array 290*b* and the top memory array 290*t*. This is illustrated, e.g., the view of each of FIG. 8B and FIG. 8C in the same manner as was explained with reference to FIGS. 6B and 6C. However, in other embodiments of the present disclosure, a PL for a given row 222-*i* of one of the bottom and top memory arrays 290 may be shared with the same row of another one of the bottom and top memory arrays 290, similar to how it was explained with reference to FIGS. 7B and 7C but now in combination with the shared BL embodiments of FIG. 8, instead of being in combination of the shared WL embodiments of FIG. 6. This is illustrated in FIGS. 9A-9C, providing electric circuit diagrams for different views of a bilayer stacked memory array 340 implementing bilayer memory stacking with some BLs and some PLs shared between the bottom memory array 290*b* and the top memory array 290*t*, according to some embodiments of the present disclosure. The bilayer stacked memory array 340 is yet another example of how a pair of stacked memory layers may be implemented in the BEOL layer 190 of the IC device 100.

The bilayer stacked memory array 340 is substantially the same as the bilayer stacked memory array 330, except for the differences in sharing of some of the BLs instead of sharing the WLs. Therefore, all of the descriptions regarding sharing of the PLs provided with respect to FIG. 8 are applicable to FIG. 9 and, in the interests of brevity, are not repeated.

While FIGS. 6-9 illustrate and describe common PLs being associated with different rows 222 of the memory arrays 290, in other embodiments common PLs may be associated with (i.e., coupled to second electrodes of the capacitors COB of) columns 232 of the memory cells 200, similar to how BLs are described to be associated with columns 232. Thus, in still further embodiments, of the bilayer stacked memory arrays as shown in FIGS. 6-9, in some embodiments, separate PLs may be provided for the same columns j of the bottom memory array 290*b* and the top memory array 290*t*, while, in other embodiments, a PL for a given column 232-*j* of one of the bottom and top memory arrays 290 may be shared with the same column 232-*j* of another one of the bottom and top memory arrays 290, similar to how the BLs for the columns of the bottom and top memory arrays 290 are shared. Except for this difference, the descriptions of sharing PLs are analogous to those provided above with respect to sharing PLs according to the rows 222. Still further, in some embodiments, PLs may be shared among the same columns 232-*j*, for some or all of the columns 232, of the bottom memory array 290*b* and the top memory array 290*t* without any sharing of the WLs or the BLs between bottom and top memory layers as described herein. In still further embodiments, PLs may be shared among the same rows 222-*i*, for some or all of the rows 222, of the bottom memory array 290*b* and the top memory array 290*t* without any sharing of the WLs or the BLs between bottom and top memory layers as described herein.

The foregoing descriptions illustrate that, in various embodiments of the bilayer stacking with lines shared between bottom and top memory layers, the following embodiments are possible: 1) WLs may be shared among the same rows 222-*i*, for some or all of the rows 222, of the bottom memory array 290*b* and the top memory array 290*t*, 2) BLs may be shared among the same columns 232-*j*, for some or all of the columns 232, of the bottom memory array 290*b* and the top memory array 290*t*, 3) PLs may be shared among the same rows 222-*i*, for some or all of the rows 222, of the bottom memory array 290*b* and the top memory array 290*t*, 4) PLs may be shared among the same columns 232-*j*, for some or all of the columns 232, of the bottom memory array 290*b* and the top memory array 290*t*. Furthermore, a combination of such embodiment 3 is possible with any of such embodiments 1 and 2, and, still further, a combination of such embodiment 4 is possible with any of such embodiments 1 and 2.

Descriptions provided with respect to FIGS. 6-9 are applicable to any kinds of transistor architectures, such as top-gated transistors, bottom-gated transistors, transistors with both S/D contacts being on one face of the channel material (in combination with either the top-gated or the bottom-gated embodiments), and transistors with different S/D contacts being on different (opposite) faces of the channel material (also in combination with either the top-gated or the bottom-gated embodiments). Depending on the transistors architecture, in some embodiments, some or all of the access transistors 210 of the memory cells of the bottom memory arrays 290*b* may be oriented upside down with respect to the some or all of the access transistors 210 of the memory cells of the top memory arrays 290*t*, in order to allow easier sharing of the WLs, BLs, and/or PLs between the bottom and the top memory arrays, as described herein.

Example Fabrication Methods

Figures 10, 11:
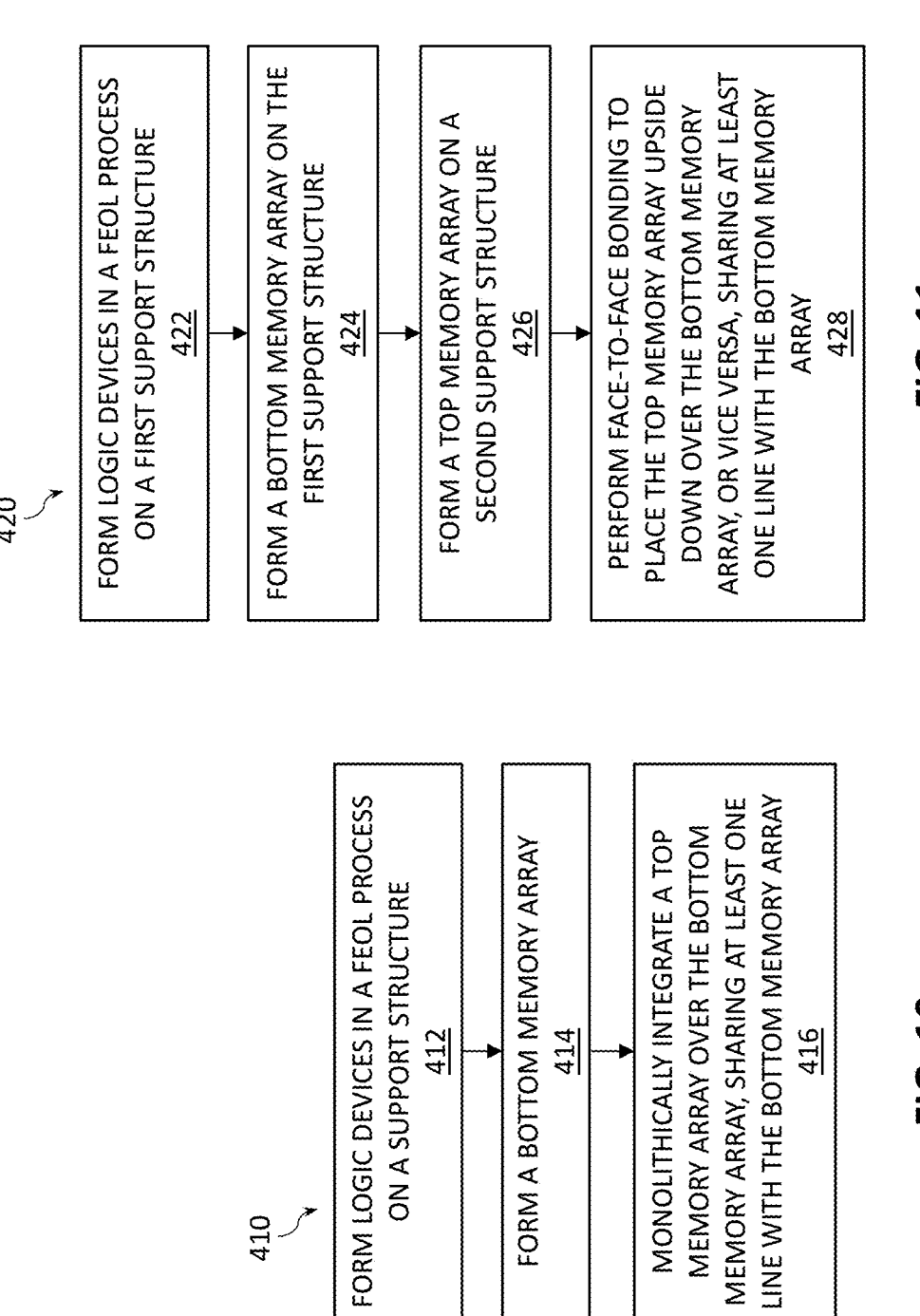
FIG. 10 is a flow diagram of a monolithic integration method of manufacturing an IC device implementing bilayer memory stacking with lines shared between bottom and top memory layers, according to some embodiments of the present disclosure.
FIG. 11 is a flow diagram of a bonding method of manufacturing an IC device implementing bilayer memory stacking with lines shared between bottom and top memory layers, according to some embodiments of the present disclosure.

Any suitable techniques may be used to manufacture the IC device 100 implementing bilayer memory stacking with lines shared between bottom and top memory layers as disclosed herein, e.g., subtractive, additive, damascene, dual-damascene, etc. Some of such techniques may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique). FIGS. 10 and 11 provide flow diagrams of two illustrative methods 410, 420 of manufacturing an IC device implementing bilayer memory stacking with lines shared between bottom and top memory layers, according to some embodiments of the present disclosure. Although the operations discussed below with reference to the methods 410, 420 are illustrated in a particular order and depicted once each, these operations may be repeated or performed in a different order (e.g., in parallel), as suitable. Additionally, various operations may be omitted, as suitable. Various operations of the methods 410, 420 may be illustrated with reference to one or more of the embodiments discussed above, but the methods 410, 420 may be used to manufacture any suitable IC device implementing bilayer memory stacking with lines shared between bottom and top memory layers (including any suitable ones of the embodiments disclosed herein). The example fabrication methods shown in FIGS. 10 and 11 may include other operations not specifically shown in FIGS. 10 and 11, such as various cleaning or planarization operations as known in the art. For example, in some embodiments, any of the layers of the IC device may be cleaned prior to, after, or during any of the processes of the fabrication methods described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the top surfaces of the IC devices described herein may be planarized prior to, after, or during any of the processes of the fabrication methods described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

As shown in FIG. 10, the method 410 may include a process 412 that includes forming logic devices in an FEOL process on a support structure. To that end, the process 412 may include forming the FEOL layer 120, as described herein, over the support structure 110, as also described herein. The method 410 may also include a process 414 that includes providing a bottom memory array in a BEOL layer (e.g., the BEOL layer 190 as described herein) over the FEOL layer provided in the process 412. For example, the process 414 may include providing the bottom memory layer 130 with the bottom memory array 290b in the BEOL layer 190, according to any embodiments described herein. The method 410 may then proceed with monolithically integrating additional memory layers in the BEOL layer 190, integrating one or more bilayer stacking shared lines according to any of the embodiments described herein, by depositing and processing them on top of the bottom memory layer 130. Thus, according to the method 410 of FIG. 10, all of the fabrication processes may be performed sequentially over the same support structure 110.

As shown in FIG. 11, the method 420 may include a process 422 that is substantially the same as the process 412, and may further include a process 424 that is substantially the same as the process 414. However, after that, the method 420 starts to differ from the method 410. In particular, according to the method 420, the top memory array may be provided on a different support structure from that over which the bottom memory array was formed in the process 424, as shown with a process 426 of the method 420. The method 420 may further include a process 428 in which a face-to-face bonding is performed between the IC structure resulting from the process 426 and the IC structure resulting from the process 424 so that one or more bilayer stacking lines according to any of the embodiments described herein are shared between the memory arrays provided in the processes 424 and 426. To that end, in some embodiments, the process 428 may include flipping the IC structure resulting from the process 426 upside down and bonding it, face down, to the face of the IC structure resulting from the process 424 so that the one or more lines to be shared by the memory arrays of these two IC structures can be coupled accordingly. After the bonding, some or all of the second support structure (i.e., the one used in the process 426) may be removed, e.g., by grinding. Alternatively, in some embodiments, the process 428 may include flipping the IC structure resulting from the process 424 upside down and bonding it, face down, to the face of the IC structure resulting from the process 426 so that the one or more lines to be shared by the memory arrays of these two IC structures can be coupled accordingly. After the bonding, some or all of the first support structure (i.e., the one used in the process 424) may be removed, e.g., by grinding. In various embodiments, bonding performed in the process 428 may be oxide-oxide bonding, where an insulating material of the IC structure resulting from the process 424 is bonded to an insulating material of the IC structure resulting from the process 426. In some embodiments, a bonding material may be present in between at least portions of the faces of the IC structures resulting from the processes 424, 426. To that end, the bonding material may be applied to at least portions of the one or both faces of the IC structures resulting from the processes 424, 426 that should be bonded and then the IC structures are put together, possibly while applying a suitable pressure and heating up the assembly to a suitable temperature (e.g., to moderately high temperatures, e.g., between about 50 and 200 degrees Celsius) for a duration of time. In some embodiments, the bonding material used in the process 428 may be an adhesive material that ensures attachment of the IC structures resulting from the processes 424, 426 to one another. In some embodiments, the bonding material used in the process 428 may be an etch-stop material. In some embodiments, the bonding material may be both an ES material and have suitable adhesive properties to ensure attachment of the IC structures resulting from the processes 424, 426 to one another. In some embodiments, a bonding interface resulting from the bonding of the the IC structures resulting from the processes 424, 426 to one another may be recognizable in the final IC device as a seam or a thin layer, using, e.g., selective area diffraction (SED), even when the specific materials of the insulators of the IC structures resulting from the processes 424, 426 that are bonded together may be the same, in which case the bonding interface would still be noticeable as a seam or a thin layer in what otherwise appears as a bulk insulator (e.g., bulk oxide) layer.

Figure 12:
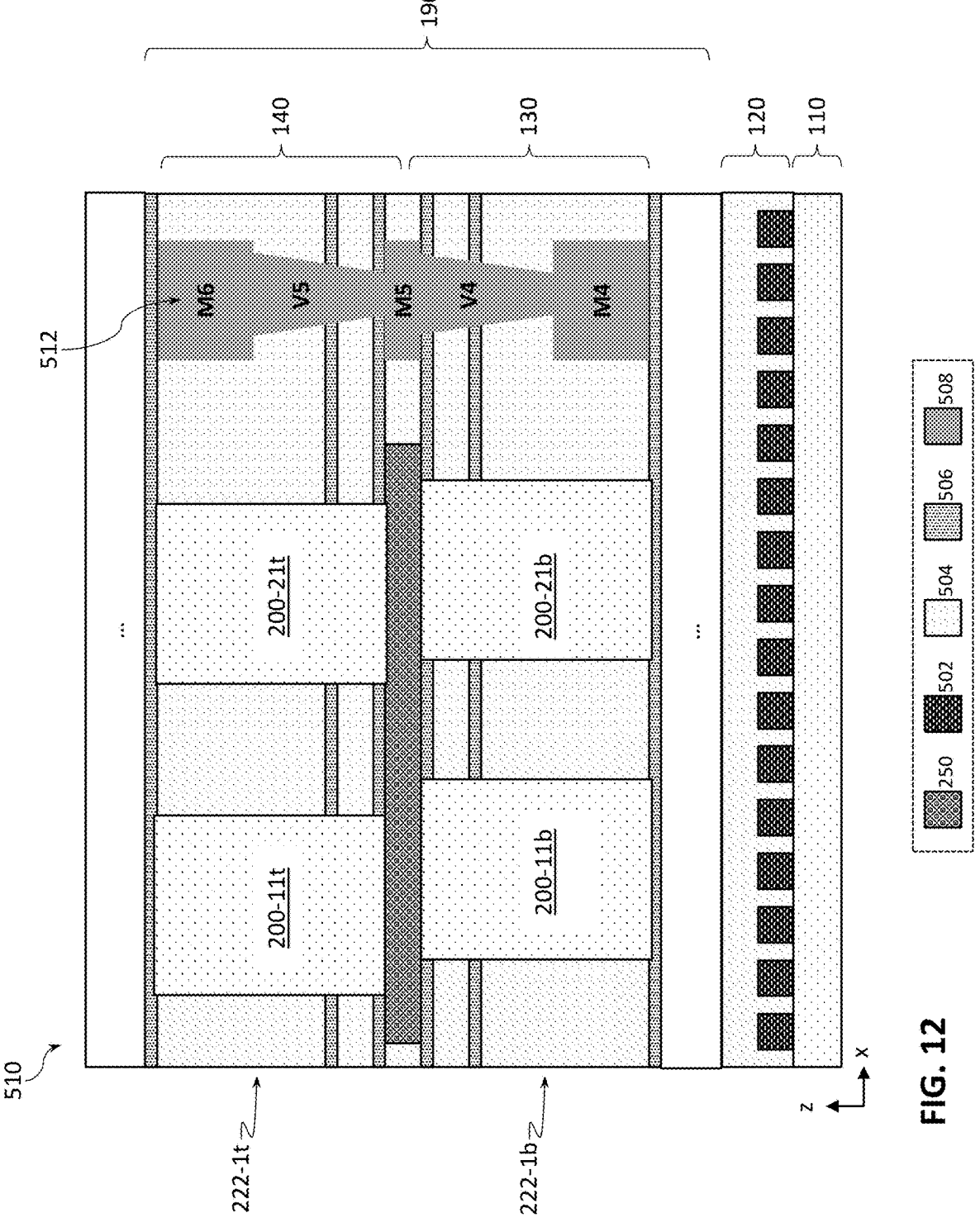
FIG. 12 provides a schematic illustration of a cross-sectional side view of a portion of an IC device implementing bilayer memory stacking with shared WLs, manufactured using monolithic integration, according to some embodiments of the present disclosure.
Figure 13:
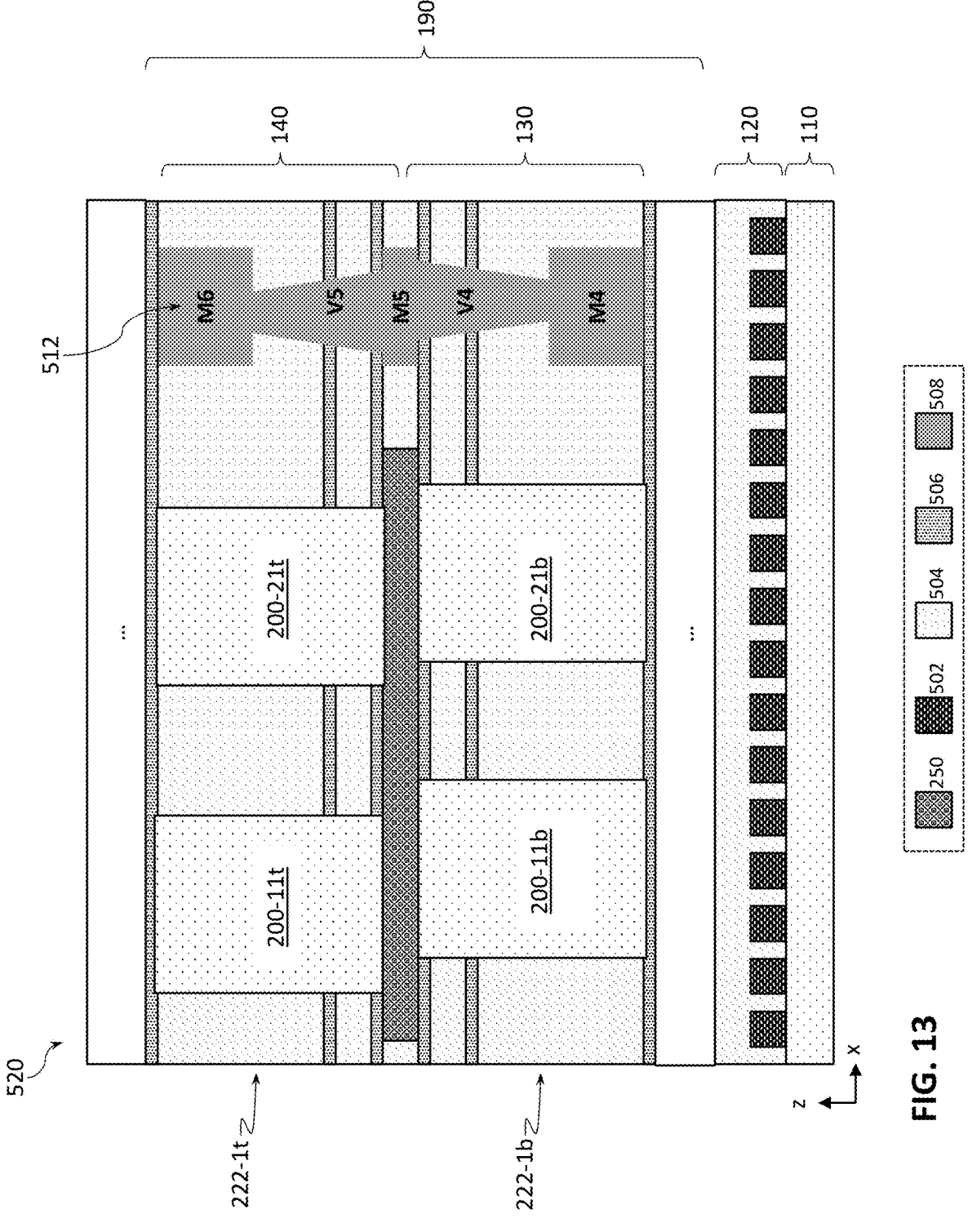
FIG. 13 provides a schematic illustration of a cross-sectional side view of a portion of an IC device implementing bilayer memory stacking with shared WLs, manufactured using bonding, according to some embodiments of the present disclosure.
Figure 14:
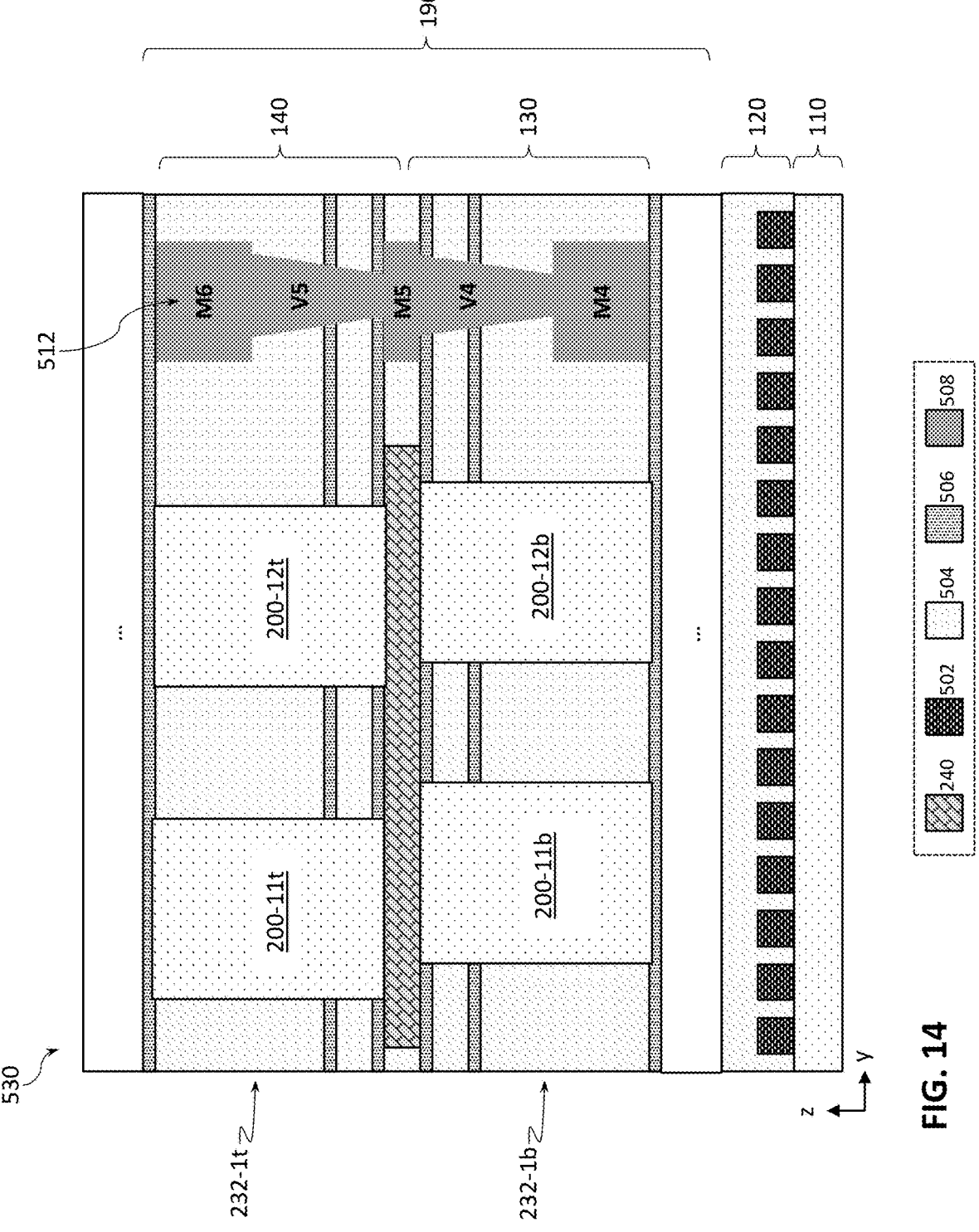
FIG. 14 provides a schematic illustration of a cross-sectional side view of a portion of an IC device implementing bilayer memory stacking with shared BLs, manufactured using monolithic integration, according to some embodiments of the present disclosure.
Figure 15:
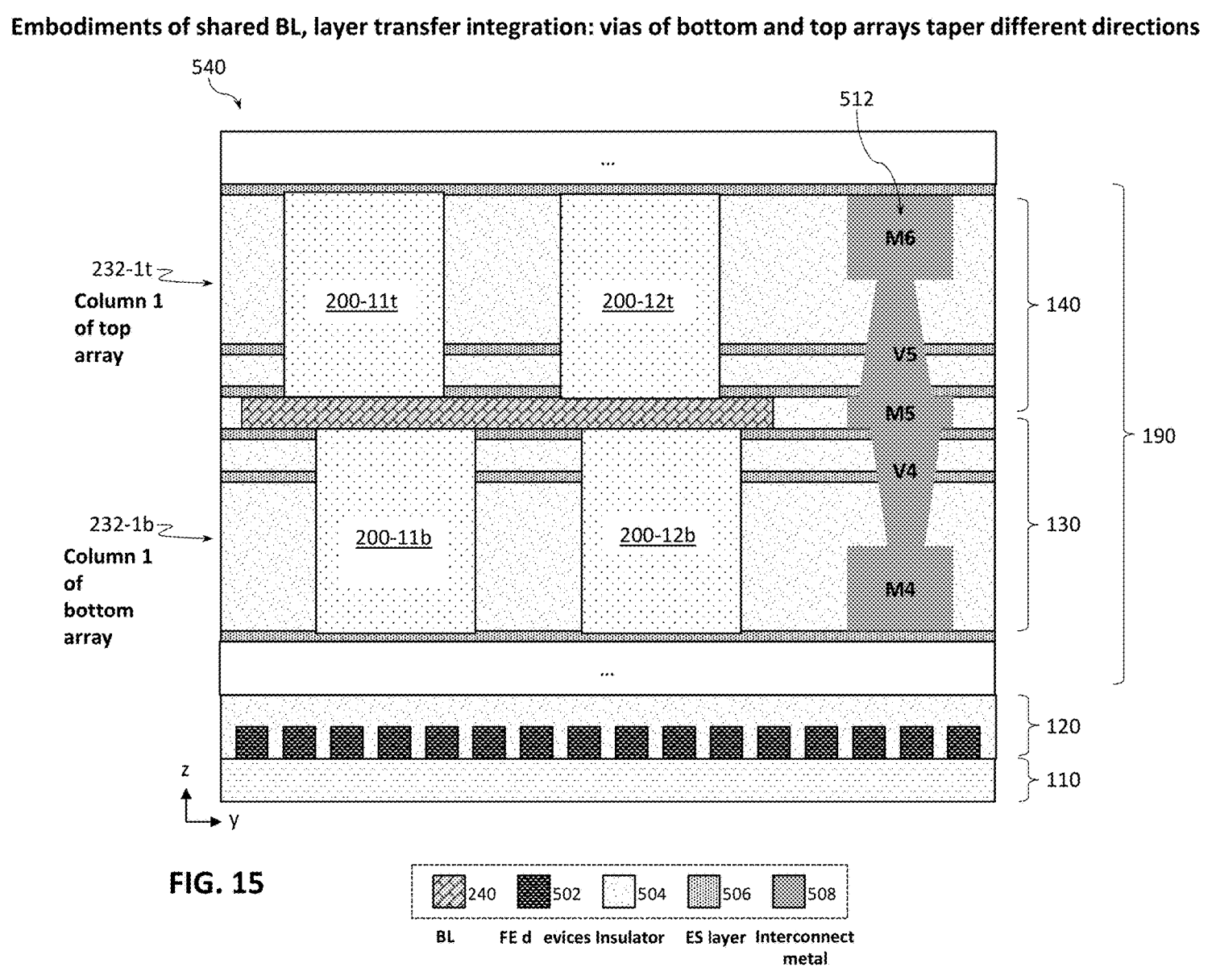

Schematic illustrations of example results of forming the IC device 100 using the method 410 are shown in FIGS. 12 and 14, while example results of forming the IC device 100 using the method 420 are shown in FIGS. 13 and 15. In particular, FIGS. 12 and 13 illustrate example results of fabricating the IC device 100 with WLs shared between the bottom and the top memory layers as described herein, while FIGS. 14 and 15 illustrate example results of fabricating the IC device 100 with BLs shared between the bottom and the top memory layers as described herein.

FIG. 12 illustrates an IC device 510, in which memory cells 200-11t and 200-21t of the first row 222-1t of the top memory array 290t, implemented in the second memory layer 140, and memory cells 200-11b and 200-21b of the first row 222-1b of the bottom memory array 290b, implemented in the first memory layer 130, are coupled to a single WL 250, as described herein (e.g., according to any of the embodiments described with reference to FIGS. 6 and 7). The IC device 510 is an example of the IC device 100, described herein, and, therefore, FIG. 12 also schematically illustrates the support structure 110 and the FEOL layer 120 that includes a plurality of frontend devices 502. FIG. 12 further illustrates that the IC device 510 may include an insulator 504 that may surround at least portions of the frontend devices 502 as well as portions of the memory cells 200 in the memory layers 130, 140. The insulator 504 may include any of the insulating materials described herein. FIG. 12 further illustrates that the IC device 510 may include layers of one or more ES materials 506 between various metal layers of the BEOL layer 190. The one or more ES materials 506 may include silicon in combination with one or more of nitrogen and carbon, possibly also in combination with oxygen (e.g., SiOCN). Finally, FIG. 12 further illustrates various interconnects 512 of one or more electrically conductive materials 508 provided in the BEOL layer 190. The one or more electrically conductive materials 508 may include any of the one or more electrically conductive materials described herein. As an example, the interconnects 512 of the IC device 510 are shown as metal lines M4, M5, and M6 and metal vias V4 and V5, provided in different metal layers.

The WL 250 of the IC device 510 may be considered to be provided at the interface between the first memory layer 130 and the second memory layer 140. Features characteristic of the fact that the IC device 510 is fabricated using the monolithic integration method 410 (FIG. 10) may be seen by analyzing the cross-sectional side shapes of the interconnects 512, especially of the vias. In particular, for certain manufacturing processes, cross-sectional shapes of various interconnects in the plane such as that shown in FIG. 12 may be trapezoidal, i.e., a cross-section of an interconnect may have two parallel sides, one of which is a short side and another one of which is a long side. For example, dual damascene or single damascene processes for manufacturing interconnects could result in such trapezoidal cross-sections. Therefore, examining the trapezoidal cross-sectional shapes of the interconnects 512, especially the vias of the interconnects 512, of the IC device 510 may reveal characteristic features of the fabrication method 410 as shown in FIG. 10. In particular, in the IC device 510, for both the first memory layer 130 and the second memory layer 140, the short sides of the trapezoidal cross-sections of the vias of the interconnects 512 may be closer to the support structure 110 than their long sides, or, phrased differently, the long sides of the trapezoidal cross-sections of the vias of the interconnects 512 may be closer to the front side of the IC device 510 (the front side being the side farthest away from the support structure 110) than their short sides.

FIG. 13 illustrates an IC device 520 that is substantially similar to the IC device 510, except that it was manufactured using the bonding method 420 (FIG. 11). Examining the trapezoidal cross-sectional shapes of the interconnects 512, especially the vias of the interconnects 512, of the IC device 520 may reveal characteristic features of the fabrication method 420 as shown in FIG. 11. In particular, in the IC device 520, for the first memory layer 130, the short sides of the trapezoidal cross-sections of the vias of the interconnects 512 may be closer to the support structure 110 than their long sides, while, for the second memory layer 140, the long sides of the trapezoidal cross-sections of the vias of the interconnects 512 may be closer to the support structure 110 than their short sides. This is a result of the IC structure with the second memory layer 140 provided by face-to-face bonding, in the process 428 of the method 420, with the IC structure with the first memory layer 130. Phrased differently, for the first memory layer 130 of the IC device 520, the long sides of the trapezoidal cross-sections of the vias of the interconnects 512 may be closer to the front side of the IC device 520 than their short sides, while, for the second memory layer 140 of the IC device 520, the short sides of the trapezoidal cross-sections of the vias of the interconnects 512 may be closer to the front side of the IC device 520 than their long sides.

FIG. 14 illustrates an IC device 530 that is substantially similar to the IC device 510, manufactured using the monolithic integration method 410 (FIG. 10), except that it illustrates an embodiment in which memory cells 200-11t and 200-12t of the first column 232-1t of the top memory array 290t, implemented in the second memory layer 140, and memory cells 200-11b and 200-12b of the first column 232-1b of the bottom memory array 290b, implemented in the first memory layer 130, are coupled to a single BL 240, as described herein (e.g., according to any of the embodiments described with reference to FIGS. 8 and 9).

FIG. 15 illustrates an IC device 540 that is substantially similar to the IC device 520, manufactured using the bonding method 420 (FIG. 11), except that it illustrates an embodiment in which memory cells 200-11t and 200-12t of the first column 232-1t of the top memory array 290t, implemented in the second memory layer 140, and memory cells 200-11b and 200-12b of the first column 232-1b of the bottom memory array 290b, implemented in the first memory layer 130, are coupled to a single BL 240, as described herein (e.g., according to any of the embodiments described with reference to FIGS. 8 and 9).

Example Cross-Sectional Side Views

Figure 16A:
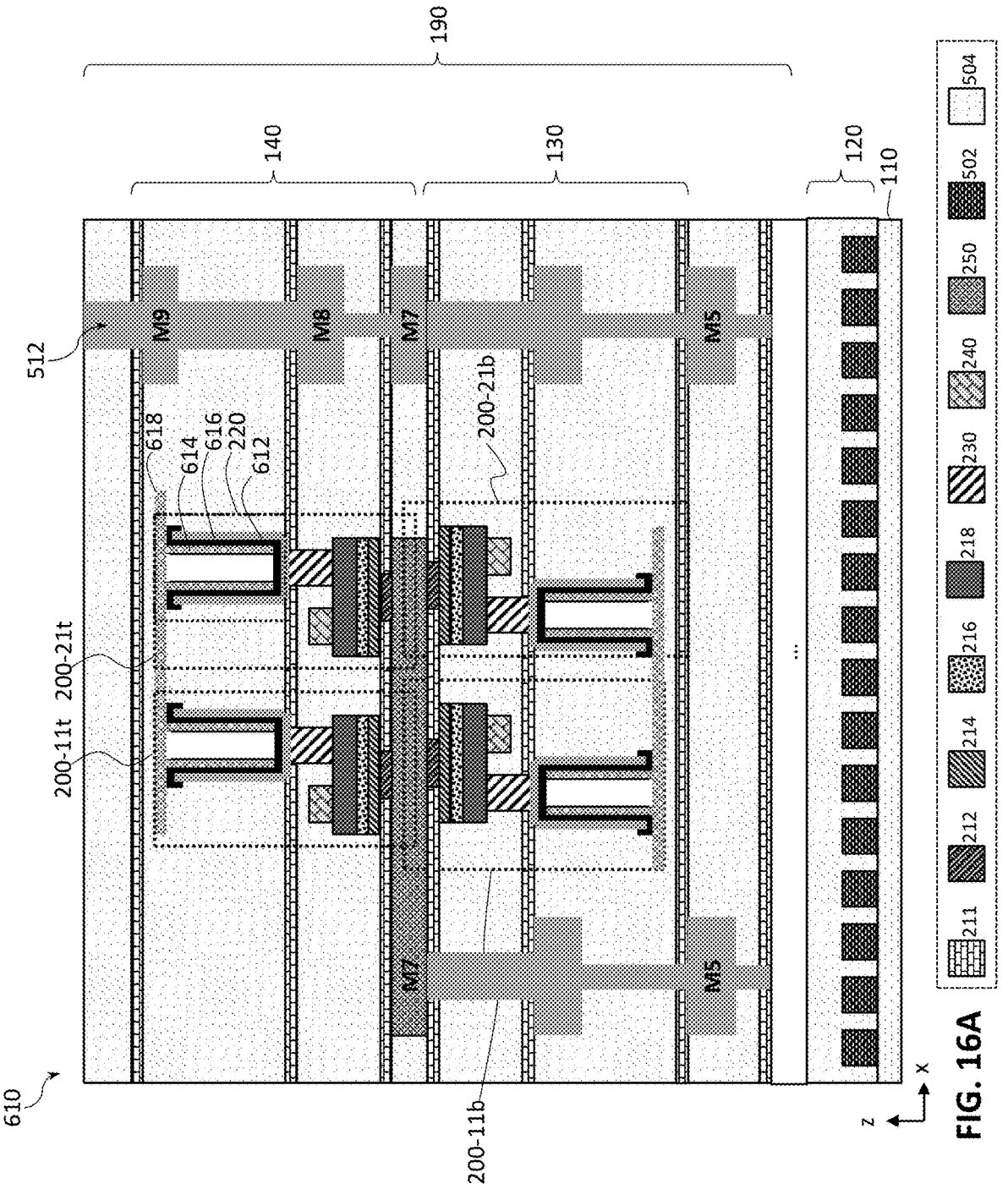
FIGS. 16A-16B provide example cross-sectional side views a portion of an IC device implementing bilayer memory stacking with a WL shared between bottom and top memory layers, according to some embodiments of the present disclosure.
Figure 16B:
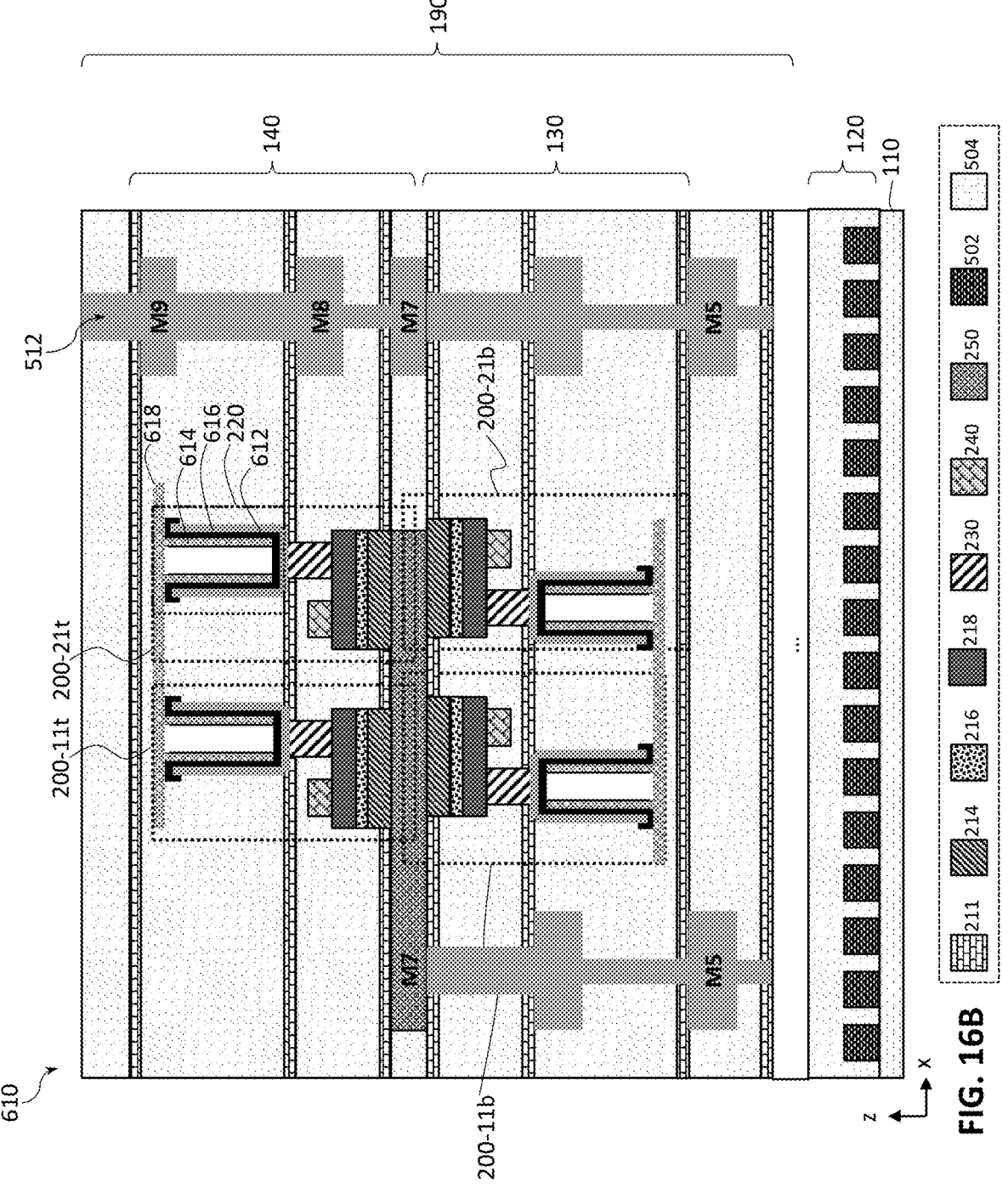

FIGS. 16A-16B provide example cross-sectional side views of a portion of an IC device 610 implementing bilayer memory stacking with a WL shared between bottom and top memory layers, according to some embodiments of the present disclosure.

FIG. 16A illustrates an IC device 610, in which memory cells 200-11t and 200-21t of the first row 222-1t of the top memory array 290t as described herein, implemented in the second memory layer 140, and memory cells 200-11b and 200-21b of the first row 222-1b of the bottom memory array 290b as described herein, implemented in the first memory layer 130, are coupled to a single WL 250 according to any embodiments of shared WL as described herein (e.g., according to any of the embodiments described with reference to FIGS. 6, 7, 12, and 13). The IC device 610 is an example of the IC device 100, described herein, and, therefore, FIG. 16A also schematically illustrates the support structure 110, the FEOL layer 120, and the BEOL 190 that includes the memory layers 130, 140. Furthermore, the IC device 610 further illustrates the etch-stop layer 211, the diffusion barrier 212, the gate electrode 214, the gate dielectric 216, the channel material 218, the storage nodes 230, and the BLs 240, as well as a plurality of frontend devices 502 in the FEOL layer 120 and the insulator 504, as described above.

FIG. 16A further illustrates details of the capacitors 220 of the different memory cells 200. In particular, as shown in FIG. 16A, in some embodiments, the capacitor 220 of each of the memory cells 200 may be a MIM capacitor having a first, or bottom, electrode 612 and a second, or top electrode 614, the two electrodes separated by a capacitor insulator 616 (the capacitor insulator 616 shown in FIG. 16A in black). The top electrodes 614 of the different memory cells 200 may be connected/coupled to a top plate 618, e.g., a common PL as described above.

As shown in FIG. 16A, in the IC device 610, the memory cells 200 of the first memory layer 130 may be oriented upside down with respect to the memory cells 200 of the second memory layers 140. In particular, in the IC device 610, the memory cells 200 of the first memory layer 130 include top-gated access transistors (which is seen in FIG. 16A illustrating that the shared WL 250 coupled to the gates of the access transistors of the memory cells 200 of the first memory layer 130 is above the channel material 218 of these memory cells), while the memory cells 200 of the second memory layer 140 include bottom-gated access transistors (since they are oriented upside down with respect to the memory cells 200 of the first memory layers 130, which is seen in FIG. 16A illustrating that the shared WL 250 coupled to the gates of the access transistors of the memory cells 200 of the second memory layer 140 is below the channel material 218 of the memory cells 200 of the second memory layer 140. Furthermore, the IC device 610 illustrates the embodiment where, for all of the memory cells 200, both S/D contacts are provided on one side of the channel material 218, opposite the side where the gates are provided. Thus, for the IC device 610, the capacitors 220 of the memory cells 200 of the first memory layer 130 are between the support structure 110 and the channel material 218 of the access transistors 210 of the memory cells 200 of the first memory layer 130, and the channel material 218 of the access transistors 210 of the memory cells 200 of the second memory layer 140 is between the shared WL 250 and the capacitors 220 of the memory cells 200 of the second memory layer 140.

FIG. 16A illustrates an embodiment of the IC device 610 where the etch-stop layer 211, the diffusion barrier 212, the gate electrode 214, the gate dielectric 216, and the channel material 218 are arranged as shown in FIG. 4. In such an embodiment, the memory cells 200 of the first memory layer 130 may be electrically coupled to a first face of the shared WL 250 (i.e., the bottom face of the WL 250, the one closer to the support structure 110) by having the channel material 218 of the access transistors 210 of these memory cells being in contact with the gate dielectric 216, by having the gate dielectric 216 being in contact with the gate electrode 214, by having the gate electrode 214 being in contact with the diffusion barrier 212, and by having the diffusion barrier 212 being in contact with the first face of the WL 250. Furthermore, the memory cells 200 of the second memory layer 140 may be electrically coupled to the second face of the WL 250 by having the channel material 218 of the access transistors 210 of these memory cells being in contact with the respective gate dielectric 216, by having the gate dielectric 216 being in contact with the respective gate electrode 214, by having the gate electrode 214 being in contact with the respective diffusion barrier 212, and by having the diffusion barrier 212 being in contact with the second face of the WL 250.

On the other hand, FIG. 16B illustrates an embodiment of the IC device 610 without the diffusion barrier 212. In such an embodiment, the memory cells 200 of the first memory layer 130 may be electrically coupled to the first face of the shared WL 250 (i.e., the bottom face of the WL 250) by having the channel material 218 of the access transistors 210 of these memory cells being in contact with the gate dielectric 216, by having the gate dielectric 216 being in contact with the gate electrode 214, and by having the gate electrode 214 being in contact with the first face of the WL 250. Furthermore, the memory cells 200 of the second memory layer 140 may be electrically coupled to the second face of the WL 250 by having the channel material 218 of the access transistors 210 of these memory cells being in contact with the respective gate dielectric 216, by having the gate dielectric 216 being in contact with the respective gate electrode 214, and by having the gate electrode 214 being in contact with the second face of the WL 250.

Figure 17A:
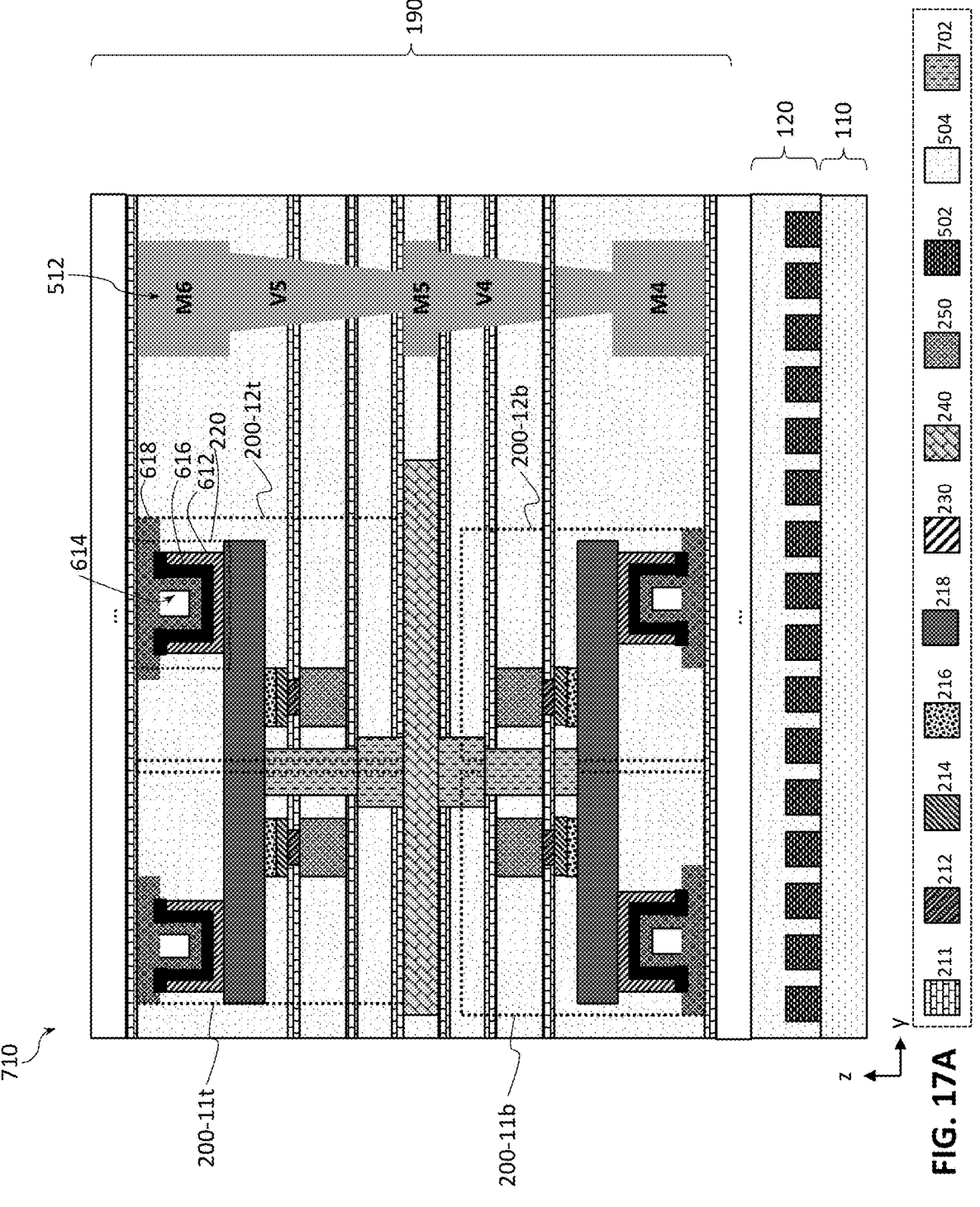
FIGS. 17A-17B provide example cross-sectional side views of a portion of an IC device implementing bilayer memory stacking with a BL shared between bottom and top memory layers, according to some embodiments of the present disclosure.
Figure 17B:
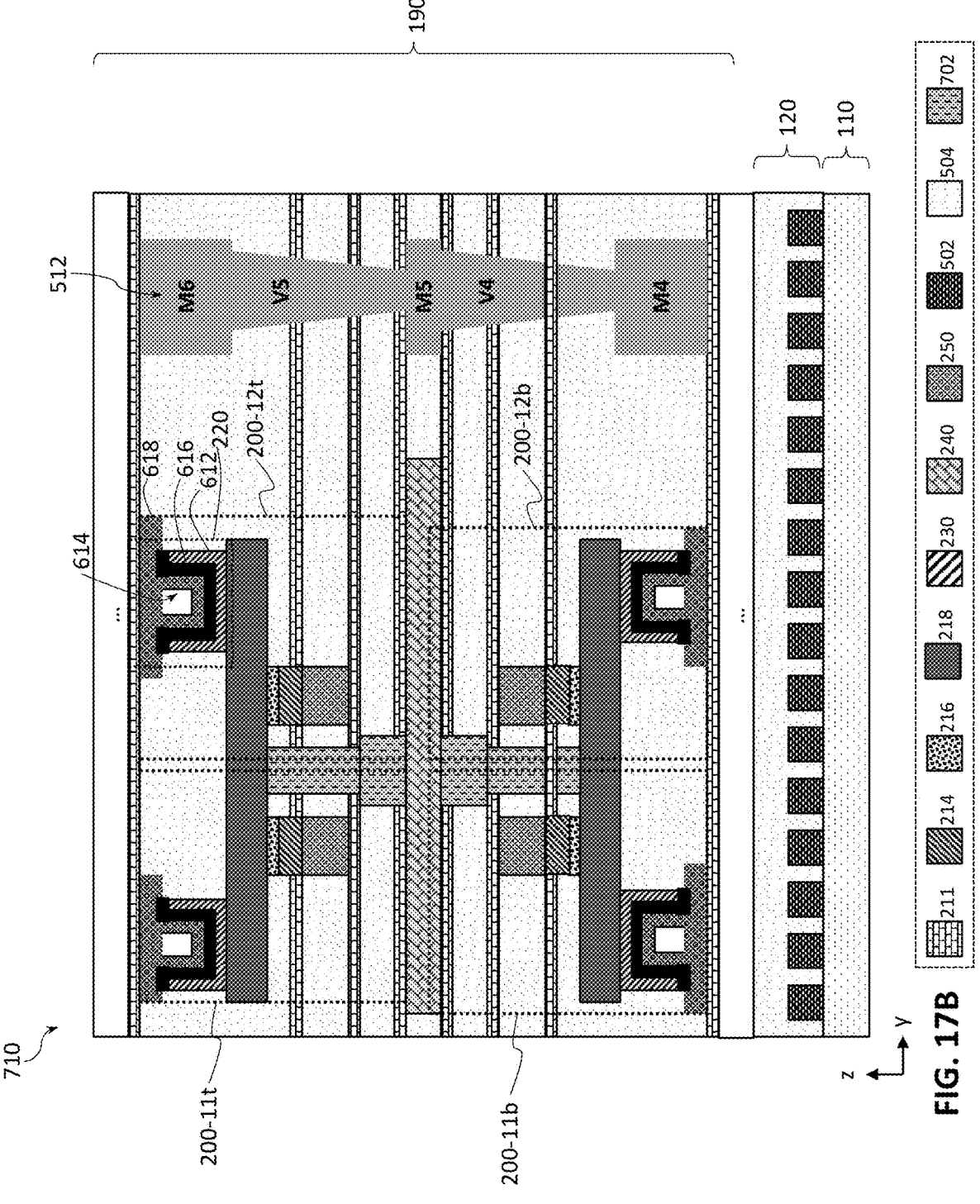

FIGS. 17A-17B provide example cross-sectional side views of a portion of an IC device 710 implementing bilayer memory stacking with a BL shared between bottom and top memory layers, according to some embodiments of the present disclosure.

FIG. 17A illustrates an IC device 710, in which memory cells 200-11$t$ and 200-12$t$ of the first column 232-1$t$ of the top memory array 290$t$ as described herein, implemented in the second memory layer 140, and memory cells 200-11$b$ and 200-12$b$ of the first column 232-1$b$ of the bottom memory array 290$b$ as described herein, implemented in the first memory layer 130, are coupled to a single BL 240 according to any embodiments of shared WL as described herein (e.g., according to any of the embodiments described with reference to FIGS. 8, 9, 14, and 15). The IC device 710 is an example of the IC device 100, described herein, and, therefore, FIG. 17A also schematically illustrates the support structure 110, the FEOL layer 120, and the BEOL 190 that includes the memory layers 130, 140. Furthermore, the IC device 710 further illustrates the etch-stop layer 211, the diffusion barrier 212, the gate electrode 214, the gate dielectric 216, the channel material 218, the storage nodes 230, and the WLs 250, as well as a plurality of frontend devices 502 in the FEOL layer 120, the insulator 504, and the ES layer 506, as described above. FIG. 17A further illustrates details of the capacitors 220 of the different memory cells 200, similar to how they were shown for FIG. 16.

As shown in FIG. 17A, in the IC device 710, the memory cells 200 of the first memory layer 130 may be oriented upside down with respect to the memory cells 200 of the second memory layers 140. In particular, in the IC device 710, the memory cells 200 of the first memory layer 130 include top-gated access transistors (which is seen in FIG. 17A illustrating that the respective WLs 250 coupled to the gates of the access transistors of the memory cells 200 of the first memory layer 130 are above the channel material 218 of these memory cells), while the memory cells 200 of the second memory layer 140 include bottom-gated access transistors (since they are oriented upside down with respect to the memory cells 200 of the first memory layers 130, which is seen in FIG. 17A illustrating that the respective WLs 250 coupled to the gates of the access transistors of the memory cells 200 of the second memory layer 140 are below the channel material 218 of the memory cells 200 of the second memory layer 140. Furthermore, the IC device 710 illustrates the embodiment where, for all of the memory cells 200, one of the S/D contacts is provided on one side of the channel material 218 (e.g., on the same side where the gates are provided) and another one of the S/D contacts is provided on the opposite side of the channel material 218 (e.g., on the opposite side compared to where the gates are provided). Thus, for the IC device 710, the first S/D regions of the access transistors 210 of the memory cells 200 of the first memory layer 130 are electrically coupled to (e.g., through one or more electrically conductive vias 702, shown in FIG. 17A) the first face of the shared BL 240. Furthermore, for the IC device 710, the first S/D regions of the access transistors 210 of the memory cells 200 of the first memory layer 130 are between the shared BL 240 and the support structure 110. On the other hand, the first S/D regions of the access transistors 210 of the memory cells 200 of the second memory layer 140 are electrically coupled to (e.g., through one or more electrically conductive vias 702, shown in FIG. 17A) the second face of the shared BL 240, opposite the first face (i.e., the top face). Furthermore, for the IC device 710, the shared BL 240 is between the first S/D regions of the access transistors 210 of the memory cells 200 of the first memory layer 130 and the first S/D regions of the access transistors 210 of the memory cells 200 of the second memory layer 140.

FIG. 17A illustrates an embodiment of the IC device 710 where the diffusion barrier 212 is provided between the gate stack of the access transistors 210 and the respective WLs 250, similar to how it was described with reference to FIG. 16A. On the other hand, FIG. 17B illustrates an embodiment of the IC device 710 that is substantially the same as that of FIG. 17A, but without the diffusion barrier 212, similar to how it was described with reference to FIG. 16B.

Example Electronic Devices

IC devices implementing bilayer stacking with lines shared between bottom and top memory layers as disclosed herein may be included in any suitable electronic device. FIGS. 18-21 illustrate various examples of devices and components that may include one or more IC devices implementing bilayer stacking with lines shared between bottom and top memory layers according to any embodiments disclosed herein.

Figures 18A, 18B:
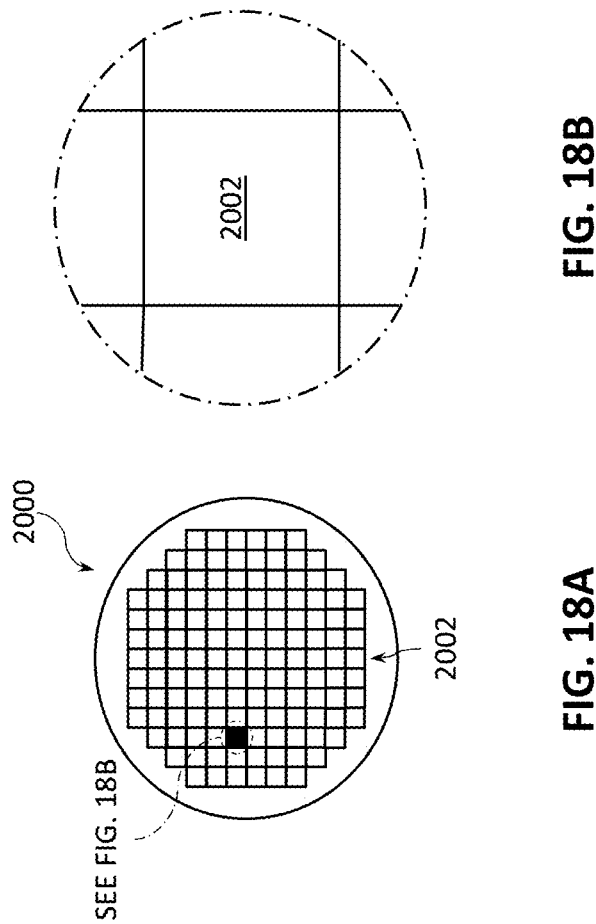
FIGS. 18A-18B are top views of a wafer and dies that include one or more pairs of memory arrays stacked using bilayer stacking with lines shared between bottom and top memory layers, according to some embodiments of the present disclosure.

FIGS. 18A-18B are top views of a wafer 2000 and dies 2002 that may include one or more pairs of memory arrays stacked using bilayer stacking with lines shared between bottom and top memory layers in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 20. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more pairs of memory arrays stacked using bilayer stacking with lines shared between bottom and top memory layers as described herein). After the fabrication of the semiconductor product is complete (e.g., after manufacture of one or more IC devices implementing bilayer stacking with lines shared between bottom and top memory layers as described herein, e.g., according to any embodiment of the stacked memory array of the BEOL layer 190 of the IC device 100), the wafer 2000 may undergo a singulation process in which each of the dies 2002 is separated from one another to provide discrete "chips" of the semiconductor product. In particular, IC devices that include one or more pairs of memory arrays stacked using bilayer stacking with lines shared between bottom and top memory layers as disclosed herein may take the form of the wafer 2000 (e.g., not singulated) or the form of the die 2002 (e.g., singulated). The die 2002 may include one or more transistors (e.g., one or more selector transistors for the stacked memory array of the BEOL layer 190 as described herein and/or one or more FEOL transistors as described herein, e.g., one or more FEOL transistors 2140 of FIG. 19, discussed below), one or more storage elements (e.g., one or more storage elements such as capacitors for the stacked memory array of the BEOL layer 190 as described herein), and/or supporting circuitry to route electrical signals to the transistors and/or the storage elements, as well as any other IC components. In some embodiments, the wafer 2000 or the die 2002 may implement or include a memory device (e.g., a DRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 22) or other logic that is configured to store information in the memory devices or execute instructions stored in the memory array.

Figure 19:
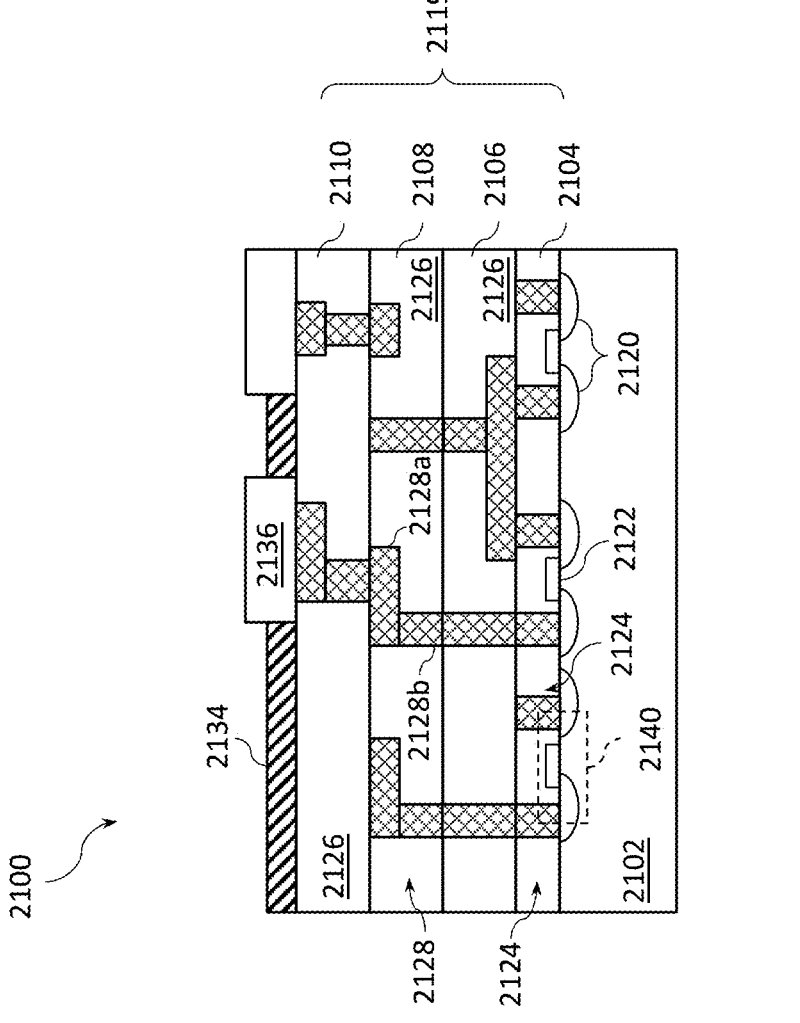
FIG. 19 is a cross-sectional side view of an IC device that may include one or more pairs of memory arrays stacked using bilayer stacking with lines shared between bottom and top memory layers, according to some embodiments of the present disclosure.

FIG. 19 is a cross-sectional side view of an IC device 2100 that may include one or more pairs of memory arrays stacked using bilayer stacking with lines shared between bottom and top memory layers in accordance with any of the embodiments disclosed herein. For example, the IC device 2100 may be, or may include, the IC device 100, described above, implementing one or more stacked memory arrays 190, one or more of which could include pairs of memory arrays stacked using bilayer stacking with lines shared between bottom and top memory layers according to any embodiments described herein. In particular, the one or more pairs of memory arrays stacked using bilayer stacking with lines shared between bottom and top memory layers as described herein may be implemented in any of the BEOL layers of the IC device 2100, e.g., in any of the interconnect layers 2106-2110 shown in FIG. 19. Because there are various possibilities where such pairs of memory arrays stacked using bilayer stacking with lines shared between bottom and top memory layers may be integrated in the IC device 2100, the pairs of memory arrays stacked using bilayer stacking with lines shared between bottom and top memory layers are not specifically shown in FIG. 19. In some embodiments, the IC device 2100 may serve as any of the dies 2256 in the IC package 2300.

As shown in FIG. 19, the IC device 2100 may be formed on a substrate 2102 (e.g., the wafer 2000 of FIG. 18A) and may be included in a die (e.g., the die 2002 of FIG. 18B). The substrate 2102 may include any material that may serve as a foundation for an IC device 2100. The substrate 2102 may be a semiconductor substrate, and may be implemented as described above with reference to the support structure 110 shown in FIG. 1. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 18B) or a wafer (e.g., the wafer 2000 of FIG. 18A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 216. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 214.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 19 and may include a wide variety of other types and configurations such as, for example, planar transistors, non-planar transistors (e.g., FinFETs, nanowire, or nanoribbon transistors), or a combination of both.

Electrical signals, such as power and/or input/output (I/O) signals, may be routed to and/or from the transistors 2140 of the device layer 2104 through one or more interconnect layers disposed on the device layer 2104 (illustrated in FIG. 19 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 19). Although a particular number of interconnect layers 2106-1210 is depicted in FIG. 19, embodiments of the present disclosure include IC devices having more or fewer interconnect layers than depicted.

In some embodiments, the interconnect structures 2128 may include trench structures 2128*a* (sometimes referred to as "lines") and/or via structures 2128*b* (sometimes referred to as "holes") filled with an electrically conductive material such as a metal. The trench structures 2128*a* may be arranged to route electrical signals in a direction of a plane that is substantially parallel with a surface of the substrate 2102 upon which the device layer 2104 is formed. For example, the trench structures 2128*a* may route electrical signals in a direction in and out of the page from the perspective of FIG. 19. The via structures 2128*b* may be arranged to route electrical signals in a direction of a plane that is substantially perpendicular to the surface of the substrate 2102 upon which the device layer 2104 is formed. In some embodiments, the via structures 2128*b* may electrically couple trench structures 2128*a* of different interconnect layers 2106-2110 together.

The interconnect layers 2106-2110 may include a dielectric material 2126 disposed between the interconnect structures 2128, as shown in FIG. 19. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the materials described above with reference to the insulator 504.

A first interconnect layer 2106 (referred to as Metal 1 or "M1") may be formed directly on the device layer 2104. In some embodiments, the first interconnect layer 2106 may include trench structures 2128*a* and/or via structures 2128*b*, as shown. The trench structures 2128*a* of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128*b* to couple the trench structures 2128*a* of the second interconnect layer 2108 with the trench structures 2128*a* of the first interconnect layer 2106. Although the trench structures 2128*a* and the via structures 2128*b* are structurally delineated with a line within each interconnect layer (e.g., within the second interconnect layer 2108) for the sake of clarity, the trench structures 2128*a* and the via structures 2128*b* may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above and shown some of the drawings described above. Further metal layers may be present in the IC device 2100, as also described above.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 20:
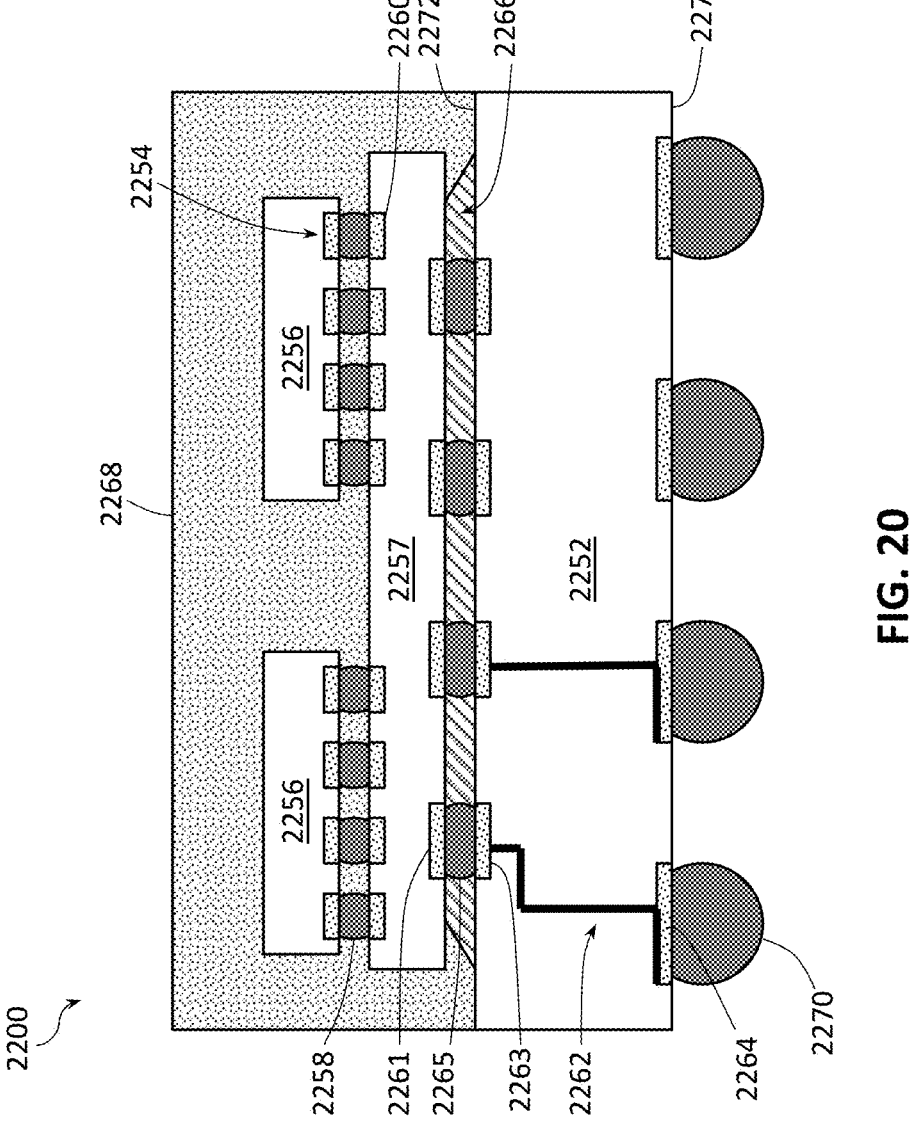
FIG. 20 is a cross-sectional side view of an IC package that may include one or more IC devices implementing bilayer stacking with lines shared between bottom and top memory layers, according to some embodiments of the present disclosure.

FIG. 20 is a side, cross-sectional view of an example IC package 2200 that may include one or more IC devices implementing bilayer stacking with lines shared between bottom and top memory layers in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 19.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 20 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 20 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 20 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 21.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies implementing bilayer stacking with lines shared between bottom and top memory layers as described herein. In some embodiments, any of the dies 2256 may include one or more IC devices implementing bilayer stacking with lines shared between bottom and top memory layers, e.g., as discussed above; in some embodiments, at least some of the dies 2256 may not include any IC devices implementing bilayer stacking with lines shared between bottom and top memory layers.

The IC package 2200 illustrated in FIG. 20 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 20, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 21:
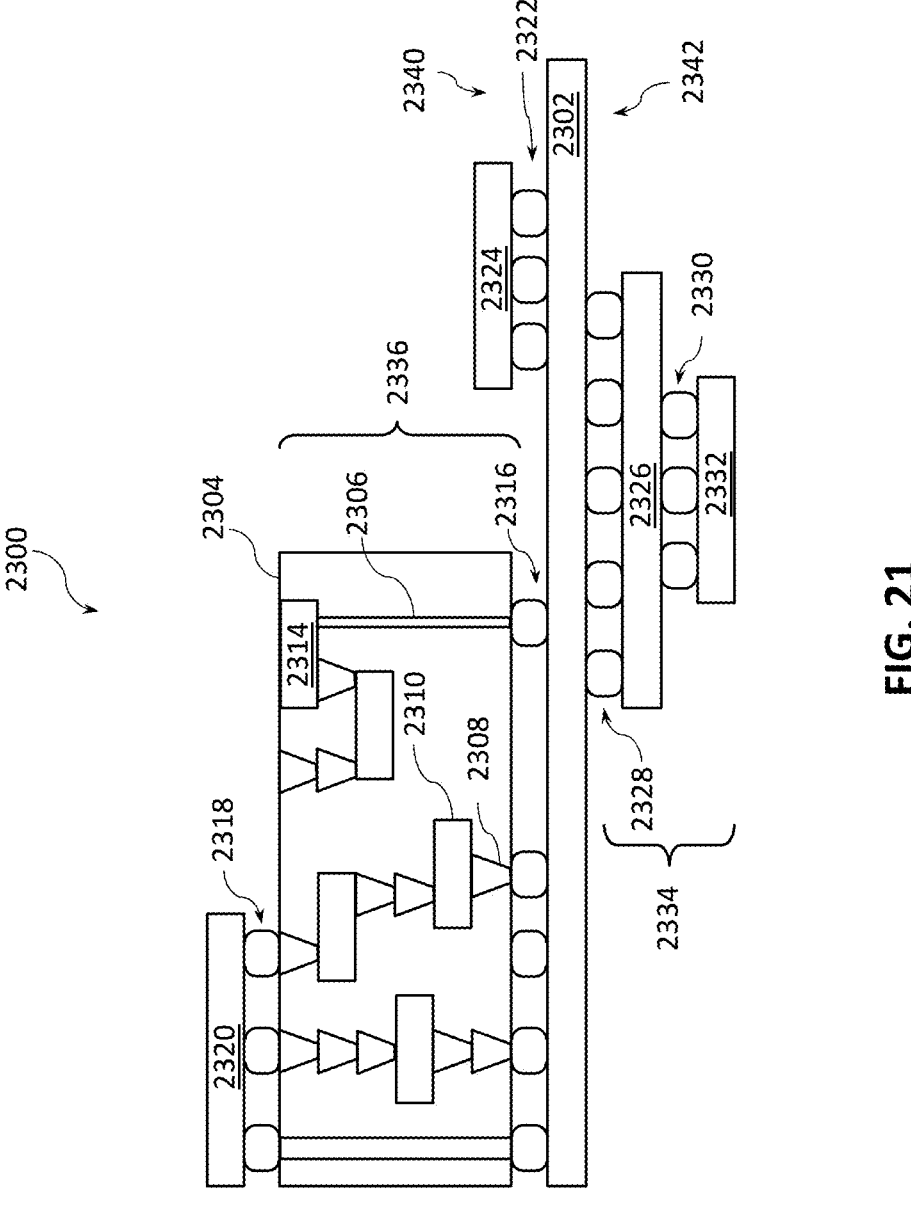
FIG. 21 is a cross-sectional side view of an IC device assembly that may include one or more IC devices implementing bilayer stacking with lines shared between bottom and top memory layers, according to some embodiments of the present disclosure.

FIG. 21 is a cross-sectional side view of an IC device assembly 2300 that may include components having one or more IC devices implementing bilayer stacking with lines shared between bottom and top memory layers in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices implementing bilayer stacking with lines shared between bottom and top memory layers in accordance with any of the embodiments disclosed herein; e.g., any of the IC packages discussed below with reference to the IC device assembly 2300 may take the form of any of the embodiments of the IC package 2200 discussed above with reference to FIG. 20 (e.g., may include one or more IC devices implementing bilayer stacking with lines shared between bottom and top memory layers provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 21 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 21), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 18B), an IC device (e.g., the IC device 2100 of FIG. 19), or any other suitable component. In particular, the IC package 2320 may include one or more IC devices implementing bilayer stacking with lines shared between bottom and top memory layers as described herein. Although a single IC package 2320 is shown in FIG. 21, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 21, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 21 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 22:
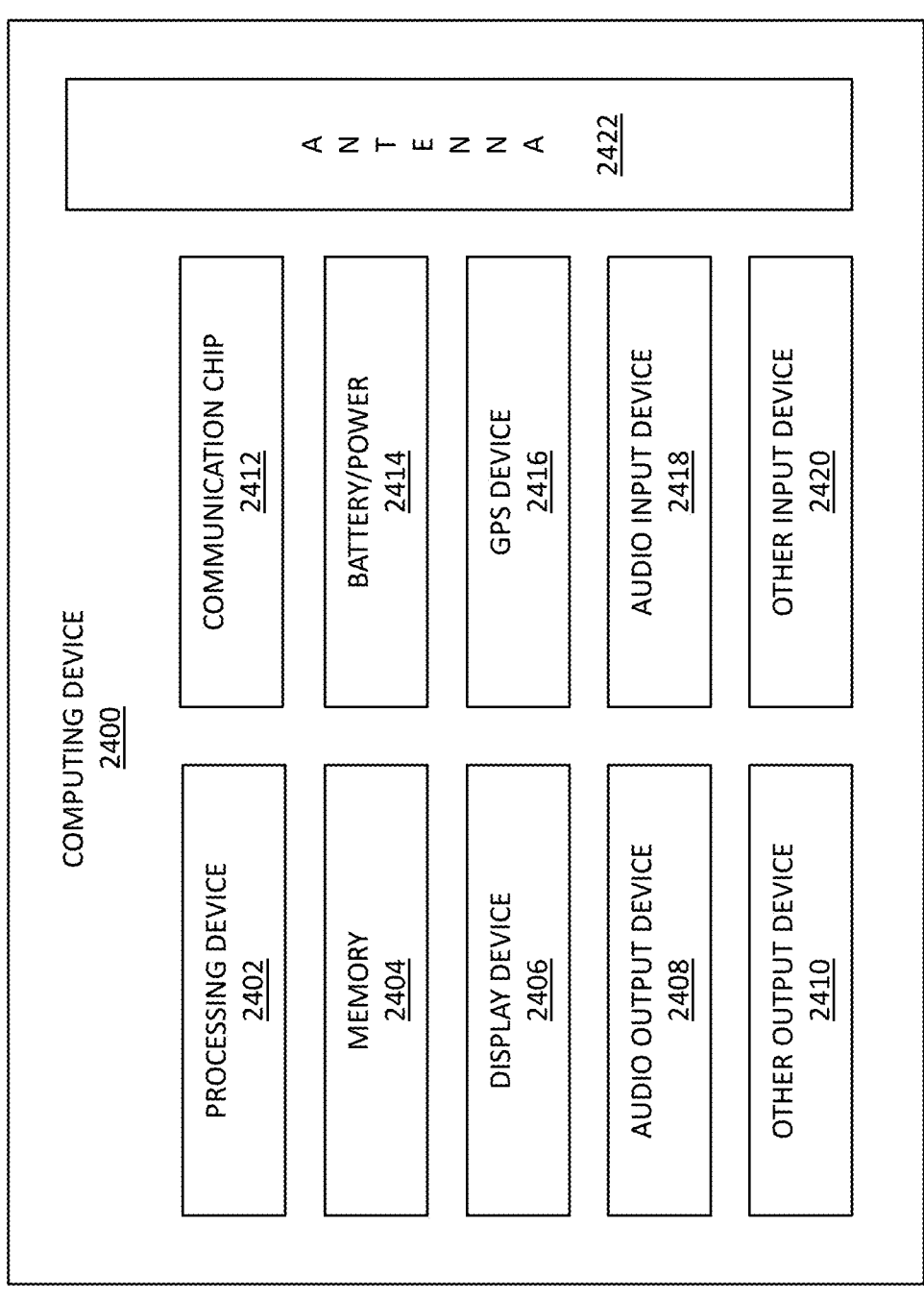
FIG. 22 is a block diagram of an example computing device that may include one or more IC devices implementing bilayer stacking with lines shared between bottom and top memory layers, according to some embodiments of the present disclosure.

FIG. 22 is a block diagram of an example computing device 2400 that may include one or more components with one or more IC devices implementing bilayer stacking with lines shared between bottom and top memory layers in accordance with any of the embodiments disclosed herein. For example, any suitable ones of the components of the computing device 2400 may include a die (e.g., the die 2002 (FIG. 18B)) including one or more IC devices implementing bilayer stacking with lines shared between bottom and top memory layers in accordance with any of the embodiments disclosed herein. Any of the components of the computing device 2400 may include an IC device 2100 (FIG. 19) and/or an IC package 2200 (FIG. 20). Any of the components of the computing device 2400 may include an IC device assembly 2300 (FIG. 21).

A number of components are illustrated in FIG. 22 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 22, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include eDRAM, e.g., a stacked TFT-based eDRAM as described herein, and/or spin-transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an IC device that includes a support structure (e.g., a substrate, a wafer, a die, or a chip); a first memory cell (a first eDRAM cell), provided in a first layer over the support structure; a line including an electrically conductive material, provided in a second layer over the support structure, where the first layer is between the second layer and the support structure; and a second memory cell (a second eDRAM cell), provided in a third layer over the support structure, where the second layer is between the first layer and the third layer, where the line includes a first face and a second face, the second face being opposite the first face and being further away from the support structure than the first face, the first memory cell is electrically coupled to the first face of the line, and the second memory cell is electrically coupled to the second face of the line.

Example 2 provides the IC device according to example 1, where each of the first memory cell and the second memory cell includes a TFT as a selector transistor of the memory cell and a storage element such as a storage capacitor, coupled to the TFT, and the second memory cell is oriented in the IC device upside down compared to the first memory cell.

Example 3 provides the IC device according to examples 1 or 2, where the line is a wordline for each of the first memory cell and the second memory cell (in particular, the line is the only wordline that is shared between the first memory cell and the second memory cell, so that there are no other lines between the first layer and the third layer that implement a wordline functionality for either the first memory cell or the second memory cell).

Example 4 provides the IC device according to example 3, where the line is an only wordline coupled to the first memory cell and the second memory cell.

Example 5 provides the IC device according to examples 3 or 4, where each of the first memory cell and the second memory cell includes a transistor including a channel material, a source region, and a drain region, the channel material of the transistor of the first memory cell is electrically coupled to (e.g., interfaces, possibly via a gate dielectric) the first face of the wordline (i.e., that is how the first memory cell is electrically coupled to the first face of the line) and is between the wordline and contacts to the source region and the drain region of the transistor of the first memory cell, the contacts to the source region and the drain region of the transistor of the first memory cell are between the channel material of the transistor of the first memory cell and the support structure, the channel material of the transistor of the second memory cell is electrically coupled to (e.g., interfaces, possibly via a gate dielectric) the second face of the wordline (i.e., that is how the second memory cell is electrically coupled to the second face of the line) and is between the wordline and contacts to the source region and the drain region of the transistor of the second memory cell, and the channel material of the transistor of the second memory cell is between the contacts to the source region and the drain region of the transistor of the second memory cell and the second face of the wordline.

Example 6 provides the IC device according to any one of examples 1-5, where each of the first memory cell and the second memory cell includes a transistor. In such an IC device, the first memory cell is electrically coupled to the first face of the line by having a channel material of the transistor of the first memory cell being in contact with a gate dielectric material of the transistor of the first memory cell, the gate dielectric material of the transistor of the first memory cell being in contact with a gate electrode material of the transistor of the first memory cell, and the gate electrode material of the transistor of the first memory cell being in contact with the first face of the line. Furthermore, the second memory cell is electrically coupled to the second face of the line by having a channel material of the transistor of the second memory cell being in contact with a gate dielectric material of the transistor of the second memory cell, the gate dielectric material of the transistor of the second memory cell being in contact with a gate electrode material of the transistor of the second memory cell, and the gate electrode material of the transistor of the second memory cell being in contact with the second face of the line. In such an IC device, the transistor of the first memory cell is a top-gated transistor and the transistor of the second memory cell is a bottom-gated transistor, because the second memory cell is arranged substantially upside down with respect to the first memory cell.

Example 7 provides the IC device according to any one of examples 1-5, where each of the first memory cell and the second memory cell includes a transistor. In such an IC device, the first memory cell is electrically coupled to the first face of the line by having a channel material of the transistor of the first memory cell being in contact with a gate dielectric material of the transistor of the first memory cell, the gate dielectric material of the transistor of the first memory cell being in contact with a gate electrode material of the transistor of the first memory cell, the gate electrode material of the transistor of the first memory cell being in contact with a diffusion barrier material of the transistor of the first memory cell, and the diffusion barrier material of the transistor of the first memory cell being in contact with the first face of the line. Furthermore, the second memory cell is electrically coupled to the second face of the line by having a channel material of the transistor of the second memory cell being in contact with a gate dielectric material of the transistor of the second memory cell, the gate dielectric material of the transistor of the second memory cell being in contact with a gate electrode material of the transistor of the second memory cell, the gate electrode material of the transistor of the second memory cell being in contact with a diffusion barrier material of the transistor of the second memory cell, and the diffusion barrier material of the transistor of the second memory cell being in contact with the second face of the line. In such an IC device, the transistor of the first memory cell is a top-gated transistor and the transistor of the second memory cell is a bottom-gated transistor, because the second memory cell is arranged substantially upside down with respect to the first memory cell.

Example 8 provides the IC device according to examples 6 or 7, where each of the first memory cell and the second memory cell further includes a storage element (e.g., a capacitor), the storage element of the first memory cell is between the support structure and the channel material of the transistor of the first memory cell, and the channel material of the transistor of the second memory cell is between the line and the storage element of the second memory cell.

Example 9 provides the IC device according to examples 1 or 2, where the line is a bitline for each of the first memory cell and the second memory cell (in particular, the line is the only bitline that is shared between the first memory cell and the second memory cell, so that there are no other lines between the first layer and the third layer that implement a bitline functionality for either the first memory cell or the second memory cell).

Example 10 provides the IC device according to example 9, where the line is an only bitline coupled to the first memory cell and the second memory cell.

Example 11 provides the IC device according to examples 9 or 10, where each of the first memory cell and the second memory cell includes a transistor including a source region and a drain region, a first one of the source region and the drain region of the transistor of the first memory cell is electrically coupled to (e.g., through one or more electrically conductive vias) the first face of the bitline (i.e., that is how the first memory cell is electrically coupled to the first face of the line) and is between the bitline and the support structure, and a first one of the source region and the drain region of the transistor of the second memory cell is electrically coupled to (e.g., through one or more electrically conductive vias) the second face of the bitline (i.e., that is how the second memory cell is electrically coupled to the second face of the line) and the bitline is between the first one of the source region and the drain region of the transistor of the first memory cell and the first one of the source region and the drain region of the transistor of the second memory cell.

Example 12 provides the IC device according to example 11, where each of the first memory cell and the second memory cell further includes a storage element (e.g., a capacitor), a second one of the source region and the drain region of the transistor of the first memory cell is electrically coupled to (e.g., is in contact with) the storage element of the first memory cell, and a second one of the source region and the drain region of the transistor of the second memory cell is electrically coupled to (e.g., is in contact with) the storage element of the second memory cell.

Example 13 provides the IC device according to example 12, where, for each of the first memory cell and the second memory cell, the transistor further includes a channel material, the channel material of the transistor of the first memory cell is between the storage element of the first memory cell and the bitline, the channel material of the transistor of the second memory cell is between the bitline and the storage element of the second memory cell, and the bitline is between the channel material of the transistor of the first memory cell and the channel material of the transistor of the second memory cell.

Example 14 provides the IC device according to example 13, where the IC device further includes a first wordline coupled to the first memory cell and a second wordline coupled to the second memory cell, the channel material of the transistor of the first memory cell is between the storage element of the first memory cell and the first wordline, and the channel material of the transistor of the second memory cell is between the second wordline and the storage element of the second memory cell.

Example 15 provides the IC device according to example 14, where the first wordline is coupled to the first memory cell by being coupled to (e.g., by interfacing, possibly via a gate dielectric) a portion of the channel material of the transistor of the first memory cell that is between the source region and the drain region of the transistor of the first memory cell, and the second wordline is coupled to the second memory cell by being coupled to (e.g., by interfacing, possibly via a gate dielectric) a portion of the channel material of the transistor of the second memory cell that is between the source region and the drain region of the transistor of the second memory cell.

Example 16 provides the IC device according to any one of the preceding examples, where the line is a first line, and the IC device further includes a second line including an electrically conductive material, provided in a fourth layer over the support structure, where the third layer is between the second layer and the fourth layer, and a third memory cell (a third eDRAM cell), provided in a fifth layer over the support structure, where the fourth layer is between the third layer and the fifth layer, where each of the second memory cell and the third memory cell is electrically coupled to the second line.

Example 17 provides an IC package that includes an IC device according to any one of the preceding examples; and a further IC component, coupled to the IC device. The IC device may include, for example, a support structure (e.g., a substrate, a wafer, a die, or a chip); a first memory cell (a first eDRAM cell), provided in a first layer over the support structure; a first line comprising an electrically conductive material, provided in a second layer over the support structure, where the first layer is between the second layer and the support structure; a second memory cell (a second eDRAM cell), provided in a third layer over the support structure, where the second layer is between the first layer and the third layer; a second line comprising an electrically conductive material, provided in a fourth layer over the support structure, where the third layer is between the second layer and the fourth layer; and a third memory cell (a third eDRAM cell), provided in a fifth layer over the support structure, where the fourth layer is between the third layer and the fifth layer. In such an IC device, each of the first memory cell and the second memory cell is electrically coupled to the first line, and each of the second memory cell and the third memory cell is electrically coupled to the second line.

Example 18 provides the IC package according to example 17, where 1) the first line is a wordline or a plateline for each of the first memory cell and the second memory cell, and the second line is a bitline for each of the second memory cell and the third memory cell; or 2) the first line is a wordline for each of the first memory cell and the second memory cell, and the second line is a bitline or a plateline for each of the second memory cell and the third memory cell; or 3) the first line is a bitline or a plateline for each of the first memory cell and the second memory cell, and the second line is a wordline for each of the second memory cell and the third memory cell, or 4) the first line is a bitline for each of the first memory cell and the second memory cell, and the second line is a wordline or a plateline for each of the second memory cell and the third memory cell.

Example 19 provides the IC package according to examples 17 or 18, where the further IC component is or includes one of a package substrate, an interposer, or a further IC die.

Example 20 provides the IC package according to any one of examples 15-19, where the IC device includes, or is a part of, at least one of a memory device, a computing device, a wearable device, a handheld electronic device, and a wireless communications device.

Example 21 provides an electronic device that includes a carrier substrate; and one or more of the IC device according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is a memory device.

Example 27 provides the electronic device according to any one of examples 21-25, where the electronic device is one of an RF transceiver, a switch, a power amplifier, a low-noise amplifier, a filter, a filter bank, a duplexer, an upconverter, or a downconverter of an RF communications device, e.g., of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

Example 31 provides a method of fabricating an IC device. The method includes providing a first memory cell (a first eDRAM cell) in a first layer over a first support structure (e.g., a first substrate, wafer, die, or chip); providing a line comprising an electrically conductive material in a second layer over the first support structure, where the first layer is between the second layer and the first support structure, and where the first memory cell is electrically coupled to the line; providing a second memory cell (a second eDRAM cell) over a second support structure (e.g., a second substrate, wafer, die, or chip); bonding the second support structure with the second memory cell and the first support structure with the first memory cell and the line so that the line is between the first memory cell and the second memory cell (i.e., bonding the top side of the first support structure with the first memory cell and the line to the top side of the second support structure with the second memory cell); and electrically coupling the second memory cell to the line.

Example 32 provides the method according to example 31, where the first memory cell is electrically coupled to a first face of the line, and the second memory cell is electrically coupled to a second face of the line, opposite the first face.

Example 33 provides the method according to examples 31 or 32, further including, prior to the bonding, providing one or more first vias in a third layer over the first support structure, where the third layer is between the first layer and the second layer, and where the one or more first vias electrically couple the first memory cell to the line; prior to the bonding, providing one or more second vias over the second memory cell provided over the second support structure, where the second memory cell is between the second support structure and the one or more second vias, and where the one or more second vias are electrically coupled to the second memory cell, where, after the bonding, the one or more second vias are further electrically coupled to the line.

Example 34 provides the method according to example 33, where, in a plane that is substantially perpendicular to a bonding interface (or in a plane that is substantially perpendicular to the first support structure), a cross-section of each of the one or more first vias and the one or more second vias is a trapezoid that includes two parallel sides, one of which is a short side and another one of which is a long side, and, for each trapezoid of the one or more first vias and for each trapezoid of the one or more second vias, the long side is closer to the bonding interface than the short side.

Example 35 provides the method according to any one of examples 31-34, further including processes for forming the IC device according to any one of the preceding examples (e.g., for forming the IC device according to any one of examples 1-16).

Example 36 provides the method according to any one of examples 31-35, further including processes for forming the IC package according to any one of the preceding examples (e.g., for forming the IC package according to any one of examples 17-20).

Example 37 provides the method according to any one of examples 31-36, further including processes for forming the electronic device according to any one of the preceding examples (e.g., for forming the electronic device according to any one of examples 21-30).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:

a substrate;

a first memory cell in a first layer over the substrate;

a line comprising an electrically conductive material, in a second layer over the substrate, where the first layer is between the second layer and the substrate; and a second memory cell in a third layer over the substrate, where the second layer is between the first layer and the third layer, wherein:

the line includes a first face and a second face, the second face being opposite the first face and being further away from the substrate than the first face, the first memory cell is coupled to the first face of the line and includes a first capacitor, the second memory cell is coupled to the second face of the line and includes a second capacitor, a channel material of a transistor of the first memory cell is closer to the first face of the line than to the second face of the line and is between the line and contacts of a source region and a drain region of the transistor of the first memory cell, each of the first capacitor and the second capacitor includes an electrode having a U-shape, and the U-shape of the first capacitor is oriented in the IC device upside down compared to the U-shape of the second capacitor.

2. The IC device according to claim 1, wherein the line is a wordline for the first memory cell and the second memory cell.

3. The IC device according to claim 1, wherein:

each of the first memory cell and the second memory cell includes a thin-film transistor (TFT), the first capacitor is coupled to the TFT of the first memory cell, and the second capacitor is coupled to the TFT of the second memory cell.

4. The IC device according to claim 1, wherein:

the contacts of the source region and the drain region of the transistor of the first memory cell are between the channel material of the transistor of the first memory cell and the substrate.

5. The IC device according to claim 4, wherein the line is a wordline for the first memory cell and the second memory cell.

6. The IC device according to claim 4, wherein:

a channel material of a transistor of the second memory cell is closer to the second face of the line than to the first face of the line and is between the line and contacts of a source region and a drain region of the transistor of the second memory cell.

7. The IC device according to claim 6, wherein the line is a wordline for the first memory cell and the second memory cell.

8. The IC device according to claim 6, wherein:

the channel material of the transistor of the second memory cell is between the contacts of the source region and the drain region of the transistor of the second memory cell and the second face of the line.

9. The IC device according to claim 8, wherein the line is a wordline for the first memory cell and the second memory cell.

10. An integrated circuit (IC) package, comprising:

an IC device; and a further IC component, coupled to the IC device, wherein the IC device includes:

a die, a first memory cell in a first layer over the die, a first line comprising an electrically conductive material, in a second layer over the die, where the first layer is between the second layer and the die, a second memory cell in a third layer over the die, where the second layer is between the first layer and the third layer, a second line comprising an electrically conductive material, in a fourth layer over the die, where the third layer is between the second layer and the fourth layer, and a third memory cell in a fifth layer over the die, where the fourth layer is between the third layer and the fifth layer, wherein:

each of the first memory cell and the second memory cell is coupled to the first line, each of the second memory cell and the third memory cell is coupled to the second line, the first memory cell includes a first capacitor, the second memory cell includes a second capacitor, each of the first capacitor and the second capacitor includes an electrode having a U-shape, and the U-shape of the first capacitor is oriented in the IC device upside down compared to the U-shape of the second capacitor.

11. The IC package according to claim 10, wherein:

the first line is a wordline or a plateline for each of the first memory cell and the second memory cell, and the second line is a bitline for each of the second memory cell and the third memory cell.

12. The IC package according to claim 10, wherein:

the first line is a wordline for each of the first memory cell and the second memory cell, and the second line is a bitline or a plateline for each of the second memory cell and the third memory cell.

13. The IC package according to claim 10, wherein:

the first line is a bitline or a plateline for each of the first memory cell and the second memory cell, and second line is a wordline for each of the second memory cell and the third memory cell.

14. The IC package according to claim 10, wherein:

the first line is a bitline for each of the first memory cell and the second memory cell, and the second line is a wordline or a plateline for each of the second memory cell and the third memory cell.

15. An integrated circuit (IC) device, comprising:

a first memory cell comprising a capacitor in a first layer and a transistor in a second layer;

a second memory cell comprising a transistor in a third layer and a capacitor in a fourth layer;

a first via at least partially in at least one of the first layer and the second layer; and a second via at least partially in at least one of the third layer and the fourth layer, wherein:

the second layer is between the first layer and the third layer, the third layer is between the second layer and the fourth layer, the first via tapers in a direction from the third layer to the first layer, and the second via tapers in a direction from the first layer to the third layer.

16. The IC device according to claim 15, wherein:

each of the capacitor of the first memory cell and the capacitor of the second memory cell includes an electrode having a U-shape, and the U-shape of the capacitor of the first memory cell is upside down with respect to the U-shape of the capacitor of the second memory cell.

17. The IC device according to claim 16, further comprising a conductive line in a layer between the second layer and the third layer, wherein:

the line includes a first face and a second face, the second face being opposite the first face and being further away from the first layer than the first face, the first memory cell is coupled to the first face of the line, and the second memory cell is coupled to the second face of the line.

18. The IC device according to claim 17, wherein the line is a wordline for the first memory cell and the second memory cell.

19. The IC device according to claim 17, wherein the line is conductively coupled to a gate of the transistor of the first memory cell and a gate of the transistor of the second memory cell.

20. The IC device according to claim 15, wherein the transistor of the first memory cell is closer to the transistor of the second memory cell than the capacitor of the first memory cell.

\* \* \* \* \*